United States Patent
Honjo et al.

(10) Patent No.: US 11,081,641 B2
(45) Date of Patent: Aug. 3, 2021

(54) MAGNETORESISTANCE EFFECT ELEMENT, MAGNETIC MEMORY, AND METHOD FOR MANUFACTURING MAGNETORESISTANCE EFFECT ELEMENT

(71) Applicant: TOHOKU UNIVERSITY, Sendai (JP)

(72) Inventors: Hiroaki Honjo, Sendai (JP); Tetsuo Endoh, Sendai (JP); Shoji Ikeda, Sendai (JP); Hideo Sato, Sendai (JP); Hideo Ohno, Sendai (JP)

(73) Assignee: TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 16/479,153

(22) PCT Filed: Jan. 18, 2017

(86) PCT No.: PCT/JP2017/001617
§ 371 (c)(1),
(2) Date: Sep. 18, 2019

(87) PCT Pub. No.: WO2018/134929
PCT Pub. Date: Jul. 26, 2018

(65) Prior Publication Data
US 2020/0044142 A1 Feb. 6, 2020

(51) Int. Cl.
*H01L 43/02* (2006.01)
*H01L 43/10* (2006.01)
(Continued)

(52) U.S. Cl.
CPC ............ *H01L 43/02* (2013.01); *G11C 11/161* (2013.01); *H01L 27/1222* (2013.01); *H01L 43/10* (2013.01); *H01L 43/12* (2013.01)

(58) Field of Classification Search
None
See application file for complete search history.

(56) References Cited

U.S. PATENT DOCUMENTS

2012/0056285 A1  3/2012 Bessho et al.
2012/0056286 A1  3/2012 Higo et al.
(Continued)

FOREIGN PATENT DOCUMENTS

JP    2011258596 A    12/2011
JP    2012-059808 A    3/2012
(Continued)

OTHER PUBLICATIONS

Ikeda, S., et al., Boron Composition of Dependence of Magnetic Anisotropy and Tunnel Magnetoresistance in MgO/CoFe(B) Based Stack Structures, IEEE Transactions on Magnetics, 48(11), Nov. 2012, pp. 3829-3832.
Ikeda, S., et al., A Perpendicular-Anisotropy CoFeB—MgO Magnetic Tunnel Junction, Nat Mater, Jul. 11, 2010, 9(9), pp. 721-724.
Kim, G., et al., Tunneling Magnetoresistance of Magnetic Tunnel Junctions Using Perpendicular Magnetization L10-CoPt Electrodes, Appl Phys Lett, 92, 2008, 4 pgs.
(Continued)

*Primary Examiner* — Robert K Carpenter
(74) *Attorney, Agent, or Firm* — Procopio, Cory, Hargreaves & Savitch LLP

(57) ABSTRACT

The present invention provides a magnetoresistance effect element which has a high thermal stability factor Δ and in which a magnetization direction of a recording layer is a perpendicular direction with respect to a film surface, and a magnetic memory including the same. Magnetic layers of a recording layer of the magnetoresistance effect element are divided into at least two, and an Fe composition with respect to a sum total of atomic fractions of magnetic elements in each magnetic layer is changed before stacking the magnetic layers.

23 Claims, 30 Drawing Sheets

(51) Int. Cl.
  *H01L 43/12* (2006.01)
  *H01L 27/22* (2006.01)
  *G11C 11/16* (2006.01)
  *H01L 27/12* (2006.01)

(56) References Cited

U.S. PATENT DOCUMENTS

| | | |
|---|---|---|
| 2013/0001714 A1 | 1/2013 | Nishiyama et al. |
| 2013/0094284 A1 | 4/2013 | Ohno et al. |
| 2016/0380184 A1 | 12/2016 | Kato et al. |
| 2016/0380185 A1 | 12/2016 | Kato et al. |
| 2018/0175286 A1 | 6/2018 | Sato et al. |
| 2020/0090719 A1* | 3/2020 | Nishioka ............... H01L 27/222 |

FOREIGN PATENT DOCUMENTS

| | | |
|---|---|---|
| JP | 2012-059878 A | 3/2012 |
| JP | 2013016560 A | 1/2013 |
| JP | 2015088520 A | 5/2015 |
| JP | 2015176931 A | 10/2015 |
| JP | 2015176933 A | 10/2015 |
| JP | 2016150154 A | 8/2016 |
| WO | 2017010549 A1 | 1/2017 |

OTHER PUBLICATIONS

Mizunuma, K., et al., MgO Barrier-Perpendicular Magnetic Tunnel Junctions with CoFe/Pd Multilayers and Ferromagnetic Insertion Layers, Appl Phys Lett, 95, 2009, 4 pgs.

Nishimura, N., et al., Magnetic Tunnel Junction Device with Perpendicular Magnetization Films for High-Density Magnetic Random Access Memory, Journal of Applied Physics, 91, 2002, 5 pgs.

Sato, H., et al., Perpendicular-Anisotropy CoFeB—MgO Magnetic Tunnel Junctions with a MgO/CoFeB/Ta/CoFeB/MgO Recording Structure, Appl Phys Lett, 101, 2012, 5 pgs.

Sato, H., et al., MgO/CoFeB/Ta/CoFeB/MgO Recording Structure in Magnetic Tunnel Junctions with Perpendicular Easy Axis, IEEE Transactions on Magnetics, 49(7), Jul. 2013, pp. 4437-4440.

Sato, H., et al., Comprehensive Study of CoFeB—MgO Magnetic Tunnel Junction Characteristics with Single-and-Double-Interfacing Scaling Down to 1Xnm, IEEE International Electron Devices Meeting 2013, 4 pgs.

International Search Report and Written Opinion for related PCT App No. PCT/JP2017/001617, dated Mar. 14, 2017, 16 pgs.

Notice of Reasons for Refusal for related JP App No. 2018-562794 dated Dec. 15, 2020, 12 pgs.

* cited by examiner

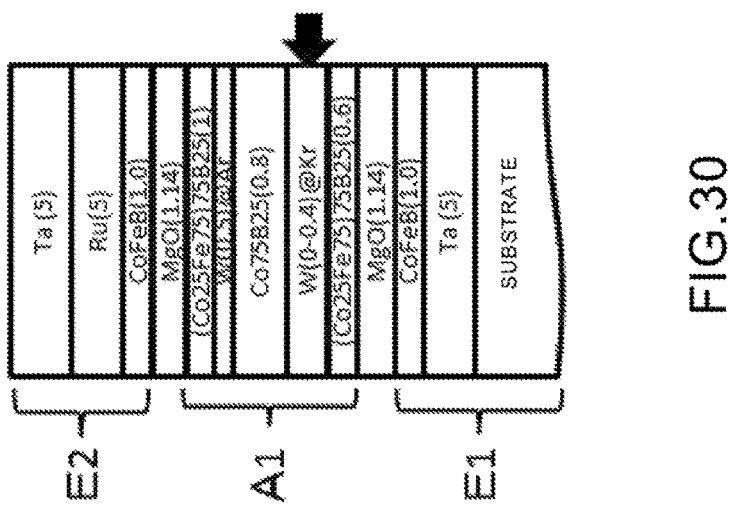
FIG.30
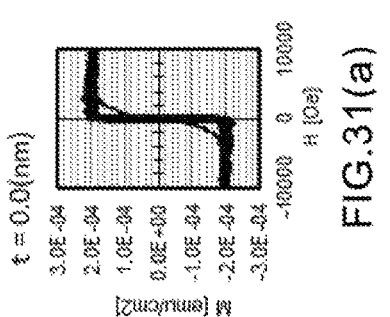
FIG.31(a)
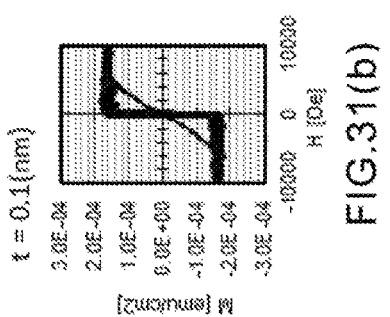
FIG.31(b)
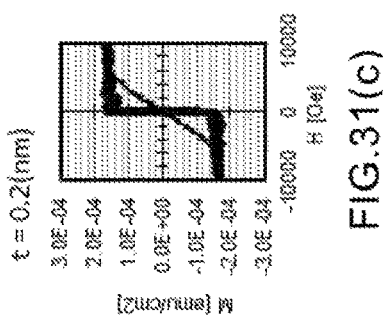
FIG.31(c)
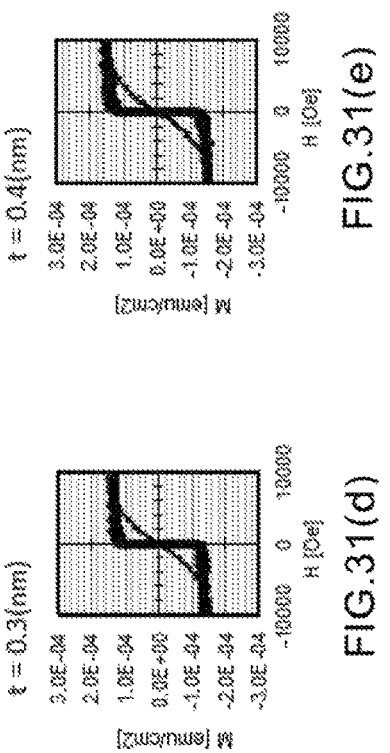
FIG.31(d)
FIG.31(e)

MAGNETORESISTANCE EFFECT ELEMENT, MAGNETIC MEMORY, AND METHOD FOR MANUFACTURING MAGNETORESISTANCE EFFECT ELEMENT

CROSS-REFERENCE TO RELATED APPLICATIONS

This application is a U.S. National Stage entry of PCT Application No: PCT/JP2017/001617 filed Jan. 18, 2017, the contents of which are incorporated herein by reference.

TECHNICAL FIELD

The present invention relates to a magnetoresistance effect element, particularly, a magnetoresistance effect element in which a magnetization direction of a recording layer is a perpendicular direction with respect to a film surface, and to a magnetic memory including the magnetoresistance effect element.

BACKGROUND ART

An MRAM (Magnetic Random Access Memory) which is being developed as a next-generation high-performance nonvolatile magnetic memory includes a magnetic memory cell structured such that a selective transistor and a magnetoresistance effect element are electrically connected in series.

Of the selective transistor, a source electrode is electrically connected to a source line, a drain electrode is electrically connected to a bit line via the magnetoresistance effect element, and a gate electrode is electrically connected to a word line.

The magnetoresistance effect element is based on a structure in which a non-magnetic layer (a barrier layer) is sandwiched between two magnetic layers (a reference layer and a recording layer), and is also called a tunnel magnetoresistance (TMR) element having a magnetic tunnel junction (MTJ). One of the magnetic layers is a reference layer of which a magnetization direction is fixed and the other magnetic layer is a recording layer of which a magnetization direction is variable.

A resistance value of the magnetoresistance effect element decreases when the magnetization direction of the magnetic layer of the reference layer and the magnetization direction of the magnetic layer of the recording layer are parallelly arranged but increases when the magnetization directions are arranged antiparallelly. The magnetic memory cell of an MRAM assigns these two resistive states to pieces of bit information "0" and "1".

Main properties which are required for an MRAM are that the magnetoresistance effect element has (i) a large tunnel magnetoresistance ratio (TMR ratio), (ii) a small write current $I_{C0}$, and (iii) a large thermal stability factor $\Delta$. (i) is a property necessary in order to accommodate high-speed read, (ii) is a property necessary in order to accommodate high-speed write, and (iii) is a property necessary for non-volatility of the magnetic memory.

In recent years, while miniaturizing magnetoresistance effect elements is required in order to realize high density MRAMs, miniaturizing both a magnetic layer (the reference layer) and a magnetic layer (the recording layer) of a magnetoresistance effect element causes bit information loss due to thermally disturbance of magnetization.

In other words, realizing an high density MRAM thanks to the miniaturization of a magnetoresistance effect element requires that the magnetic memory has nonvolatility that enables recorded bit information to be retained for 10 years and, therefore, increasing (iii) the thermal stability factor $\Delta$ described above is important.

NPL 1 to 3 disclose that, in order to retain bit information even when a magnetoresistance effect element is miniaturized, it is required that both the magnetic layer (the reference layer) and the magnetic layer (the recording layer) have a high thermal stability factor $\Delta$ of 70 or higher and, at the same time, the magnetic layer to be the reference layer must have an even higher thermal stability factor $\Delta$ than the magnetic layer to be the recording layer.

In addition, NPL 1 discloses that the thermal stability factor $\Delta$ of a magnetic layer of a magnetoresistance effect element has a correlation with an effective magnetic anisotropy energy density $K_{eff}$ and, since many substances having a large magnetic anisotropy (the effective magnetic anisotropy energy density $K_{eff}$) exhibit perpendicular magnetic anisotropy, perpendicularly magnetized TMR elements are increasingly being used as a magnetoresistance effect element of a magnetic memory cell of an MRAM.

NPL 4 discloses, by applying a thinned CoFeB/MgO stack structure to a perpendicular magnetic anisotropy magnetoresistance effect element, a magnetoresistance effect element with a thermal stability factor $\Delta$ of approximately 40 at a junction size diameter of 40 nm in a magnetic layer of a recording layer is obtained.

Furthermore, NPL 6 discloses, by increasing a thickness of a magnetic layer of a recording layer by adopting a double CoFeB/MgO interfacial recording layer structure, a magnetoresistance effect element with a thermal stability factor $\Delta$ of 80 or higher at a junction size diameter of around 40 nm is obtained but a magnetoresistance effect element with a thermal stability factor $\Delta$ of approximately 59 at a junction size diameter of 29 nm is obtained.

In this case, a junction size of the magnetic layer refers to a length of a longest straight line on a junction interface in contact with an adjacent non-magnetic layer or an electrode. When the magnetic layer is columnar and the junction interface is circular, the junction size is a diameter of the junction interface. When the junction size is the diameter of the junction interface, the junction size is particularly referred to as a junction size diameter.

CITATION LIST

Non Patent Literature

[NPL 1] N. Nishimura, T. Hirai, A. Koganei, T. Ikeda, K. Okano, Y. Sekiguchi, and Y. Osada, "Magnetic tunnel junction device with perpendicular magnetization films for high-density magnetic random access memory", J. Appl. Phys. 2002, 91, 5246

[NPL 2] G. Kim, Y. Sakuraba, M. Oogane, Y. Ando and T. Miyazaki, "Tunneling magnetoresistance of magnetic tunnel junctions using perpendicular magnetization electrodes", Appl. Phys. Lett. 2008, 92, 172502

[NPL 3] K. Mizunuma, S. Ikeda, J. H. Park, H. Yamamoto, H. D. Gan, K. Miura, H. Hasegawa, J. Hayakawa, F. Matsukura and H. Ohno, "MgO barrier-perpendicular magnetic tunnel junctions with CoFe/Pd multilayers and ferromagnetic insertion layers", Appl. Phys. Lett. 2009, 95, 232516.

[NPL 4] S. Ikeda, K. Miura, H. Yamamoto, K. Mizunuma, H. D. Gan, M. Endo, S. Kanai, F. Matsukura, and H. Ohno, "A perpendicular-anisotropy CoFeB—MgO magnetic tunnel junction", Nature Mater., 2010, 9, 721

[NPL 5] H. Sato, M. Yamanouchi, S. Ikeda, S. Fukami, F. Matsukura, and H. Ohno, "Perpendicular-anisotropy CoFeB—MgO magnetic tunnel junctions with a MgO/CoFeB/Ta/CoFeB/MgO recording structure", Appl. Phys. Lett. 2012, 101, 022414.

[NPL 6] H. Sato, M. Yamanouchi, S. Ikeda, S. Fukami, F. Matsukura, and H. Ohno, "MgO/CoFeB/Ta/CoFeB/MgO recording structure in magnetic tunnel junctions with perpendicular easy axis", IEEE Trans. Magn., 2013, 49, 4437

[NPL 7] H. Sato, T. Yamamoto, M. Yamanouchi, S. Ikeda, S. Fukami, K. Kinoshita, F. Matsukura, N. Kasai, and H. Ohno, "Comprehensive study of CoFeB—MgO magnetic tunnel junction characteristics with single- and double-interface scaling down to 1X nm", Tech. Dig.—Int. Electron Devices Meet. 2013, 3.2.1.

[NPL 8] S. Ikeda, R. Koizumi, H. Sato, M. Yamanouchi, K. Miura, K. Mizunuma, H. D. Gan, F. Matsukura, and H. Ohno, "Boron Composition Dependence of Magnetic Anisotropy and Tunnel Magnetoresistance in MgO/CoFe (B) Based Stack Structures", IEEE Trans. Magn., 2012, 48, 3829

Patent Literature

[PTL 1] Japanese Patent Application Laid-open No. 2011-258596
[PTL 2] PCT/JP2016/070850
[PTL 3] Japanese Patent Application No. 2016-150154

SUMMARY OF INVENTION

Technical Problem

An object of the present invention is to provide a magnetoresistance effect element with a higher thermal stability factor $\Delta$ than in conventional art in order to realize non-volatility that enables bit information to be recorded and retained for 10 years in a higher density MRAM thanks to miniaturization of the magnetoresistance effect element, and to provide a magnetic memory including the same.

A thermal stability factor $\Delta$ of the magnetoresistance effect element is expressed by the following equation.

$$\Delta = \frac{E}{k_B T} = \frac{K_{eff} t S}{k_B T} \quad \text{[Math. 1]}$$

In the equation given in Math. 1, E denotes an energy barrier, $k_B$ denotes Boltzmann constant, T denotes an absolute temperature, $K_{eff}$ denotes an effective magnetic anisotropy energy density, S denotes an area of a recording layer, and t denotes a film thickness of the recording layer.

In coordinates where an x axis and a y axis are defined in a plane and a z axis is defined in a perpendicular-to-plane direction that is perpendicular to the x-y plane, a product $K_{eff} t$ of the effective magnetic anisotropy energy density $K_{eff}$ and the film thickness t of the recording layer is expressed by the following equation.

$$K_{eff} t = K_i - \left[(N_z - N_x)\frac{M_s^2}{2\mu_0} - K_b\right] t \quad \text{[Math. 2]}$$

In the equation given in Math. 2, $K_i$ denotes an interfacial magnetic anisotropy energy density, $N_z$ denotes a demagnetization coefficient of the z axis, $N_x$ denotes a demagnetization coefficient of the x axis, $M_s$ denotes a saturation magnetization, $\mu_0$ denotes magnetic permeability in vacuum, and $K_b$ denotes a bulk magnetic anisotropy energy density derived from bulk (crystal) magnetic anisotropy and a magnetoelastic effect.

It is assumed that $N_x$ is equivalent to a demagnetization coefficient $N_y$ of the y axis. While it is difficult to strictly obtain $N_z$ and $N_x$ when the recording layer has a cylindrical shape, $N_z$ and $N_x$ can be obtained in a numerical calculation by elliptic approximation.

Perpendicular magnetic anisotropy is exhibited when $K_{eff} t$ is positive but in-plane magnetic anisotropy is exhibited when $K_{eff} t$ is negative. In other words, when $K_{eff} t$ is positive, the perpendicular-to-plane direction constitutes an easy axis of magnetization.

To elaborate on this point using a specific example, in a CoFe(B)/MgO junction, by inducing an interfacial magnetic anisotropy energy density $K_i$ on an interface between CoFeB and MgO, perpendicular magnetic anisotropy ($K_{eff} > 0$) can be obtained. However, the interfacial magnetic anisotropy energy density $K_i$ when using CoFeB as a magnetic layer is lower than the interfacial magnetic anisotropy energy density $K_i$ when using CoFe that does not contain B. On the other hand, while a high interfacial magnetic anisotropy energy density $K_i$ is obtained when using CoFe that does not contain B, since CoFe has higher saturation magnetization $M_s$ than CoFeB, a large demagnetizing field $(-(N_z - N_x) M_s / 2\mu_0)$ produces in-plane magnetic anisotropy ($K_{eff} < 0$) and perpendicular magnetic anisotropy is not obtained.

The equation given in Math. 1 indicates that, in order to increase the thermal stability factor $\Delta$, the product $K_{eff} t$ of the effective magnetic anisotropy energy density and the film thickness of the recording layer need only be increased.

In addition, the equation given in Math. 2 indicates that, in order to obtain a large product $K_{eff} t$ of the effective magnetic anisotropy energy density and the film thickness of the recording layer, the saturation magnetization $M_s$ of the entire recording layer must be lowered so as to prevent the interfacial magnetic anisotropy energy density $K_i$ on a magnetic tunnel junction (MTJ) interface between a non-magnetic layer and a magnetic layer from decreasing.

In considering the product $K_{eff} t$ of the effective magnetic anisotropy energy density and the film thickness of the recording layer in the equation given in Math. 2, it should be noted that effective magnetic anisotropy is affected by both interfacial magnetic anisotropy and bulk (crystal) magnetic anisotropy.

Interfacial magnetic anisotropy is a property that a direction in which magnetization readily occurs appears due to electron orbital hybridization on an interface and a unit of the interfacial magnetic anisotropy energy density $K_i$ is J/m$^2$, and an effect of interfacial magnetic anisotropy becomes prominent when the film thickness of the magnetic layer of the recording layer is reduced. On the other hand, bulk (crystal) magnetic anisotropy is a property that a direction in which magnetization readily occurs appears due to anisotropy of a crystal structure and a unit of a bulk (crystal) magnetic anisotropy energy density $K_b$ is J/m$^3$.

The present inventors have been considering various methods of lowering the saturation magnetization $M_s$ of an entire recording layer so as to prevent the interfacial magnetic anisotropy energy density $K_i$ on an interface between a non-magnetic layer and a magnetic layer from decreasing in order to increase the thermal stability factor $\Delta$ of a magnetoresistance effect element on the basis of the equations given in Math. 1 and Math. 2. For example, the present inventors have found that a magnetoresistance effect element with a high thermal stability factor Δ is obtained by dividing a magnetic layer of the magnetoresistance effect element into at least two regions (a first magnetic layer that is joined to a non-magnetic layer sandwiching a recording layer and a second magnetic layer that is not joined to a non-magnetic layer sandwiching the recording layer) and adjusting a composition of magnetic elements of the first magnetic layer so as to be larger than a composition of magnetic elements of the second magnetic layer (refer to PTL 2 and the like).

The present invention has been completed on the basis of findings made in the considerations of the problem described above that a magnetoresistance effect element with an even higher thermal stability factor Δ can be obtained by focusing on types and compositions of magnetic elements in a magnetic layer.

Solution to Problem

In order to solve the problem described above, a magnetoresistance effect element according to the present invention includes: a first magnetic layer (2) of which a magnetization direction is a direction perpendicular to a film surface; a first non-magnetic layer (1) which is provided adjacent to the first magnetic layer (2); and a second magnetic layer (3) which is provided adjacent to the first magnetic layer (2) on an opposite side to the first non-magnetic layer (1) and of which a magnetization direction is a direction perpendicular to a film surface, wherein the first magnetic layer (2) includes at least Fe, an Fe composition in the first magnetic layer (2) being 50 at % or higher with respect to a sum total of atomic fractions of magnetic elements in the first magnetic layer (2), a magnetization direction of the first magnetic layer (2) being oriented in a perpendicular direction with respect to a film surface due to interfacial perpendicular magnetic anisotropy on an interface with the first non-magnetic layer (1), the second magnetic layer (3) includes at least one 3d ferromagnetic transition metal element such as Co, Fe, Ni, or Mn, an Fe composition in the second magnetic layer (3) being 50 at % or lower with respect to a sum total of atomic fractions of magnetic elements in the second magnetic layer (3), an interfacial magnetic anisotropy energy density $K_i$ on an interface between the first non-magnetic layer (1) and the first magnetic layer (2) is higher than an interfacial magnetic anisotropy energy density $K_i$ on an interface in a case where the first non-magnetic layer (1) and the second magnetic layer (3) are joined to each other, and the saturation magnetization $M_s$ of the second magnetic layer (3) is lower than the saturation magnetization $M_s$ of the first magnetic layer (2).

In addition, another magnetoresistance effect element according to the present invention further includes a first non-magnetic insertion layer (7) between and adjacent to the first magnetic layer (2) and the second magnetic layer (3).

Furthermore, a method for manufacturing a magnetoresistance effect element according to the present invention is a method for manufacturing a magnetoresistance effect element by stacking, in the following order: a first non-magnetic layer (1); a first magnetic layer (2) which is provided adjacent to the first non-magnetic layer (1) and of which a magnetization direction is a direction perpendicular to a film surface, the first magnetic layer (2) including at least Fe, an Fe composition in the first magnetic layer (2) being 50 at % or higher with respect to a sum total of atomic fractions of magnetic elements in the first magnetic layer (2); a first non-magnetic insertion layer (7) which is provided adjacent to the first magnetic layer (2) on an opposite side to the first non-magnetic layer (1), the first non-magnetic insertion layer (7) being made of a first metal; a second magnetic layer (3) which is provided adjacent to the first non-magnetic insertion layer (7) on an opposite side to the first magnetic layer (2) and of which a magnetization direction is a direction perpendicular to a film surface, the second magnetic layer (3) including at least one 3d ferromagnetic transition metal element such as Co, Fe, Ni, or Mn, an Fe composition in the second magnetic layer (3) being 50 at % or lower with respect to a sum total of atomic fractions of magnetic elements in the second magnetic layer (3); a second non-magnetic insertion layer (8) which is provided adjacent to the second magnetic layer (3) on an opposite side to the first non-magnetic insertion layer (7), the second non-magnetic insertion layer (8) being made of a second metal; a third magnetic layer (4) which is provided adjacent to the second non-magnetic insertion layer (8) on an opposite side to the second magnetic layer (3) and of which a magnetization direction is a direction perpendicular to a film surface, the third magnetic layer (4) including at least Fe, an Fe composition in the third magnetic layer (4) being 50 at % or higher with respect to a sum total of atomic fractions of magnetic elements in the third magnetic layer (4); and a second non-magnetic layer (5) which is provided adjacent to the third magnetic layer (4) on an opposite side to the second non-magnetic insertion layer (8), wherein the first non-magnetic insertion layer (7) is formed using a first sputtering gas, the second non-magnetic insertion layer (8) is formed using a second sputtering gas, and a first $M_T/M_G$ ratio being a ratio of a mass number $M_T$ of the first metal of the first non-magnetic insertion layer (7) to a mass number $M_G$ of the first sputtering gas is smaller than a second $M_T/M_G$ ratio being a ratio of a mass number $M_T$ of the second metal of the second non-magnetic insertion layer (8) to a mass number $M_G$ of the second sputtering gas.

Advantageous Effects of Invention

According to the present invention in which a Fe composition in magnetic elements of the first magnetic layer (2) is set to 50 at % or higher and a Fe composition in magnetic elements of the second magnetic layer (3) is set to 50 at % or lower, a magnetoresistance effect element with high thermal stability can be provided.

In addition, according to the present invention in which the first non-magnetic insertion layer (7) is inserted between the first magnetic layer (2) and the second magnetic layer (3), a magnetoresistance effect element with even higher thermal stability can be provided.

Furthermore, according to the present invention in which the first $M_T/M_G$ ratio is set smaller than the second $M_T/M_G$ ratio with respect to sputtering gases when forming the first and second non-magnetic insertion layers, a magnetoresistance effect element with high thermal stability in addition to a higher tunnel magnetoresistance ratio (TMR ratio) can be provided.

BRIEF DESCRIPTION OF DRAWINGS

FIG. 30 shows a longitudinal section view of a configuration of a magnetoresistance effect element in which a layer W is adopted as a non-magnetic insertion layer.

FIG. 31 shows magnetization curves in cases where a film thickness of the layer W of the recording layer in FIG. 30 is (a) 0.0 nm, (b) 0.1 nm, (c) 0.2 nm, (d) 0.3 nm, and (e) 0.4 nm, in which a perpendicular M-H loop is indicated by a solid line and an in-plane M-H loop is indicated by a thin line.

DESCRIPTION OF EMBODIMENTS

Figure 1:
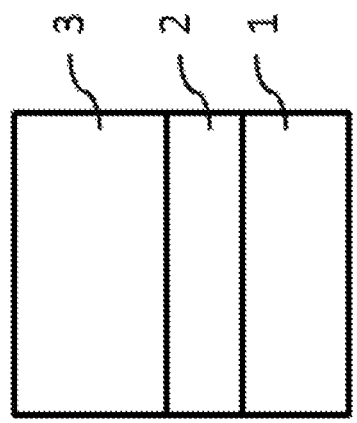
FIG. 1 is a longitudinal section view showing an example of a configuration of a magnetoresistance effect element according to the present invention.

A magnetoresistance effect element and a magnetic memory according to the present invention will be described in detail.

It should be noted that the diagrams merely represent examples and, while descriptions will be given using reference characters, the reference characters are not intended to limit the present invention in any way whatsoever.

(Consideration Related to Thermal Stability Factor Δ Due to Fe Composition in Magnetic Elements of Magnetic Layer)

As described earlier, according to the equation given in Math. 1, in order to increase the thermal stability factor Δ, a product $K_{eff} t$ of an effective magnetic anisotropy energy density and a film thickness of a recording layer may be increased. In addition, according to the equation given in Math. 2, in order to obtain a large product $K_{eff} t$ of the effective magnetic anisotropy energy density and the film thickness of the recording layer, a saturation magnetization $M_s$ of the entire recording layer must be lowered so as to prevent an interfacial magnetic anisotropy energy density $K_i$ on a magnetic tunnel junction (MTJ) interface between a non-magnetic layer and a magnetic layer from decreasing.

Furthermore, with the magnetoresistance effect element according to the present invention, since a film thickness of a magnetic layer of the recording layer is thin and an effect of the interfacial magnetic anisotropy energy density $K_i$ is prominent, a bulk (crystal) magnetic anisotropy energy density $K_b$ in the equation given in Math. 2 can be set to an extremely small value (assumed to be zero).

In the case of the present invention configured such that the bulk (crystal) magnetic anisotropy energy density $K_b$ in the equation given in Math. 2 is negligible, the product $K_{eff} t$ of the effective magnetic anisotropy energy density and the film thickness of the recording layer and the film thickness t of the recording layer have an approximately linear relationship with a y-intercept of $K_i$ and a slope of $(-(N_z-N_x) M_s^2/2\mu_0)$.

A value of the product $K_{eff}t$ of the effective magnetic anisotropy energy density and the film thickness of the recording layer can be obtained by measuring a magnetization curve representing a magnetic field swept in a direction perpendicular to an MTJ film surface of the recording layer and a magnetization curve representing a magnetic field swept in an in-plane direction of the MTJ film surface.

Figure 21:
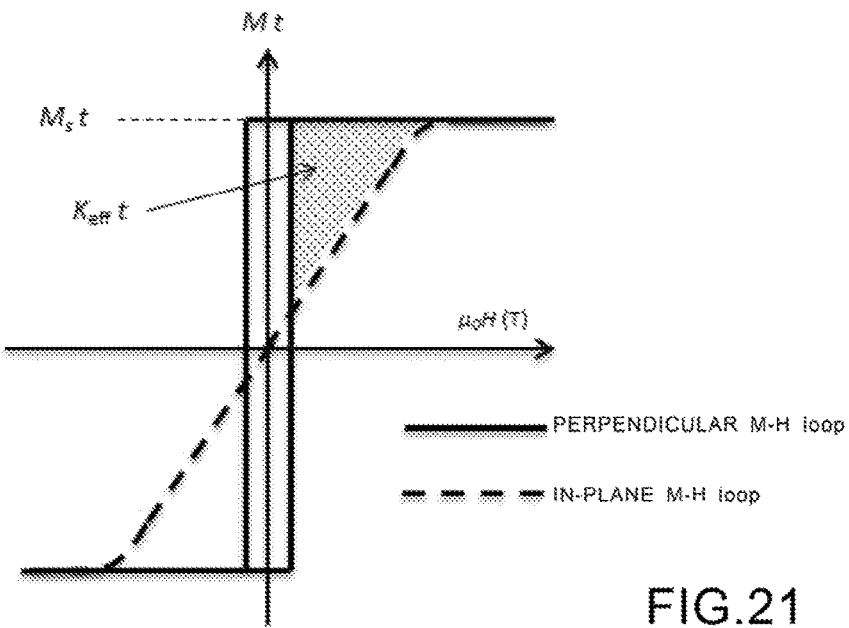
FIG. 21 is a schematic view of a magnetization curve showing how an $M_s t$ value and a $K_{eff} t$ value used in characterization of perpendicular magnetic anisotropy are obtained.

FIG. 21 shows a conceptual diagram of a magnetization curve. A product Mt of magnetization and a film thickness is plotted on an ordinate, a product $\mu_0 H$ of magnetic permeability in vacuum and a magnetic field is plotted on an abscissa, a magnetization curve (a perpendicular M-H loop) in a case where the magnetic field is swept in a perpendicular direction with respect to an MTJ film surface of the recording layer is indicated by a solid line, and a magnetization curve (an in-plane M-H loop) in a case where the magnetic field is swept in an in-plane direction is indicated by a dotted line. In the graph, the value of the product $K_{eff}t$ of the effective magnetic anisotropy energy density and the film thickness of the recording layer is represented by a difference between an area enclosed by magnitudes of a magnetic field and magnetization of the perpendicular M-H loop and an area enclosed by magnitudes of a magnetic field and magnetization of the in-plane M-H loop in the first quadrant.

Specifically, when the recording layer has perpendicular magnetic anisotropy, since a large amount of energy is necessary to incline a magnetic field in the in-plane direction, a difference between the area enclosed by the magnitudes of a magnetic field and magnetization of the in-plane M-H loop and the area enclosed by the magnitudes of a magnetic field and magnetization of the perpendicular M-H loop is positive. Conversely, the value is negative when the recording layer has in-plane magnetic anisotropy.

Figure 22:
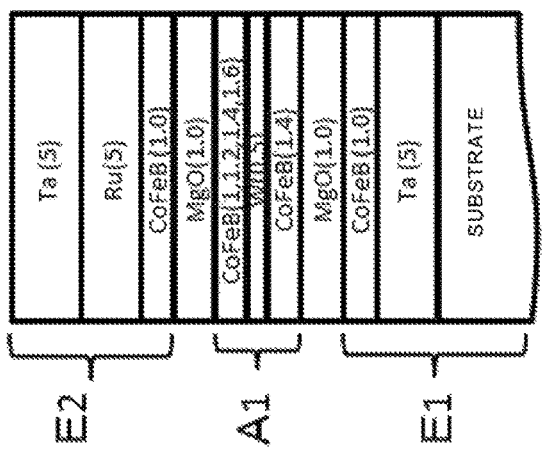
FIG. 22 shows a longitudinal section view of a configuration of a magnetoresistance effect element used in characterization by an Fe composition in magnetic elements of a magnetic layer.
Figure 23A:
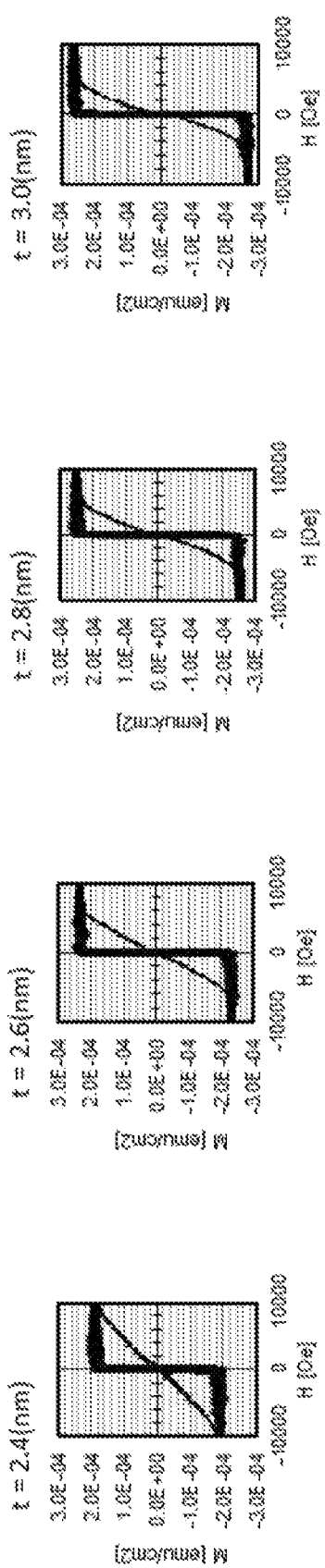
FIG. 23A shows magnetization curves in cases where a total film thickness of $Fe_{75}B_{25}$ in a recording layer is (a) 2.4 nm, (b) 2.6 nm, (c) 2.8 nm, and (d) 3.0 nm, in which a perpendicular M-H loop is indicated by a solid line and an in-plane M-H loop is indicated by a thin line.
Figure 23B:
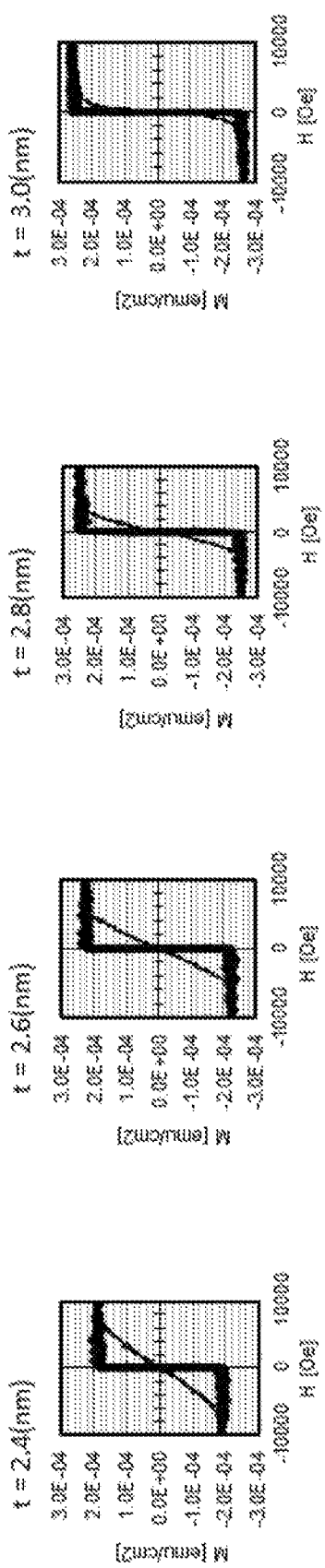
FIG. 23B shows magnetization curves in cases where a total film thickness of $(Co_{16.7}Fe_{83.3})_{75}B_{25}$ in a recording layer is (a) 2.4 nm, (b) 2.6 nm, (c) 2.8 nm, and (d) 3.0 nm, in which a perpendicular M-H loop is indicated by a solid line and an in-plane M-H loop is indicated by a thin line.
Figure 23C:
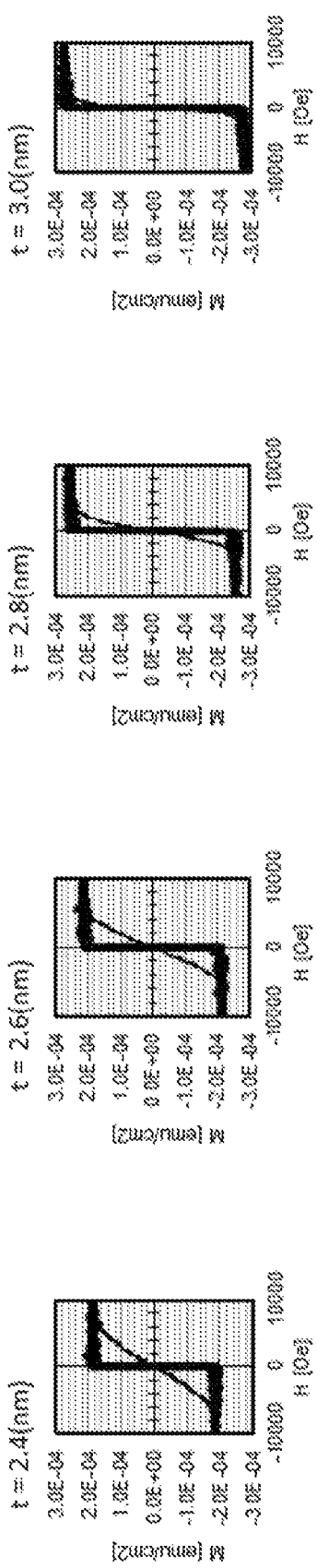
FIG. 23C shows magnetization curves in cases where a total film thickness of $(Co_{20}Fe_{80})_{75}B_{25}$ in a recording layer is (a) 2.4 nm, (b) 2.6 nm, (c) 2.8 nm, and (d) 3.0 nm, in which a perpendicular M-H loop is indicated by a solid line and an in-plane M-H loop is indicated by a thin line.
Figure 23D:
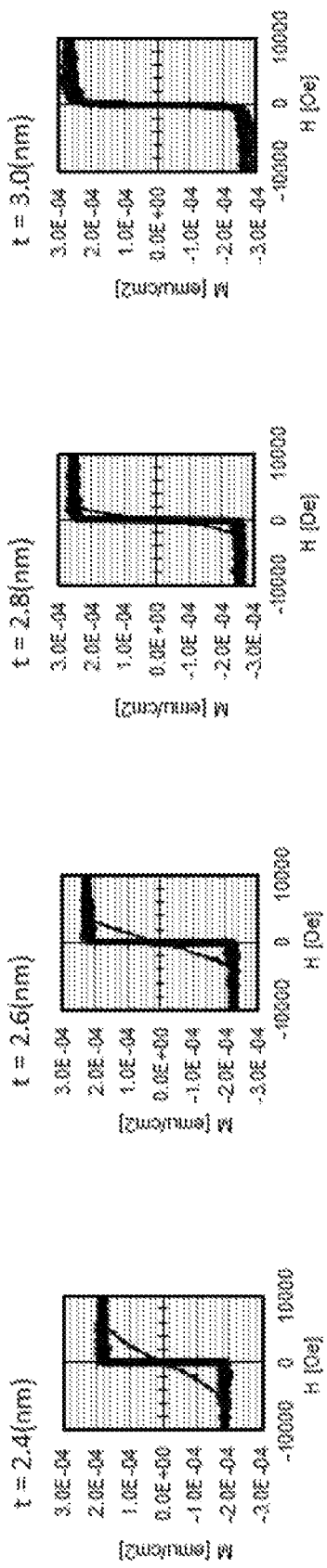
FIG. 23D shows magnetization curves in cases where a total film thickness of $(Co_{25}Fe_{75})_{75}B_{25}$ in a recording layer is (a) 2.4 nm, (b) 2.6 nm, (c) 2.8 nm, and (d) 3.0 nm, in which a perpendicular M-H loop is indicated by a solid line and an in-plane M-H loop is indicated by a thin line.
Figure 23E:
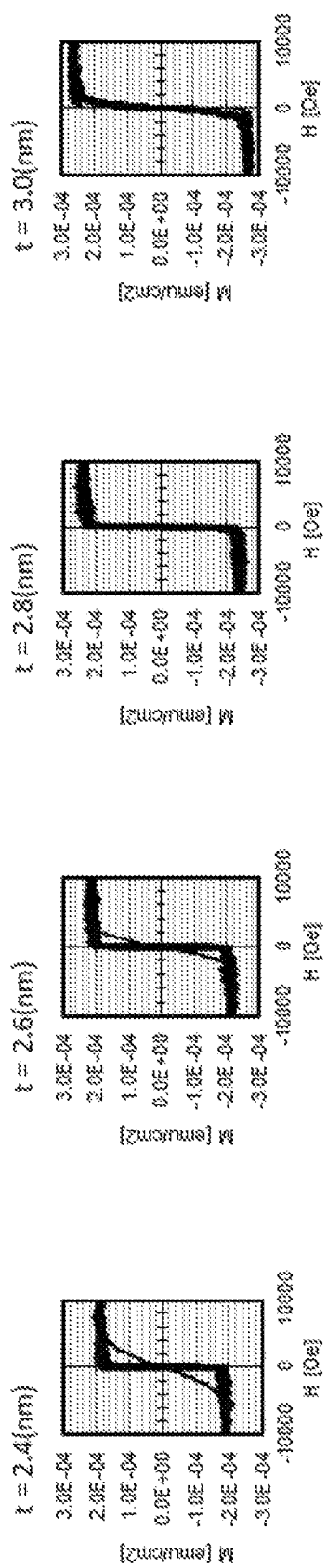
FIG. 23E shows magnetization curves in cases where a total film thickness of $(Co_{33.3}Fe_{66.7})_{75}B_{25}$ in a recording layer is (a) 2.4 nm, (b) 2.6 nm, (c) 2.8 nm, and (d) 3.0 nm, in which a perpendicular M-H loop is indicated by a solid line and an in-plane M-H loop is indicated by a thin line.
Figure 23F:
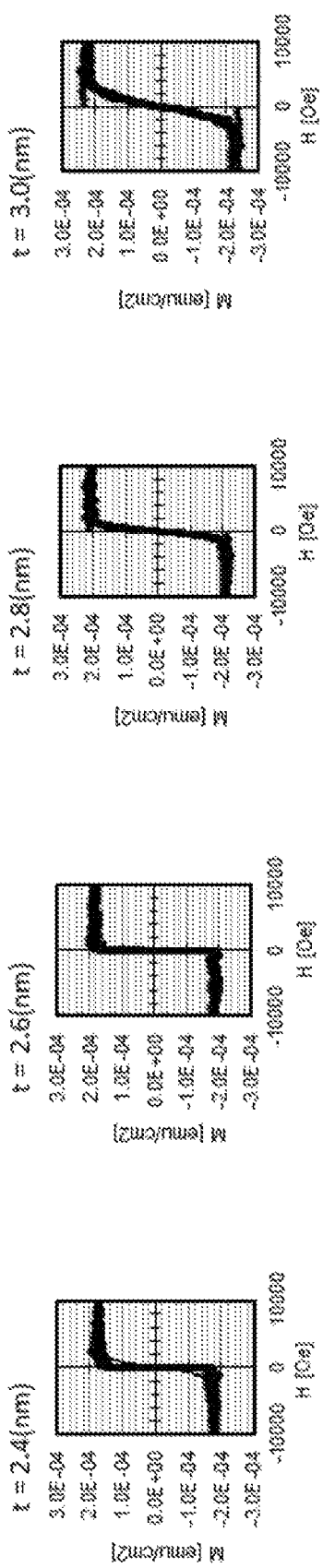
FIG. 23F shows magnetization curves in cases where a total film thickness of $(Co_{50}Fe_{50})_{75}B_{25}$ in a recording layer is (a) 2.4 nm, (b) 2.6 nm, (c) 2.8 nm, and (d) 3.0 nm, in which a perpendicular M-H loop is indicated by a solid line and an in-plane M-H loop is indicated by a thin line.
Figure 23G:
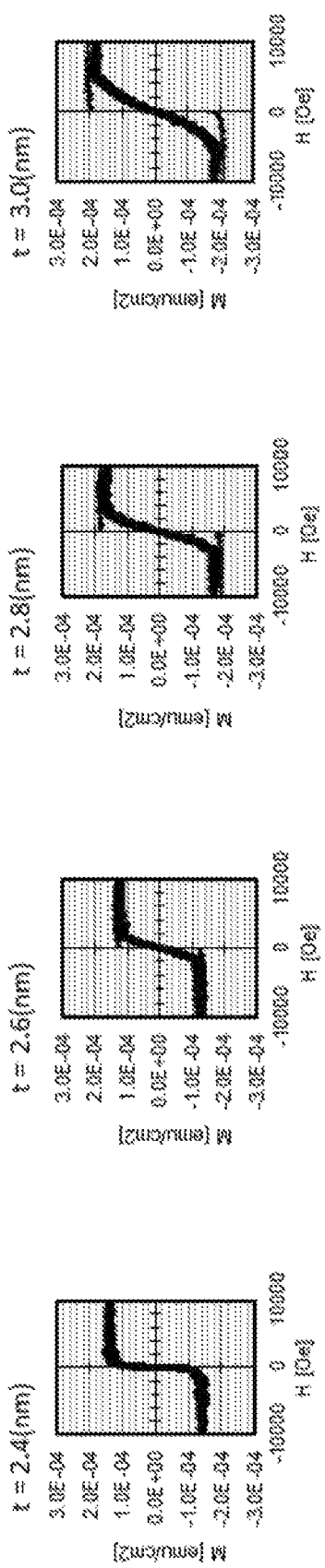
FIG. 23G shows magnetization curves in cases where a total film thickness of $(Co_{66.7}Fe_{33.3})_{75}B_{25}$ in a recording layer is (a) 2.4 nm, (b) 2.6 nm, (c) 2.8 nm, and (d) 3.0 nm, in which a perpendicular M-H loop is indicated by a solid line and an in-plane M-H loop is indicated by a thin line.
Figure 23H:
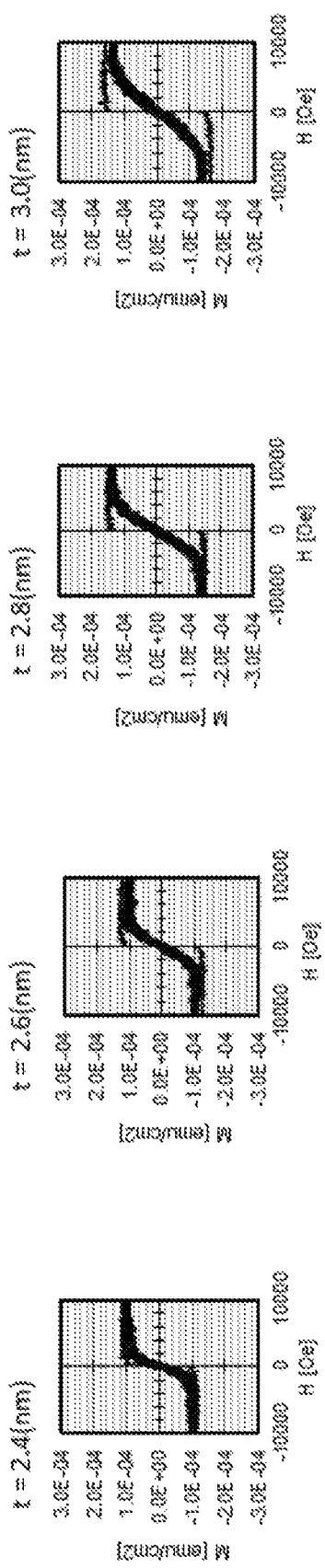
FIG. 23H shows magnetization curves in cases where a total film thickness of $(Co_{83.3}Fe_{16.7})_{75}B_{25}$ in a recording layer is (a) 2.4 nm, (b) 2.6 nm, (c) 2.8 nm, and (d) 3.0 nm, in which a perpendicular M-H loop is indicated by a solid line and an in-plane M-H loop is indicated by a thin line.
Figure 23I:
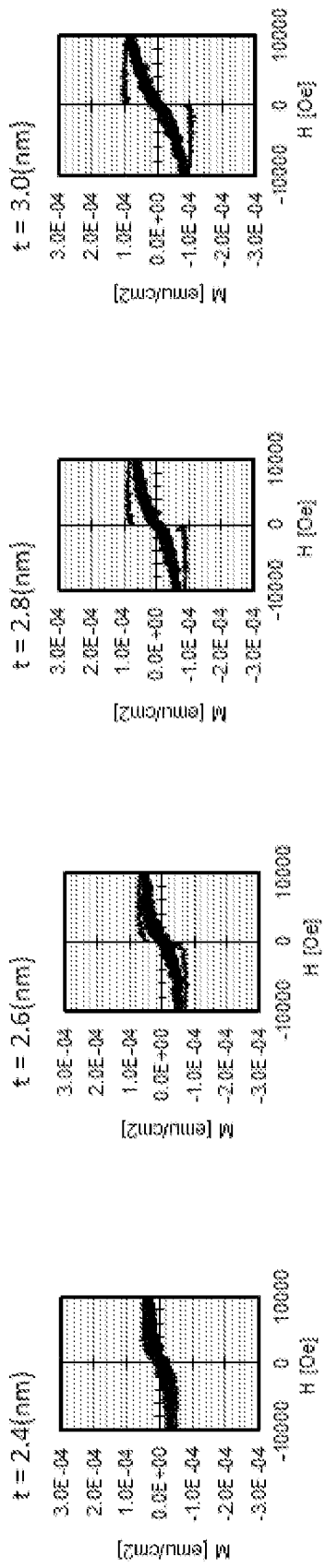
FIG. 23I shows magnetization curves in cases where a total film thickness of $Co_{75}B_{25}$ in a recording layer is (a) 2.4 nm, (b) 2.6 nm, (c) 2.8 nm, and (d) 3.0 nm, in which a perpendicular M-H loop is indicated by a solid line and an in-plane M-H loop is indicated by a thin line.

FIG. 22 shows a configuration of a magnetoresistance effect element used to obtain a value of the product $K_{eff}t$ of the effective magnetic anisotropy energy density and the film thickness of the recording layer. Ta (5 nm)/CoFeB (1.0 nm)/MgO (1.0 nm)/CoFeB (1.4 nm)/W (0.5 nm)/CoFeB (1 to 1.6 nm)/MgO (1.0 nm)/CoFeB (1.0 nm)/Ru (5 nm)/Ta (5 nm) were stacked on a substrate. In the recording layer, a layer W (0.5 nm) was sandwiched between upper and lower CoFeB layers, a film thickness of the upper CoFeB layer was varied to 1.0 nm, 1.2 nm, 1.4 nm, and 1.6 nm while keeping a film thickness of the lower CoFeB layer fixed at 1.4 nm to adjust a sum total of the film thicknesses of the upper and lower CoFeB layers so as to range from 2.4 to 3.0 nm. It should be noted that, in the present experiment, the reference layer has been omitted in order to assess only the magnetic characteristics of the recording layer.

The upper and lower CoFeB layers were adjusted such that $(Co_{100-x}Fe_x)_{75}B_{25}$, x=0 to 100 or, in other words, an Fe composition with respect to a sum total of atomic fractions of magnetic elements of the magnetic layers of the recording layer ranges from 0 to 100 at %. An annealing treatment was performed for 1 hour at 400° C. and a magnetoresistance effect element was obtained.

FIGS. 23A to 23I represent magnetization curves at respective Fe compositions and respective film thicknesses. A perpendicular M-H loop is indicated by a bold line and an in-plane M-H loop is indicated by a thin line.

Figure 24:
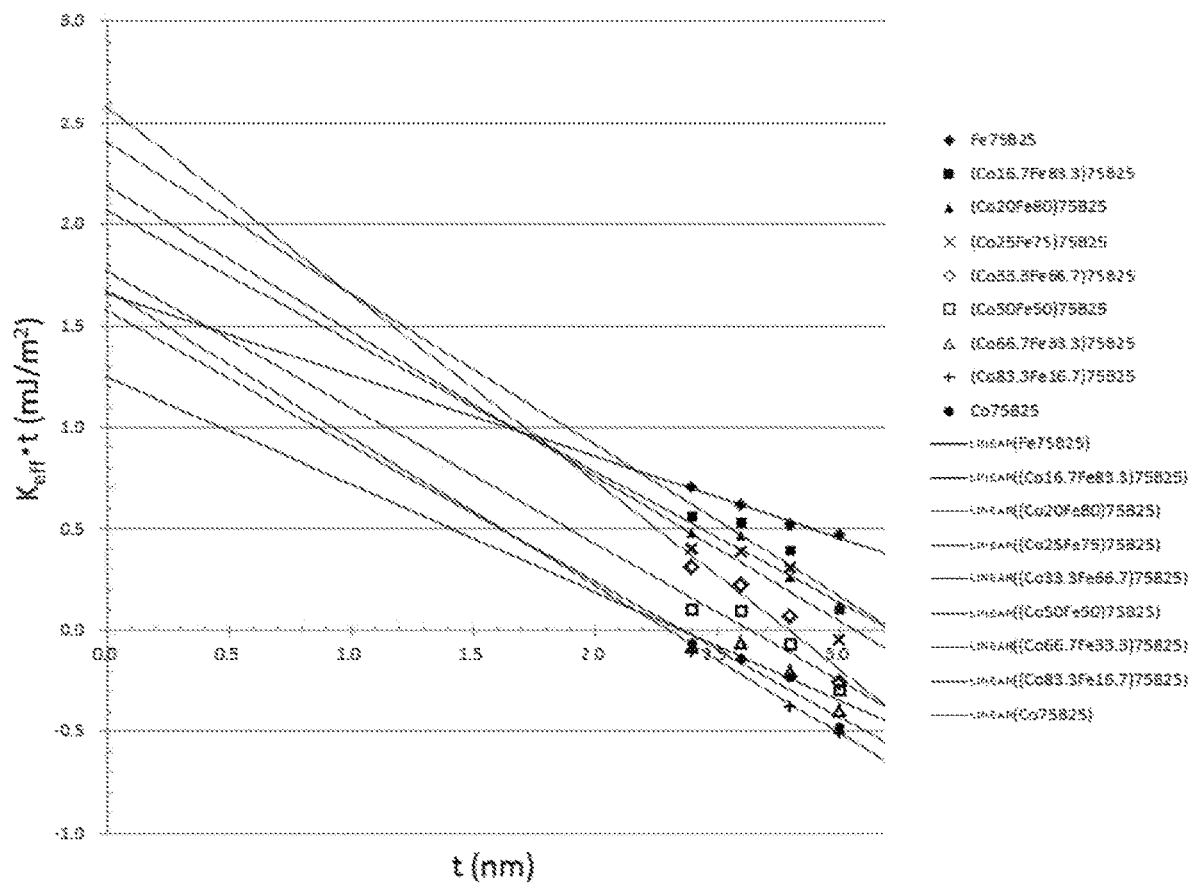
FIG. 24 shows a correlation between a product $K_{eff} t$ of an effective magnetic anisotropy energy density and a film thickness t.

Relationships between the obtained products $K_{eff}t$ of an effective magnetic anisotropy energy density and a film thickness of a recording layer and the film thickness t of the recording layer are shown in Table 1 and FIG. 24. In FIG. 24, interpolation and extrapolation were performed with a linear approximation curve (regression line) in each Fe composition.

TABLE 1

| | Keff × t (mJ/m^2) | | | | |
| --- | --- | --- | --- | --- | --- |
| | Film thickness (nm) | | | | Linear approximation curve |
| Composition | 2.4 | 2.6 | 2.8 | 3 | (regression line) |
| Fe75B25 | 0.7012 | 0.6149 | 0.5195 | 0.4665 | y = −0.3996x + 1.6545 |
| (Co16.7Fe83.3)75B25 | 0.5552 | 0.5276 | 0.3932 | 0.1028 | y = −0.7457x + 2.408 |
| (Co20Fe80)75B25 | 0.4848 | 0.4661 | 0.2585 | 0.1247 | y = −0.644x + 2.0723 |
| (Co25Fe75)75B25 | 0.4001 | 0.3875 | 0.3057 | −0.0488 | y = −0.7142x + 2.1894 |
| (Co33.3Fe66.7)75B25 | 0.3127 | 0.2200 | 0.0697 | −0.2535 | y = −0.9245x + 2.5833 |
| (Co50Fe50)75B25 | 0.1013 | 0.0945 | −0.0701 | −0.2919 | y = −0.6721x + 1.773 |
| (Co66.7Fe33.3)75B25 | −0.0851 | −0.0638 | −0.2005 | −0.3932 | y = −0.5305x + 1.2466 |
| (Co83.3Fe16.7)75B25 | −0.1058 | −0.1454 | −0.3757 | −0.5144 | y = −0.7279x + 1.6801 |
| Co75B25 | −0.0604 | −0.1404 | −0.2297 | −0.4748 | y = −0.6662x + 1.5724 |

As described earlier, a y-intercept of the linear approximation curve (regression line) shown in Table 1 and FIG. 24 is the interfacial magnetic anisotropy energy density $K_i$.

Figure 25:
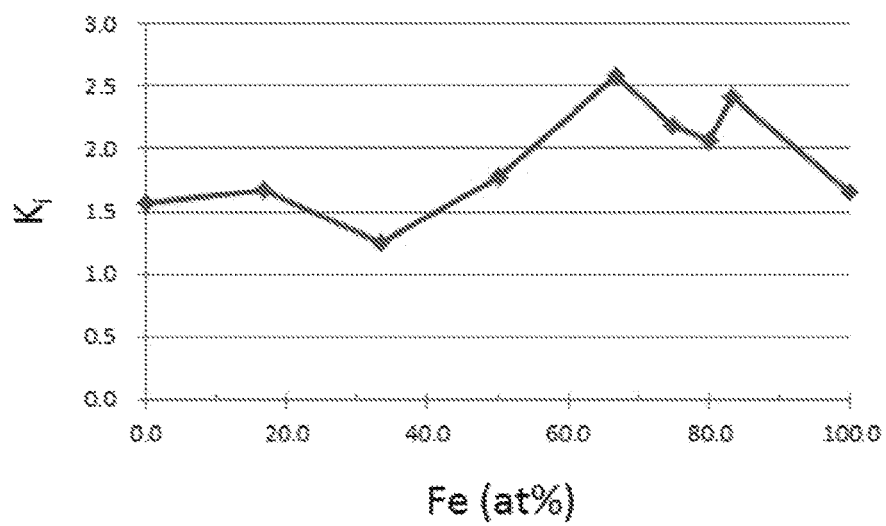
FIG. 25 shows a correlation between an interfacial magnetic anisotropy energy density $K_i$ and an Fe composition (at %) with respect to magnetic elements of a magnetic layer.

FIG. 25 plots a relationship between an Fe composition and the interfacial magnetic anisotropy energy density $K_i$.

FIG. 25 reveals that the interfacial magnetic anisotropy energy density $K_i$ is maximized when the Fe composition with respect to the sum total of the atomic fractions of the magnetic elements is near 60 to 80 at %.

A value of the saturation magnetization $M_s$ in the equation given in Math. 2 can also be obtained by measuring a magnetization curve representing a magnetic field swept in a direction perpendicular to an MTJ film surface of the recording layer and a magnetization curve representing a magnetic field swept in an in-plane direction of the MTJ film surface.

FIG. 21 shows a conceptual diagram of a magnetization curve. A product Mt of magnetization and a film thickness is plotted on an ordinate, a product $\mu_0 H$ of magnetic permeability in vacuum and a magnetic field is plotted on an abscissa, a magnetization curve (a perpendicular M-H loop) in a case where the magnetic field is swept in a perpendicular direction with respect to an MTJ film surface of the recording layer is indicated by a solid line, and a magnetization curve (an in-plane M-H loop) in a case where the magnetic field is swept in an in-plane direction is indicated by a dotted line. In the graph, the product of the saturation magnetization $M_s$ and the film thickness t is a value of magnetization of a portion in which magnetization of the perpendicular M-H loop or the in-plane M-H loop saturates in the first quadrant.

A configuration of a magnetoresistance effect element used to obtain a value of the saturation magnetization $M_s$ is the same as the configuration of the magnetoresistance effect element used to obtain the value of the product $K_{eff}t$ of the effective magnetic anisotropy energy density and the film thickness of the recording layer (refer to FIG. 22). In the recording layer, a layer W (0.5 nm) was sandwiched between upper and lower CoFeB layers, a film thickness of the upper CoFeB layer was varied to 1.0 nm, 1.2 nm, 1.4 nm, and 1.6 nm while keeping a film thickness of the lower CoFeB layer fixed at 1.4 nm to adjust a sum total of the film thicknesses of the upper and lower CoFeB layers so as to range from 2.4 to 3.0 nm. It should be noted that, in the present experiment, the reference layer has been omitted in order to assess only the magnetic characteristics of the recording layer.

The upper and lower CoFeB layers were adjusted such that $(Co_{100-x}Fe_x)_{75}B_{25}$, x=0 to 100 or, in other words, an Fe composition with respect to a sum total of atomic fractions of magnetic elements of the magnetic layers of the recording layer ranges from 0 to 100 at %. An annealing treatment was performed for 1 hour at 400° C. and a magnetoresistance effect element was obtained.

Magnetization curves at respective Fe compositions and respective film thicknesses are shown in FIGS. 23A to 23I.

Figure 26:
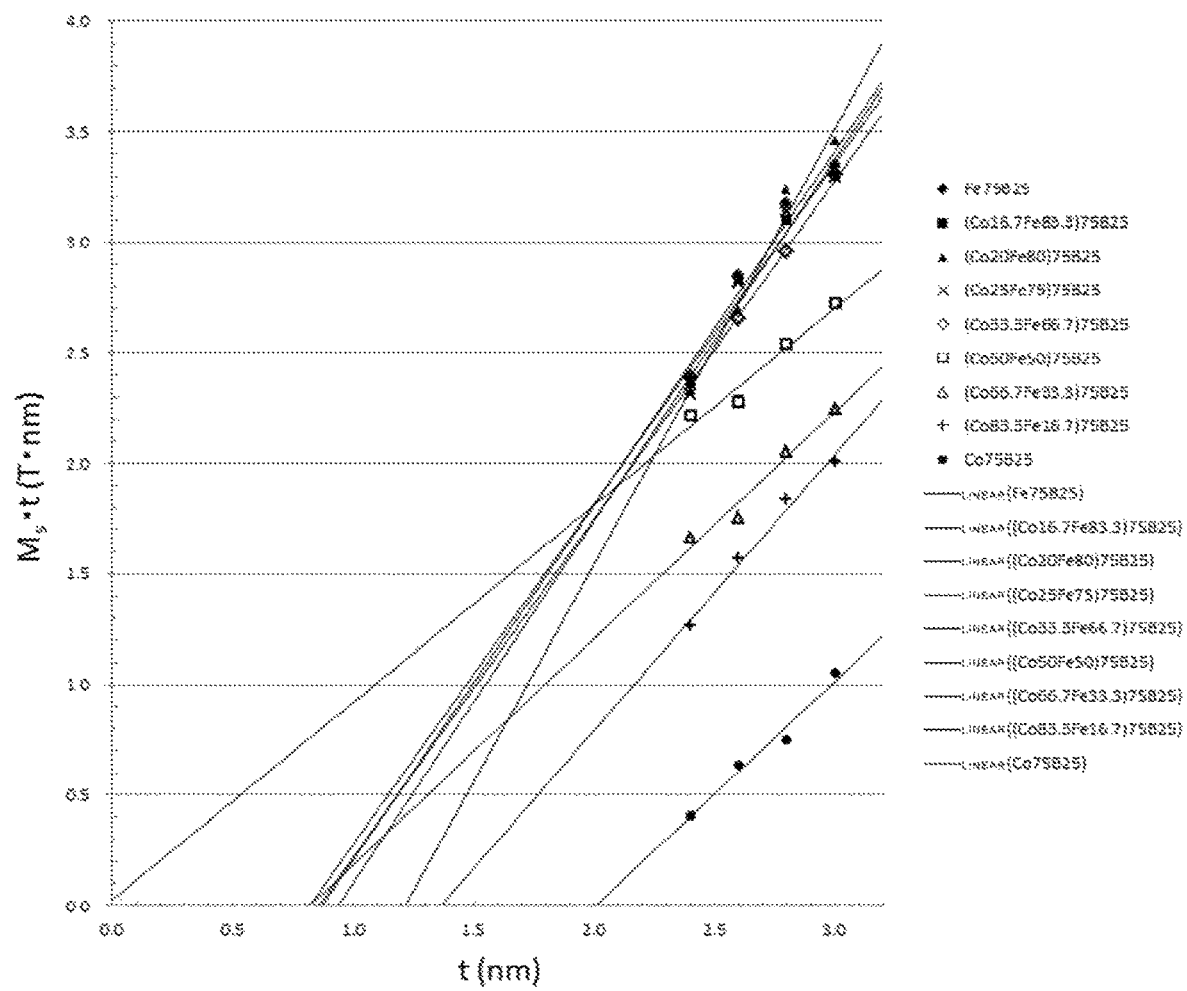
FIG. 26 shows a correlation between a product $M_s t$ of a saturation magnetization and a film thickness and a film thickness t.

Relationships between the obtained products $M_s t$ of the saturation magnetization $M_s$ and the film thickness t and the film thickness t of the recording layer are shown in Tables 2 and 3 and FIG. 26. In FIG. 26, interpolation and extrapolation were performed with a linear approximation curve (regression line) in each Fe composition.

It should be noted that the obtained products $M_s t$ of the saturation magnetization and the film thickness have been converted from the cgs system of units (emu/cm$^2$) into the MKS system (T·nm) (refer to Tables 2 and 3). A conversion equation of T·nm=4π×1000 emu/cm$^2$ was used.

TABLE 2

| | Ms × t (10^−4 emu/cm^2) | | | |
|---|---|---|---|---|
| | Film thickness (nm) | | | |
| Composition | 2.4 | 2.6 | 2.8 | 3.0 |
| Fe75B25 | 1.8959 | 2.2712 | 2.5285 | 2.6615 |
| (Co16.7Fe83.3)75B25 | 1.8805 | 2.2549 | 2.4677 | 2.6269 |
| (Co20Fe80)75B25 | 1.8544 | 2.1442 | 2.5767 | 2.7559 |
| (Co25Fe75)75B25 | 1.8396 | 2.2441 | 2.4990 | 2.6236 |
| (Co33.3Fe66.7)75B25 | 1.9023 | 2.1113 | 2.3549 | 2.6337 |
| (Co50Fe50)75B25 | 1.7622 | 1.8155 | 2.0202 | 2.1682 |
| (Co66.7Fe33.3)75B25 | 1.3262 | 1.3962 | 1.6339 | 1.7908 |
| (Co83.3Fe16.7)75B25 | 1.0077 | 1.2473 | 1.4606 | 1.5993 |
| Co75B25 | 0.3250 | 0.5069 | 0.5960 | 0.8374 |

TABLE 3

| | Ms × t (Tnm) | | | | |
|---|---|---|---|---|---|
| | Film thickness (nm) | | | | Linear approximation curve |
| Composition | 2.4 | 2.6 | 2.8 | 3.0 | (regression line) |
| Fe75B25 | 2.3824 | 2.8540 | 3.1775 | 3.3446 | y = 1.6049x − 1.3936 |
| (Co16.7Fe83.3)75B25 | 2.3630 | 2.8336 | 3.1010 | 3.3010 | y = 1.5406x − 1.2601 |
| (Co20Fe80)75B25 | 2.3303 | 2.6945 | 3.2379 | 3.4631 | y = 1.9709x − 2.3901 |
| (Co25Fe75)75B25 | 2.3117 | 2.8200 | 3.1404 | 3.2969 | y = 1.6381x − 1.5306 |
| (Co33.3Fe66.7)75B25 | 2.3906 | 2.6532 | 2.9593 | 3.3096 | y = 1.5316x − 1.3071 |
| (Co50Fe50)75B25 | 2.2145 | 2.2815 | 2.5387 | 2.7247 | y = 0.894x + 0.0261 |
| (Co66.7Fe33.3)75B25 | 1.6666 | 1.7545 | 2.0533 | 2.2503 | y = 1.025x − 0.8363 |
| (Co83.3Fe16.7)75B25 | 1.2663 | 1.5674 | 1.8355 | 2.0098 | y = 1.2493x − 1.7034 |
| Co75B25 | 0.4084 | 0.6370 | 0.7489 | 1.0523 | y = 1.0219x − 2.0474 |

As described earlier, a slope of the linear approximation curve (regression line) shown in Table 3 and FIG. 26 is the saturation magnetization $M_s$ of the CoFeB layer of the recording layer.

Figure 27:
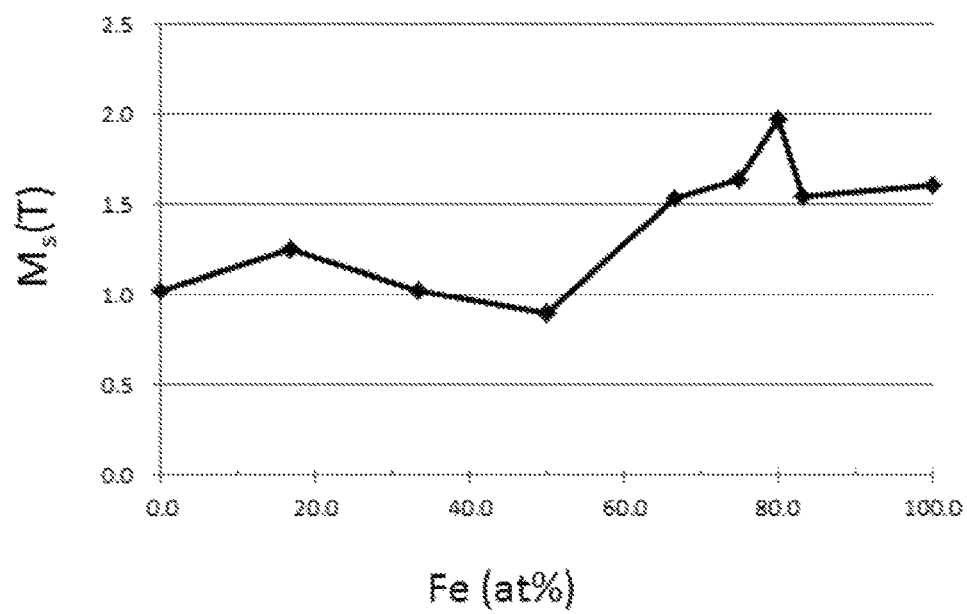
FIG. 27 shows a correlation between a saturation magnetization $M_s$ and an Fe composition (at %) with respect to magnetic elements of a magnetic layer.

FIG. 27 plots a relationship between an Fe composition and the saturation magnetization $M_s$.

FIG. 27 reveals that the saturation magnetization $M_s$ is maximized when the Fe composition with respect to the sum total of the atomic fractions of the magnetic elements is near 60 to 80 at %.

As described earlier, according to the equation given in Math. 2, in order to obtain a large product $K_{eff}t$ of the effective magnetic anisotropy energy density and the film thickness of the recording layer, the saturation magnetization $M_s$ of the recording layer must be lowered so as to prevent the interfacial magnetic anisotropy energy density $K_i$ from decreasing. In the considerations of the present invention, it was discovered that both the interfacial magnetic anisotropy energy density $K_i$ and the saturation magnetization $M_s$ are maximized when the Fe composition with respect to the sum total of the atomic fractions of the magnetic elements is near 60 to 80 at %. This means that, when obtaining a high effective magnetic anisotropy energy density $K_{eff}$, increasing the interfacial magnetic anisotropy energy density $K_i$ (increasing the ratio of Fe compositions) and reducing the saturation magnetization $M_s$ of the recording layer (reducing the ratio of Fe compositions) are in a trade-off relationship.

However, interfacial magnetic anisotropy is a property that a direction in which magnetization readily occurs appears due to electron orbital hybridization on an interface, and a value of the interfacial magnetic anisotropy energy density $K_i$ is a value determined by a layer in the order of several atoms on an interface between the first non-magnetic layer (MgO in FIG. 11) and a magnetic layer in the recording layer (the CoFeB layer in the recording layer in FIG. 22). In other words, an Fe composition in a more separated magnetic layer of the recording layer does not affect the value of the interfacial magnetic anisotropy energy density $K_i$.

On the other hand, a value of the saturation magnetization $M_s$ is determined by an entire magnetic layer of the recording layer. As shown in Table 3 and FIG. 26, when the Fe composition is the same, the value of the saturation magnetization $M_s$ increases as the film thickness increases.

In consideration thereof, by dividing the magnetic layer of the recording layer into at least two, providing a first magnetic layer in which an Fe composition with respect to a sum total of atomic fractions of magnetic elements is 50 at % or higher, preferably 60 at % or higher, and more preferably ranges from 60 to 90 at % in an interface with the first non-magnetic layer (MgO in FIG. 22), and arranging a second magnetic layer in which an Fe composition with respect to a sum total of atomic fractions of magnetic elements is 50 at % or lower and preferably 40 at % or lower and which does not come into contact with the non-magnetic layer, an MTJ having a higher effective magnetic anisotropy energy density $K_{eff}$ can be manufactured and a magnetoresistance effect element with a high thermal stability factor $\Delta$ including the MTJ can be provided.

(Consideration Related to Increasing Thermal Stability Factor $\Delta$ Using Non-Magnetic Insertion Layer)

Figure 28:
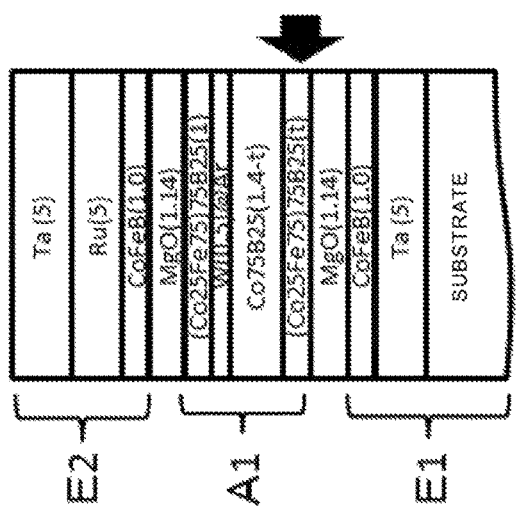
FIG. 28 shows a longitudinal section view of a configuration of a magnetoresistance effect element into which a non-magnetic insertion layer has not been inserted.
Figure 29B:
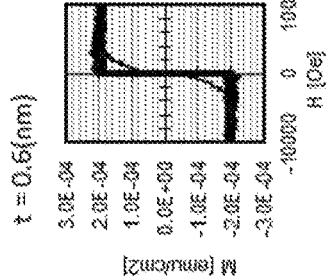
FIG. 29 shows magnetization curves in cases where a film thickness of $(Co_{25}Fe_{75})_{75}B_{25}$ adjacent to $Co_{75}B_{25}$ of a recording layer in FIG. 28 is (a) 0.2 nm, (b) 0.4 nm, (c) 0.6 nm, (d) 0.8 nm, (e) 1.0 nm, and (f) 1.4 nm, in which a perpendicular M-H loop is indicated by a solid line and an in-plane M-H loop is indicated by a thin line.
Figure 29C:
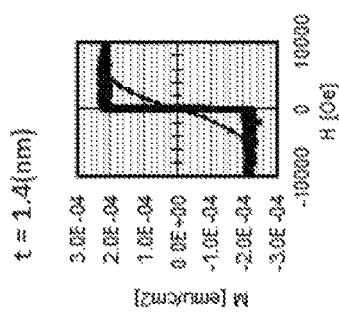
Figure 29E:
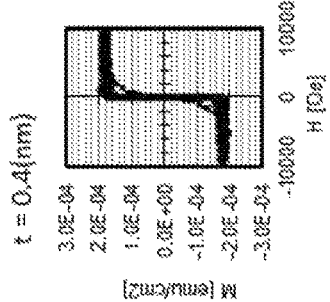
Figure 29F:
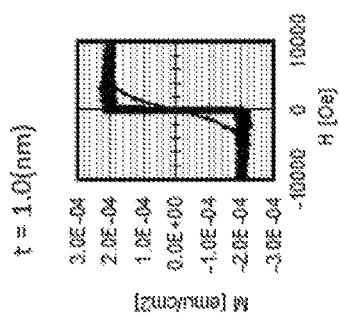
Figure 29A:
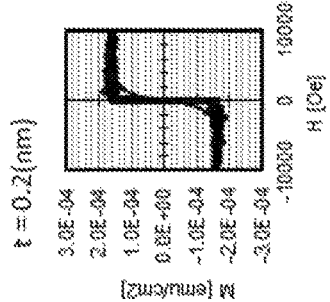
Figure 29D:
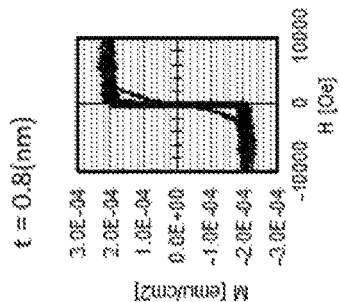

In the consideration related to the thermal stability factor $\Delta$ due to the Fe composition in magnetic elements of the magnetic layer described above, using a magnetoresistance effect element obtained by actually dividing the magnetic layer of the recording layer into at least two, providing a first magnetic layer (($Co_{25}Fe_{75})_{75}B_{25}$ in FIG. 28) in which an Fe composition with respect to a sum total of atomic fractions of magnetic elements is 50 at % or higher, preferably 60 at % or higher, and more preferably ranges from 60 to 90 at % in an interface with the first non-magnetic layer (in FIG. 28, MgO sandwiched between a lower non-magnetic electrode (E1) and a first recording layer (A1)), arranging a second magnetic layer ($Co_{75}B_{25}$ in FIG. 28) in which an Fe composition with respect to a sum total of atomic fractions of magnetic elements is 50 at % or lower and preferably 40 at % or lower and which does not come into contact with the non-magnetic layer, and performing an annealing treatment for 1 hour at 400° C., an increase or decrease of the saturation magnetization $M_s$ and the product $K_{eff}t$ of the effective magnetic anisotropy energy density and the film thickness of the recording layer which affect the thermal stability factor $\Delta$ was confirmed.

Specifically, as shown in FIG. 28, the magnetoresistance effect element is configured such that layers are stacked in an order of the lower non-magnetic electrode (E1)/the first non-magnetic layer/the first recording layer (A1)/the second non-magnetic layer/the upper non-magnetic electrode (E2), the lower non-magnetic electrode (E1) includes layers stacked in an order of substrate/Ta (5 nm)/CoFeB (1.0 nm), the first non-magnetic layer is MgO (1.14 nm), the first recording layer (A1) includes layers stacked in an order of ($Co_{25}Fe_{75})_{75}B_{25}$ (t nm, the layer indicated by an arrow in FIG. 28)/$Co_{75}B_{25}$ ((1.4−t) nm)/W (0.5 nm)/($Co_{25}Fe_{75})_{75}B_{25}$ (1 nm), the second non-magnetic layer is MgO (1.0 nm), and the upper non-magnetic electrode (E2) includes layers stacked in an order of CoFeB (1.0 nm)/Ru (5 nm)/Ta (5 nm). CoFeB of the upper non-magnetic electrode (E2) in the present experiment is a cap layer. In addition, the layer W has been sputtered by Ar.

In the present confirmation test, a sum total of the film thickness of the first magnetic layer and the film thickness of the second magnetic layer was set to 1.4 nm and the film thickness t of the first magnetic layer was set to a range of 0.2 to 1.4 nm. In ($Co_{25}Fe_{75})_{75}B_{25}$, when the sum total of atomic fractions of the entire layer is assumed to be 100%, Co is 18.75 at %, Fe is 56.25 at %, and B is 25 at %. Furthermore, in the present experiment, the reference layer has been omitted in order to assess only the magnetic characteristics of the recording layer.

FIG. 29 shows magnetization curves at respective film thicknesses of the first magnetic layer ($Co_{25}Fe_{75})_{75}B_{25}$.

In addition, the saturation magnetization $M_s$ and the product $K_{eff}t$ of an effective magnetic anisotropy energy density and a film thickness of a recording layer obtained from these magnetization curves are shown in Table 4.

TABLE 4

| Film thickness t (nm) | Ms × t (Tnm) | Keff × t (mJ/m²) |
|---|---|---|
| 0.2 | 2.0528 | 0.1878 |
| 0.4 | 2.2515 | 0.1733 |
| 0.6 | 2.4105 | 0.1781 |
| 0.8 | 2.5366 | 0.2923 |
| 1.0 | 2.6832 | 0.2864 |
| 1.4 | 2.9297 | 0.3978 |

FIG. 29 and Table 4 reveal that, in proportion to an increase in a ratio of the film thickness of the first magnetic layer ($Co_{25}Fe_{75})_{75}B_{25}$ in contact with the MgO layer to a sum total of the film thickness of the first magnetic layer and the film thickness of the second magnetic layer or, in other words, in proportion to an increase in a total Fe composition of the first magnetic layer and the second magnetic layer, both the product $M_s t$ of the saturation magnetization and the film thickness and the product $K_{eff}t$ of the effective magnetic anisotropy energy density and the film thickness increase.

In this case, with respect to the saturation magnetization $M_s$, it is also obvious from FIG. 27 and the like that, when the ratio of the film thickness of the first magnetic layer or, in other words, the total Fe composition (at %) of the first magnetic layer and the second magnetic layer increases, the saturation magnetization $M_s$ increases.

On the other hand, with respect to the product $K_{eff}t$ of the effective magnetic anisotropy energy density and the film thickness of the recording layer, even when the saturation magnetization $M_s$ decreases or, in other words, the ratio of the film thickness of the first magnetic layer is low, a further increase in $K_{eff}t$ is expected due to a contribution of the interfacial magnetic anisotropy energy density $K_i$. However, due to both the product $M_s t$ of the saturation magnetization and the film thickness and the product $K_{eff}t$ of the effective magnetic anisotropy energy density and the film thickness increasing in proportion to an increase in the total Fe composition of the first magnetic layer and the second magnetic layer, since constituent elements of the first magnetic layer and the second magnetic layer tend to mutually diffuse during actual film formation and heat treatment, it is suggested that the effect of the contribution of the interfacial magnetic anisotropy energy density $K_i$ of the first magnetic layer that is in contact with the MgO layer on $K_{eff}t$ is not fully exploited.

In consideration thereof, an experiment was performed by inserting a non-magnetic insertion layer for preventing mutual diffusion between the first magnetic layer and the second magnetic layer to study the effect of the insertion to the saturation magnetization $M_s$ and the product $K_{eff}t$ of the effective magnetic anisotropy energy density and the film thickness.

FIG. 30 shows a configuration of a magnetoresistance effect element in which a layer W is adopted as a non-magnetic insertion layer. Layers are stacked in an order of the lower non-magnetic electrode (E1)/the first non-magnetic layer/the first recording layer (A1)/the second non-magnetic layer/the upper non-magnetic electrode (E2), the lower non-magnetic electrode (E1) includes layers stacked in an order of substrate/Ta (5 nm)/CoFeB (1.0 nm), the first non-magnetic layer is MgO (1.14 nm), the first recording layer (A1) includes layers stacked in an order of ($Co_{25}Fe_{75})_{75}B_{25}$ (0.6 nm)/W that is a non-magnetic insertion layer (0 to 0.4 nm)/$Co_{75}B_{25}$ (0.8 nm)/W that is a non-magnetic coupling layer (0.5 nm)/($Co_{25}Fe_{75})_{75}B_{25}$ (1 nm), the second non-magnetic layer is MgO (1.14 nm), and the upper non-magnetic electrode (E2) includes layers stacked in an order of CoFeB (1.0 nm)/Ru (5 nm)/Ta (5 nm). CoFeB of the upper non-magnetic electrode (E2) in the present experiment is a cap layer. In addition, the layer W as the non-magnetic insertion layer has been sputtered by Kr, and the 0.5 nm layer W has been sputtered by Ar. It should be noted that, in the present experiment, the reference layer has been omitted in order to assess only the magnetic characteristics of the recording layer.

The layer W (a layer indicated by an arrow in FIG. 30) that is the non-magnetic insertion layer of the first recording layer (A1) was inserted between the first magnetic layer (in FIG. 30, $(Co_{25}Fe_{75})_{75}B_{25}$, 0.6 nm in contact with MgO of the first non-magnetic layer) and the second magnetic layer (in FIG. 30, $Co_{75}B_{25}$, 0.8 nm), and an insertion layer film thickness was set to a range of 0 to 0.4 nm.

The stacked magnetoresistance effect element was subjected to an annealing treatment for 1 hour at 400° C. After the annealing at 400° C., CoFeB of the lower non-magnetic electrode (E1) and CoFeB of the upper non-magnetic electrode (E2) become non-magnetized due to diffusion of adjacent Ta or Ru into CoFeB.

FIG. 31 shows magnetization curves at respective insertion layer film thicknesses of the layer W.

Figure 32:
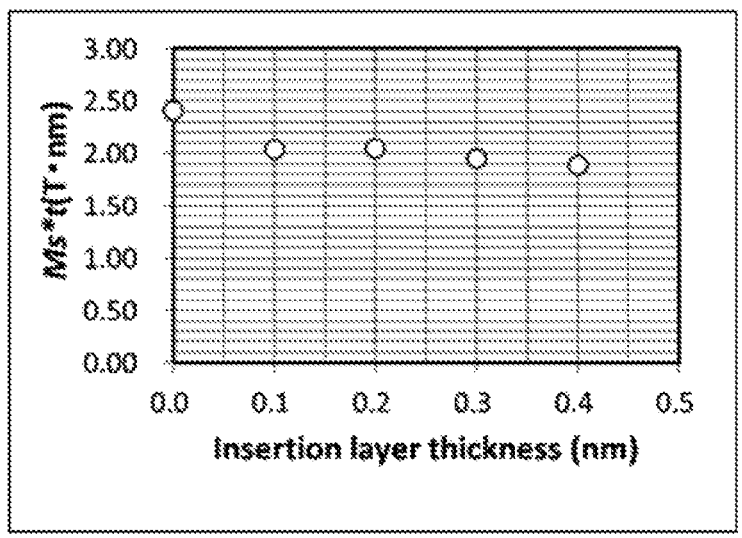
FIG. 32 shows a correlation between a product $M_s t$ of a saturation magnetization and a film thickness and an insertion layer film thickness t of a non-magnetic insertion layer of a magnetoresistance effect element in which a layer W is adopted as the non-magnetic insertion layer.
Figure 33:
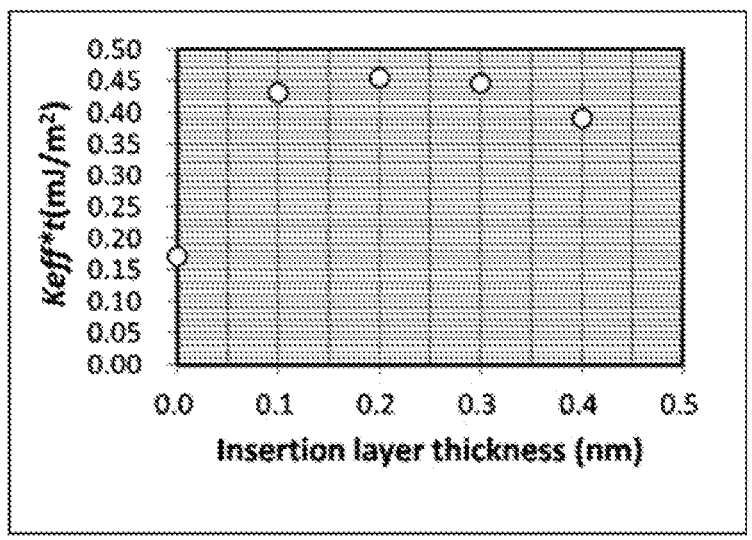
FIG. 33 shows a correlation between a product $K_{eff} t$ of an effective magnetic anisotropy energy density and a film thickness and an insertion layer film thickness t of a non-magnetic insertion layer of a magnetoresistance effect element in which a layer W is adopted as the non-magnetic insertion layer.

In addition, a correlation between the product $M_s t$ of the saturation magnetization and a film thickness and the insertion layer film thickness obtained from these magnetization curves is shown in FIG. 32, and a correlation between the product $K_{eff} t$ of an effective magnetic anisotropy energy density and a film thickness and the insertion layer film thickness obtained from these magnetization curves is shown in FIG. 33.

It is revealed that, due to the insertion of the layer W, the saturation magnetization $M_s$ decreases and the product $K_{eff} t$ of an effective magnetic anisotropy energy density and a film thickness is maximized when the insertion layer film thickness is around 0.2 nm.

Figure 34:
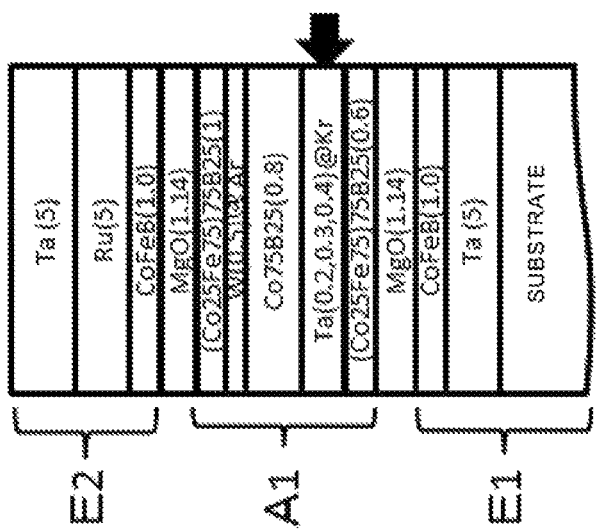
FIG. 34 shows a longitudinal section view of a configuration of a magnetoresistance effect element in which a Ta layer is adopted as a non-magnetic insertion layer.

FIG. 34 shows a configuration of a magnetoresistance effect element in which a Ta layer is adopted as a non-magnetic insertion layer. Layers are stacked in an order of the lower non-magnetic electrode (E1)/the first non-magnetic layer/the first recording layer (A1)/the second non-magnetic layer/the upper non-magnetic electrode (E2), the lower non-magnetic electrode (E1) includes layers stacked in an order of substrate/Ta (5 nm)/CoFeB (1.0 nm), the first non-magnetic layer is MgO (1.14 nm), the first recording layer (A1) includes layers stacked in an order of $(Co_{25}Fe_{75})_{75}B_{25}$ (0.6 nm)/Ta (0 to 0.4 nm)/$Co_{75}B_{25}$ (0.8 nm)/W (0.5 nm)/$(Co_{25}Fe_{75})_{75}B_{25}$ (1 nm), the second non-magnetic layer is MgO (1.14 nm), and the upper non-magnetic electrode (E2) includes layers stacked in an order of CoFeB (1.0 nm)/Ru (5 nm)/Ta (5 nm). CoFeB of the upper non-magnetic electrode (E2) in the present experiment is a cap layer. In addition, the Ta layer as the non-magnetic insertion layer has been sputtered by Kr, and the 0.5 nm layer W has been sputtered by Ar. It should be noted that, in the present experiment, the reference layer has been omitted in order to assess only the magnetic characteristics of the recording layer.

The Ta layer (a layer indicated by an arrow in FIG. 34) that is the non-magnetic insertion layer of the first recording layer (A1) was inserted between the first magnetic layer (in FIG. 34, $(Co_{25}Fe_{75})_{75}B_{25}$, 0.6 nm in contact with MgO of the first non-magnetic layer) and the second magnetic layer (in FIG. 34, $Co_{75}B_{25}$, 0.8 nm), and an insertion layer film thickness was set to a range of 0 to 0.4 nm.

The stacked magnetoresistance effect element was subjected to an annealing treatment for 1 hour at 400° C. After the annealing at 400° C., CoFeB of the lower non-magnetic electrode (E1) and CoFeB of the upper non-magnetic electrode (E2) become non-magnetized due to diffusion of adjacent Ta or Ru into CoFeB.

Figures 35A, 35B, 35C, 35D:
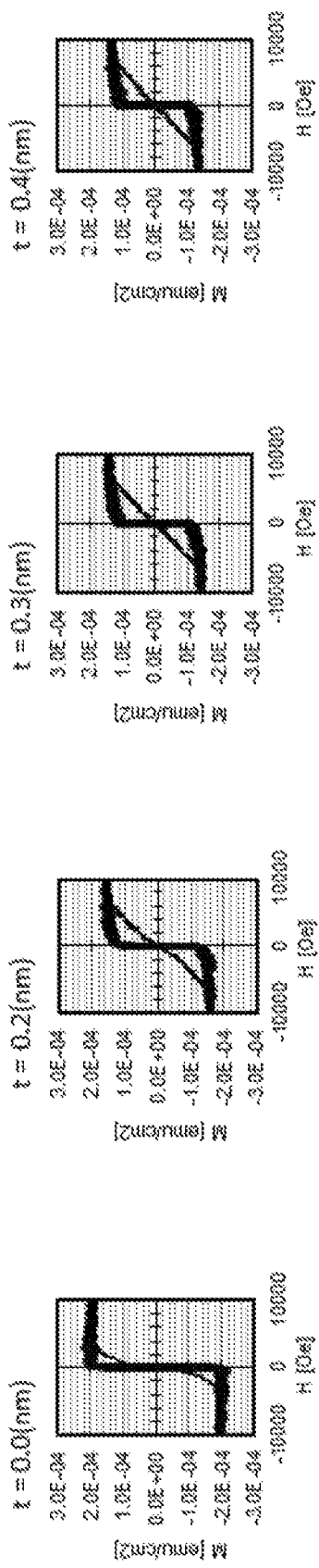
FIG. 35 shows magnetization curves in cases where a film thickness of the Ta layer of the recording layer in FIG. 34 is (a) 0.0 nm, (b) 0.2 nm, (c) 0.3 nm, and (d) 0.4 nm, in which a perpendicular M-H loop is indicated by a solid line and an in-plane M-H loop is indicated by a thin line.

FIG. 35 shows magnetization curves at respective insertion layer film thicknesses of the Ta layer.

Figure 36:
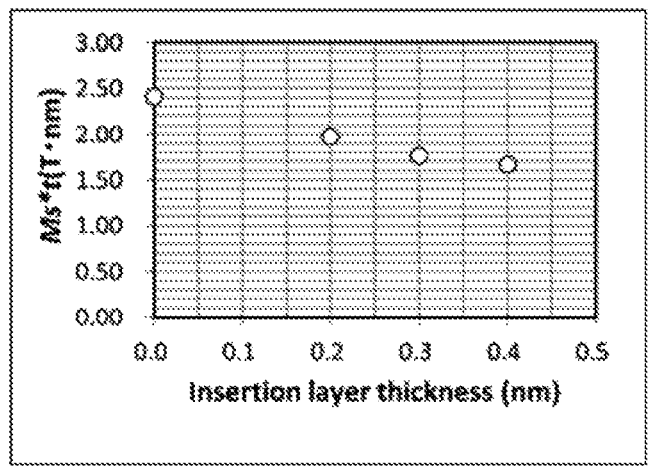
FIG. 36 shows a correlation between a product $M_s t$ of a saturation magnetization and a film thickness and an insertion layer film thickness t of a non-magnetic insertion layer of a magnetoresistance effect element in which a Ta layer is adopted as the non-magnetic insertion layer.
Figure 37:
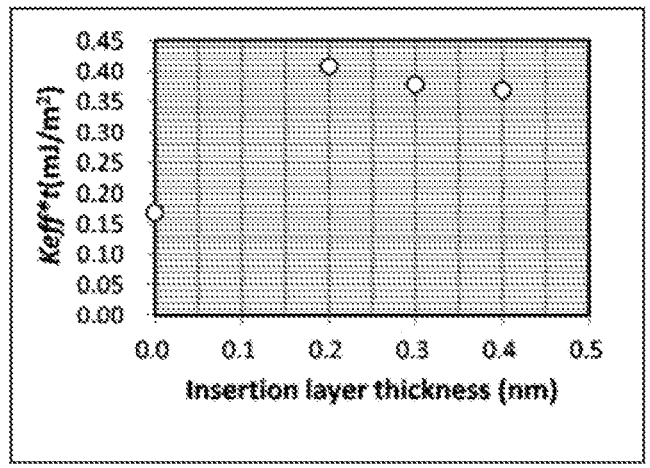
FIG. 37 shows a correlation between a product $K_{eff} t$ of an effective magnetic anisotropy energy density and a film thickness and an insertion layer film thickness t of a non-magnetic insertion layer of a magnetoresistance effect element in which a Ta layer is adopted as the non-magnetic insertion layer.

In addition, a correlation between the product $M_s t$ of the saturation magnetization and a film thickness and the insertion layer film thickness obtained from these magnetization curves is shown in FIG. 36, and a correlation between the product $K_{eff} t$ of an effective magnetic anisotropy energy density and a film thickness and the insertion layer film thickness obtained from these magnetization curves is shown in FIG. 37.

It is revealed that, due to the insertion of the Ta layer, the saturation magnetization $M_s$ decreases and the product $K_{eff} t$ of an effective magnetic anisotropy energy density and a film thickness increases.

Figure 38:
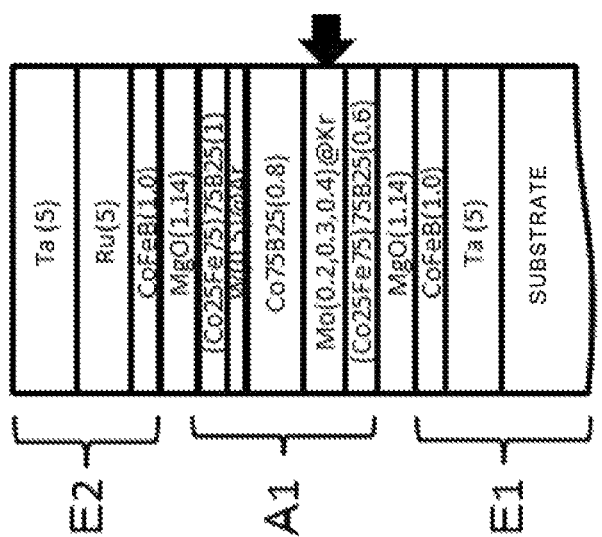
FIG. 38 shows a longitudinal section view of a configuration of a magnetoresistance effect element in which a Mo layer is adopted as a non-magnetic insertion layer.

FIG. 38 shows a configuration of a magnetoresistance effect element in which an Mo layer is adopted as a non-magnetic insertion layer. Layers are stacked in an order of the lower non-magnetic electrode (E1)/the first non-magnetic layer/the first recording layer (A1)/the second non-magnetic layer/the upper non-magnetic electrode (E2), the lower non-magnetic electrode (E1) includes layers stacked in an order of substrate/Ta (5 nm)/CoFeB (1.0 nm), the first non-magnetic layer is MgO (1.14 nm), the first recording layer (A1) includes layers stacked in an order of $(Co_{25}Fe_{75})_{75}B_{25}$ (0.6 nm)/Mo (0 to 0.4 nm)/$Co_{75}B_{25}$ (0.8 nm)/W (0.5 nm)/$(Co_{25}Fe_{75})_{75}B_{25}$ (1 nm), the second non-magnetic layer is MgO (1.14 nm), and the upper non-magnetic electrode (E2) includes layers stacked in an order of CoFeB (1.0 nm)/Ru (5 nm)/Ta (5 nm). CoFeB of the upper non-magnetic electrode (E2) in the present experiment is a cap layer. In addition, the Mo layer as the non-magnetic insertion layer has been sputtered by Kr, and the 0.5 nm layer W has been sputtered by Ar. It should be noted that, in the present experiment, the reference layer has been omitted in order to assess only the magnetic characteristics of the recording layer.

The Mo layer (a layer indicated by an arrow in FIG. 38) that is the non-magnetic insertion layer of the first recording layer (A1) was inserted between the first magnetic layer (in FIG. 38, $(Co_{25}Fe_{75})_{75}B_{25}$, 0.6 nm in contact with the MgO layer of the first non-magnetic layer) and the second magnetic layer (in FIG. 38, $Co_{75}B_{25}$, 0.8 nm), and an insertion layer film thickness was set to a range of 0 to 0.4 nm.

The stacked magnetoresistance effect element was subjected to an annealing treatment for 1 hour at 400° C. After the annealing at 400° C., CoFeB of the lower non-magnetic electrode (E1) and CoFeB of the upper non-magnetic electrode (E2) become non-magnetized due to diffusion of adjacent Ta or Ru into CoFeB.

Figures 39A, 39B, 39C, 39D:
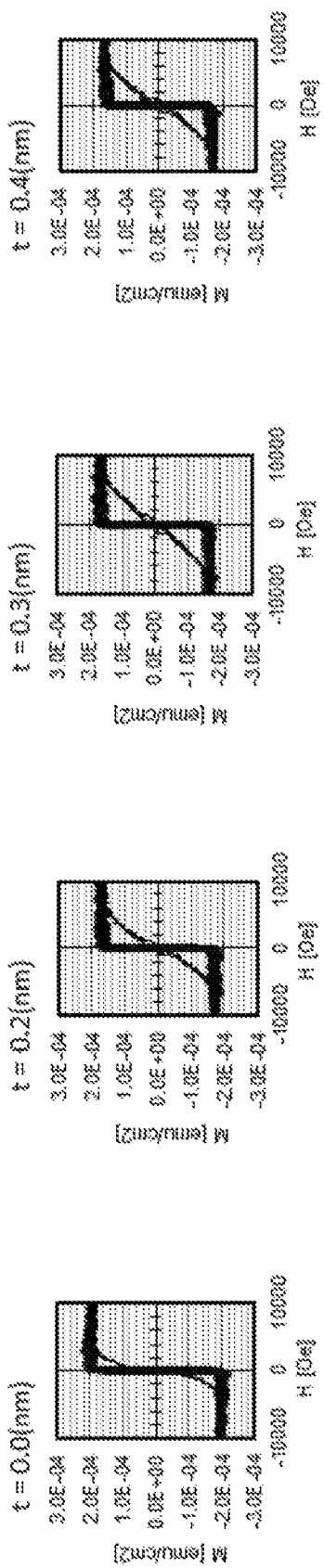
FIG. 39 shows magnetization curves in cases where a film thickness of the Mo layer of the recording layer in FIG. 37 is (a) 0.0 nm, (b) 0.2 nm, (c) 0.3 nm, and (d) 0.4 nm, in which a perpendicular M-H loop is indicated by a solid line and an in-plane M-H loop is indicated by a thin line.

FIG. 39 shows magnetization curves at respective insertion layer film thicknesses of the Mo layer.

Figure 40:
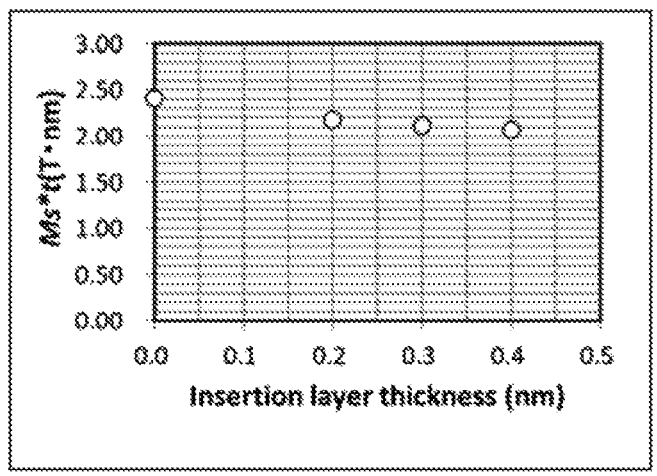
FIG. 40 shows a correlation between a product $M_s t$ of a saturation magnetization and a film thickness and an insertion layer film thickness t of a non-magnetic insertion layer of a magnetoresistance effect element in which a Mo layer is adopted as the non-magnetic insertion layer.
Figure 41:
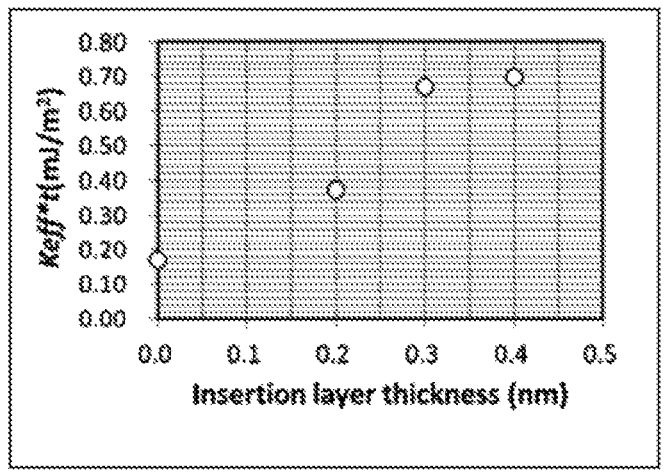
FIG. 41 shows a correlation between a product $K_{eff} t$ of an effective magnetic anisotropy energy density and a film thickness and an insertion layer film thickness t of a non-magnetic insertion layer of a magnetoresistance effect element in which a Mo layer is adopted as the non-magnetic insertion layer.

In addition, a correlation between the product $M_s t$ of the saturation magnetization and a film thickness and the insertion layer film thickness obtained from these magnetization curves is shown in FIG. 40, and a correlation between the product $K_{eff} t$ of an effective magnetic anisotropy energy density and a film thickness and the insertion layer film thickness obtained from these magnetization curves is shown in FIG. 41.

It is revealed that, due to the insertion of the Mo layer, the saturation magnetization $M_s$ decreases and the product $K_{eff} t$ of an effective magnetic anisotropy energy density and a film thickness increases.

A similar experiment was performed using an Mg layer and an MgO layer as non-magnetic insertion layers.

Figure 42:
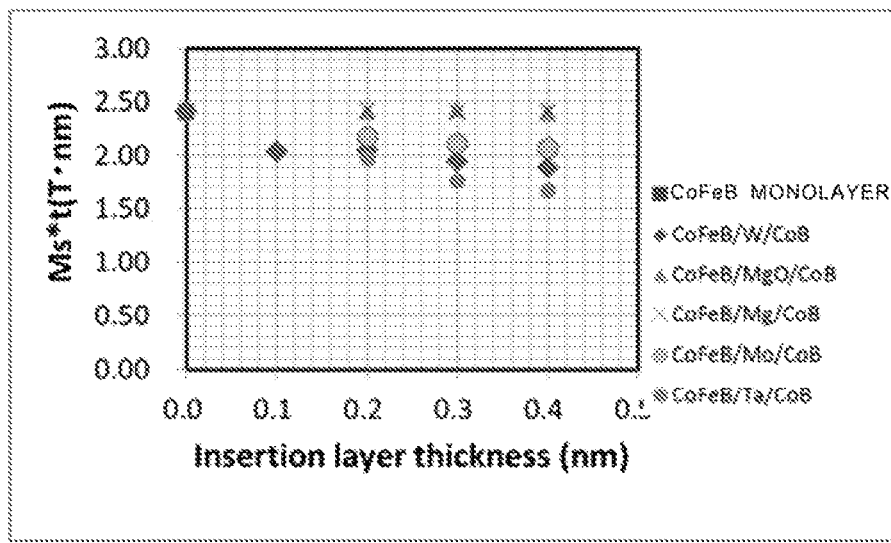
FIG. 42 shows a correlation between a product $M_s t$ of a saturation magnetization and a film thickness and an insertion layer film thickness t of a non-magnetic insertion layer according to elemental species constituting the non-magnetic insertion layer.
Figure 43:
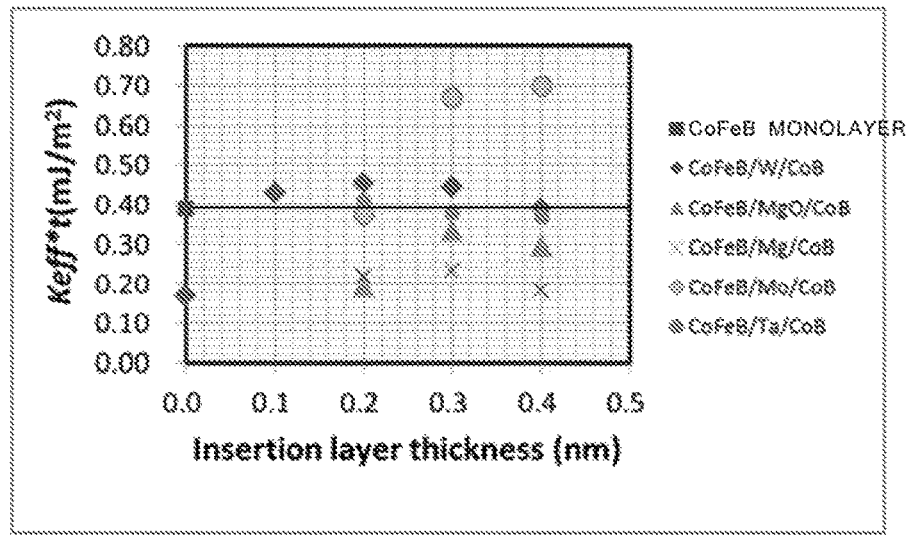
FIG. 43 shows a correlation between a product $K_{eff} t$ of an effective magnetic anisotropy energy density and a film thickness and an insertion layer film thickness t of a non-magnetic insertion layer according to metallic species constituting the non-magnetic insertion layer.

Correlations between the product $M_s t$ of the saturation magnetization and a film thickness and the insertion layer film thickness are collectively shown in FIG. 42, and correlations between the product $K_{eff} t$ of an effective magnetic anisotropy energy density and a film thickness and the insertion layer film thickness are collectively shown in FIG. 43. It should be noted that the CoFeB monolayer in the diagrams refer to a layer with a configuration of MgO/CoFeB/Ta/CoFeB/MgO (refer to NPL 6 and the like).

FIG. 42 reveals that, compared to a case where a non-magnetic insertion layer is absent, the saturation magnetization $M_s$ decreases when the non-magnetic insertion layer is W, Mo, or Ta and the saturation magnetization $M_s$ remains unchanged when the non-magnetic insertion layer is Mg or MgO.

FIG. 43 reveals that, by inserting the non-magnetic insertion layer, an effect of increasing the product $K_{eff} t$ of an effective magnetic anisotropy energy density and a film thickness is observed and perpendicular magnetic anisotropy increases in both systems. $K_{eff} t$ values in a case where the insertion layer film thickness is 0.3 nm have a descending order of Mo>W>Ta>MgO>Mg.

Upon consideration related to an increase in the thermal stability factor $\Delta$ using the non-magnetic insertion layers described above, it was found that Mo, W, Ta, Nb, and the like are preferable as a metal (a non-magnetic insertion element) used in the non-magnetic insertion layer. It was also found that non-magnetic metals including bcc (a body-centered cubic lattice structure) are suitable. In particular, high melting point metals with an atomic radius of 139 pm or larger are preferable.

(Consideration Related to Sputtering Gas During Film Formation where TMR Ratio is Also Increased in Magnetoresistance Effect Element Having High Thermal Stability Factor $\Delta$)

As described above, in a magnetoresistance effect element having a high thermal stability factor $\Delta$, a consideration related to the thermal stability factor $\Delta$ due to the Fe composition in magnetic elements of a magnetic layer and a consideration related to increasing the thermal stability factor $\Delta$ using a non-magnetic insertion layer were performed. A consideration related to sputtering gas during film formation of a non-magnetic insertion layer was performed in order to obtain a magnetoresistance effect element which has a high thermal stability factor $\Delta$ and which also has an increased tunnel magnetoresistance ratio (TMR ratio) that is one of the main properties required of an MRAM.

The tunnel magnetoresistance ratio (TMR ratio) is defined by $(R_{ap} - R_p)/R_p$ (where $R_p$ denotes a resistance value when magnetization of a reference layer adjacent to a barrier layer and magnetization of a recording layer are arranged parallel to each other, and $R_{ap}$ denotes a resistance value when the magnetization of the reference layer adjacent to the barrier layer and the magnetization of the recording layer are arranged antiparallel to each other). For example, the TMR ratio of a non-magnetic coupling layer (6) in the recording layer (A1) shown in FIG. 4 can be increased by performing an annealing treatment during manufacture so that the non-magnetic coupling layer (6) absorbs B (boron) contained in adjacent fourth and fifth magnetic layers (3a and 3b) and, consequently, promotes crystallization of the fourth and fifth magnetic layers (3a and 3b). This effect is similarly produced by the first and second non-magnetic insertion layers (7 and 8) shown in FIG. 5 and the like.

On the other hand, while the non-magnetic coupling layer (6) is formed on the fourth magnetic layer (3a) by a sputtering method, depending on sputtering conditions, the fourth magnetic layer (3a) may become damaged or elements in the non-magnetic coupling layer may diffuse into the fourth magnetic layer (3a), resulting in a drop in the TMR ratio. Details will be provided later.

Figure 44:
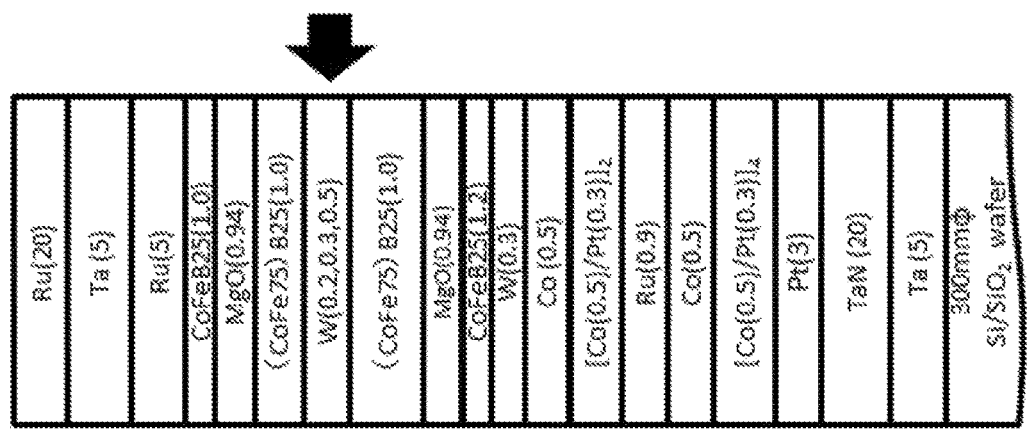
FIG. 44 shows a longitudinal section view of a configuration of a magnetoresistance effect element used in characterization by sputtering gas during film formation.

FIG. 44 shows a configuration of a magnetoresistance effect element on which characterization of a layer W (a layer indicated by an arrow in FIG. 44) inserted between CoFeB layers according to types of sputtering gas during film formation was performed.

An insertion layer film thickness of the layer W was adjusted to 0.2, 0.3, and 0.5 nm, Xe, Kr, and Ar were used as the sputtering gas, and characteristics of the respective magnetoresistance effect elements were assessed.

Figure 45:
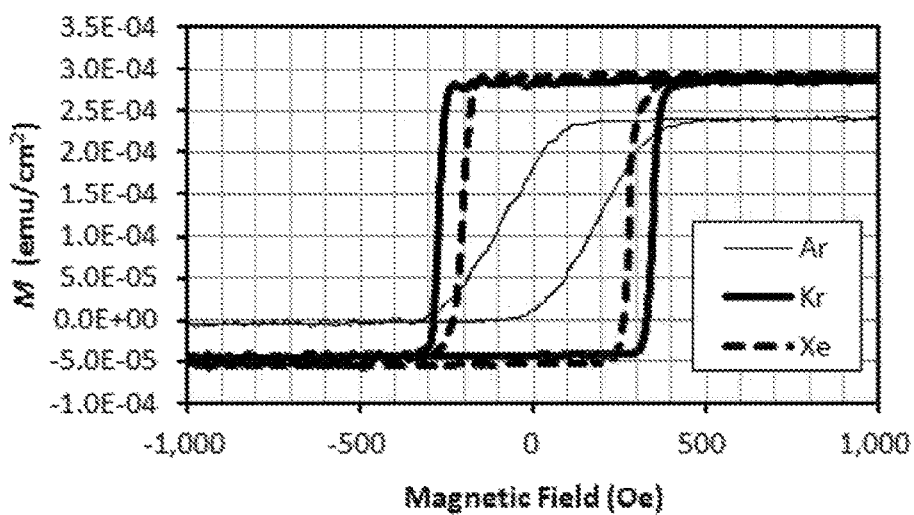
FIG. 45 shows magnetization curves when a sputtering gas is Xe, Kr, or Ar.

FIG. 45 shows magnetization curves of the magnetoresistance effect elements according to the types of sputtering gas.

Figure 46:
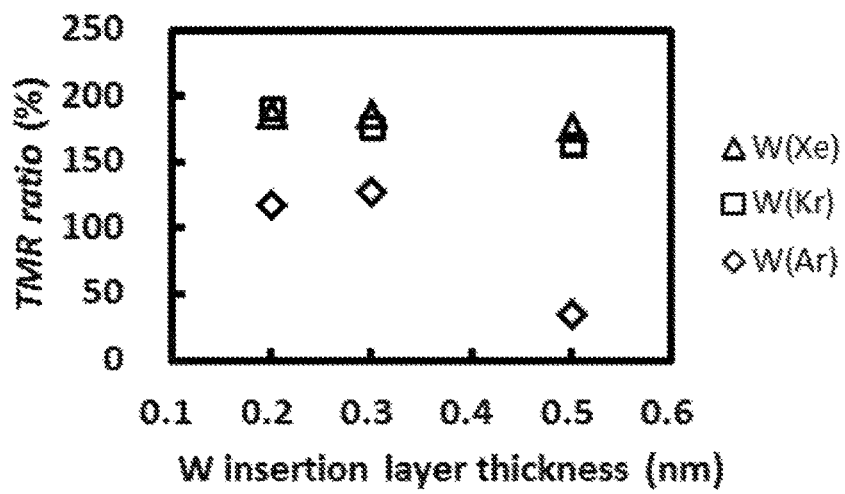
FIG. 46 shows correlations between a TMR ratio and an insertion layer film thickness when a sputtering gas is Xe, Kr, or Ar.

FIG. 46 and Table 5 show TMR ratios according to the respective W insertion layer film thicknesses and sputtering gas types.

TABLE 5

| | TMR Ratio (%) | | |
|---|---|---|---|
| W-thickness(nm) | 0.2 | 0.3 | 0.5 |
| Ar | 117.9 | 127 | 35 |
| Kr | 191.7 | 176.9 | 163.1 |
| Xe | 186.1 | 186 | 176.9 |

FIG. 46 and Table 5 reveal that the TMR ratio increases as the sputtering gas of the layer W is changed from Ar to Kr and Xe. In addition, FIG. 45 reveals that deterioration of perpendicular magnetic anisotropy is prevented by changing the sputtering gas of the layer W from Ar to Kr and Xe.

Figure 47:
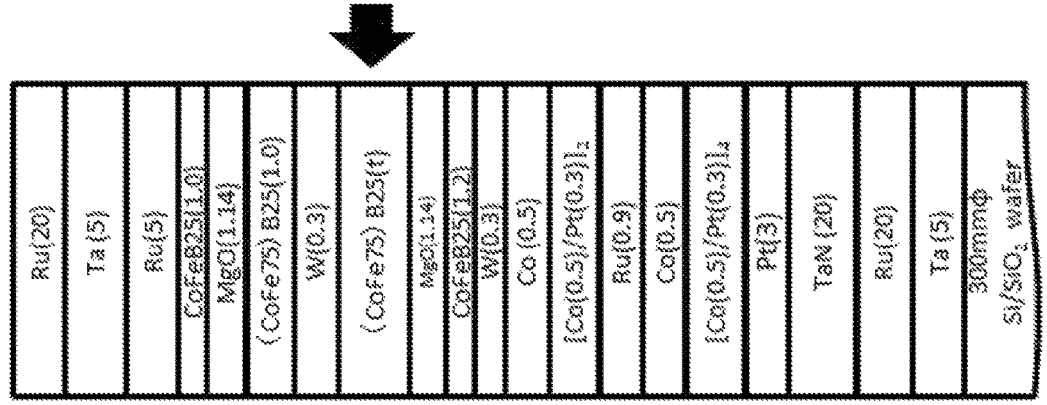
FIG. 47 shows a longitudinal section view of a configuration of a magnetoresistance effect element used in sputtering gas characterization by a film thickness of a CoFeB layer on a lower side of a non-magnetic insertion layer.

FIG. 47 shows a configuration of a magnetoresistance effect element used in a characterization of sputtering gas during film formation when an insertion layer film thickness of the non-magnetic insertion layer W inserted between CoFeB layers was made constant and a film thickness of the CoFeB layer (a layer indicated by an arrow in FIG. 47) on a lower side of the non-magnetic insertion layer was changed.

The insertion layer film thickness of the layer W was adjusted to 0.3 nm, and a film thickness of the $(Co_{25}Fe_{75})_{75}B_{25}$ layer on the lower side of the non-magnetic insertion layer was adjusted to a range of 0.6 to 1.4 nm, Xe, Kr, and Ar were used as the sputtering gas, and characteristics of the respective magnetoresistance effect elements were assessed.

Figure 48:
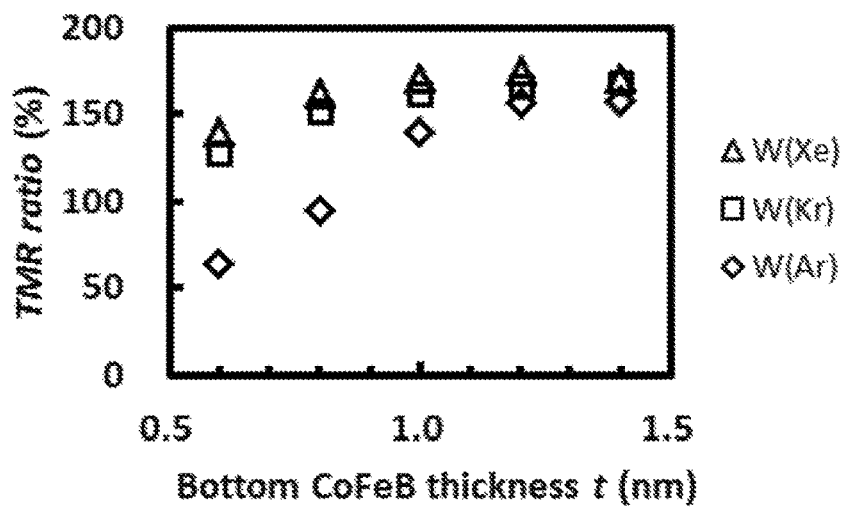
FIG. 48 shows correlations between a TMR ratio and a film thickness of a CoFeB layer on a lower side of a non-magnetic insertion layer when a sputtering gas is Xe, Kr, of Ar.

FIG. 48 and Table 6 show correlations between a TMR ratio and a film thickness of the CoFeB layer on the lower side of the non-magnetic insertion layer when a sputtering gas of the lower side is Xe, Kr, and Ar.

TABLE 6

| | TMR ratio (%) | | | | |
|---|---|---|---|---|---|
| | Bottom CoFeB thickness t (nm) | | | | |
| | 0.6 | 0.8 | 1.0 | 1.2 | 1.4 |
| Ar | 64.0 | 95.3 | 139.3 | 156.6 | 157.6 |
| Kr | 127.5 | 151.5 | 162.0 | 165.8 | 168.1 |
| Xe | 140.0 | 161.4 | 170.8 | 174.5 | 170.9 |

FIG. 48 and Table 6 reveal that the TMR ratio increases as the sputtering gas of the layer W is changed from Ar to Kr and Xe. It is also revealed that, when film formation is performed using Ar as the sputtering gas, the TMR ratio drops abruptly when the film thickness of the lower-side CoFeB layer equals or falls below 1.0 nm. W atoms sputtered on a surface of the lower-side CoFeB layer diffuses on a CoFeB/MgO interface due to recoil Ar after annealing and causes the TMR ratio to drop.

FIG. 49 is a conceptual diagram of a case where a non-magnetic insertion layer W is sputtered by Ar and Kr on a CoFeB layer of a magnetic layer. The difference in TMR ratios among types of sputtering gas is based on a magnitude of damage caused by recoil gas on the surface of the lower-side CoFeB layer in accordance with a relationship between a mass number of metal in the insertion layer to be a sputter target and a mass number of the sputtering gas.

More specifically, energy (E) of the sputtering gas that recoils from the target during sputtering is classified according to a ratio ($M_T/M_G$) of the mass number ($M_T$) of the target to the mass number ($M_G$) of the sputtering gas.

Table 7 shows elements used in sputtering gases and targets and mass numbers of the elements.

TABLE 7

| Element | Mass number |
|---|---|
| Argon (Ar) | 39.948 |
| Krypton (Kr) | 83.798 |
| Xenon (Xe) | 131.293 |
| Molybdenum (Mo) | 95.94 |
| Tantalum (Ta) | 180.9479 |
| Tungsten (W) | 183.84 |
| Niobium (Nb) | 92.90638 |

For example, when the target is W and the sputtering gas is Ar, $M_T/M_G$ is approximately 4.6 (=183.84/39.948). In addition, when the target is W and the sputtering gas is Kr, $M_T/M_G$ is approximately 2.2. The larger the value of $M_T/M_G$, the higher the energy of the recoiled sputtering gas.

Figure 49A:
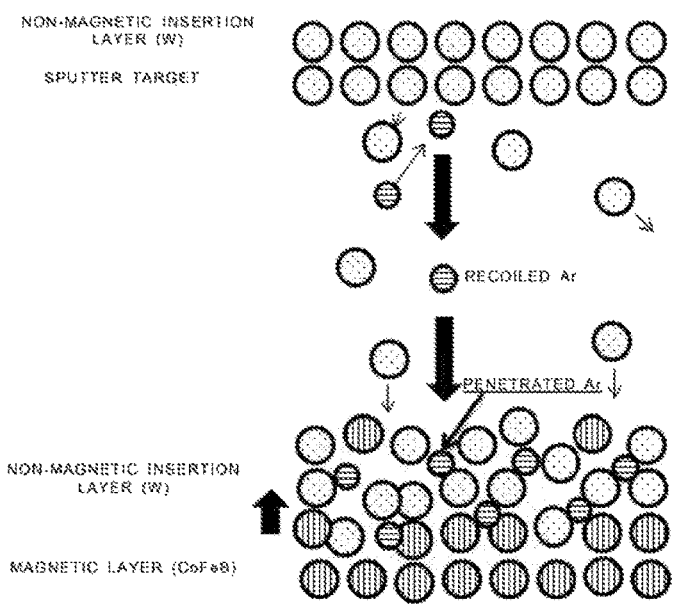
FIG. 49(a) is a conceptual diagram of a case where a non-magnetic insertion layer W is sputtered by Ar on a CoFeB layer of a magnetic layer.
Figure 49B:
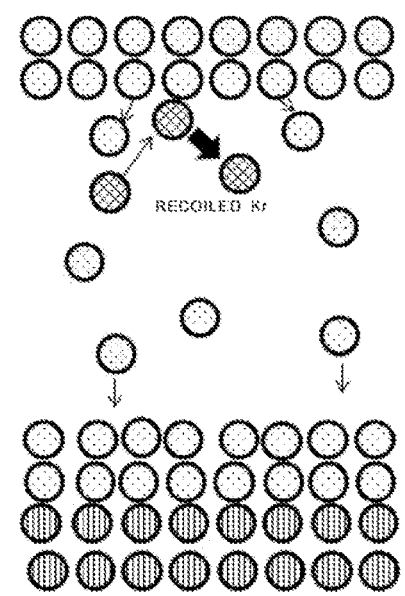
FIG. 49(b) is a conceptual diagram of a case where the non-magnetic insertion layer W is sputtered by Kr on the CoFeB layer of a magnetic layer.

Therefore, when sputtering Ar, the recoil gas having high energy penetrates into the lower-side magnetic layer CoFeB and causes damage (refer to FIG. 49(a)). On the other hand, when sputtering Kr, since the energy contained in the recoil gas is low, the lower-side magnetic layer CoFeB is less likely to sustain damage and, as a result, the TMR ratio can be increased (refer to FIG. 49(b)).

Table 8 shows ratios of the mass number of sputtering gases and the mass number of elements used in targets.

TABLE 8

| | | Sputtering gas | | |
|---|---|---|---|---|
| | | Argon (Ar) | Krypton (Kr) | Xenon (Xe) |
| Target | Molybdenum (Mo) | 2.40 | 1.14 | 0.73 |
| | Tantalum (Ta) | 4.53 | 2.16 | 1.38 |
| | Tungsten (W) | 4.60 | 2.19 | 1.40 |
| | Niobium (Nb) | 2.33 | 1.11 | 0.71 |

FIG. 46, FIG. 48, and Tables 5 to 8 reveal that a condition for suppressing damage to the lower-side magnetic layer CoFeB and obtaining a high TMR ratio is that $M_T/M_G$ is 2.2 or smaller.

Conversely, a condition for causing damage to the lower-side magnetic layer CoFeB is that $M_T/M_G$ is larger than 2.2.

Figure 5:
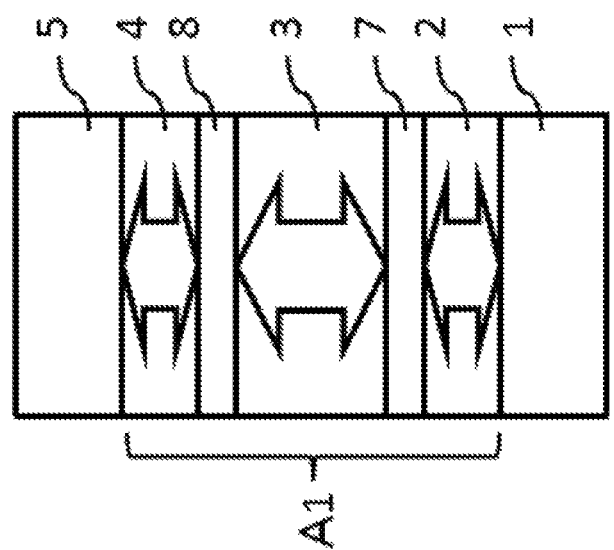
FIG. 5 is a longitudinal section view showing another example of a configuration of a magnetoresistance effect element according to the present invention.
Figure 6:
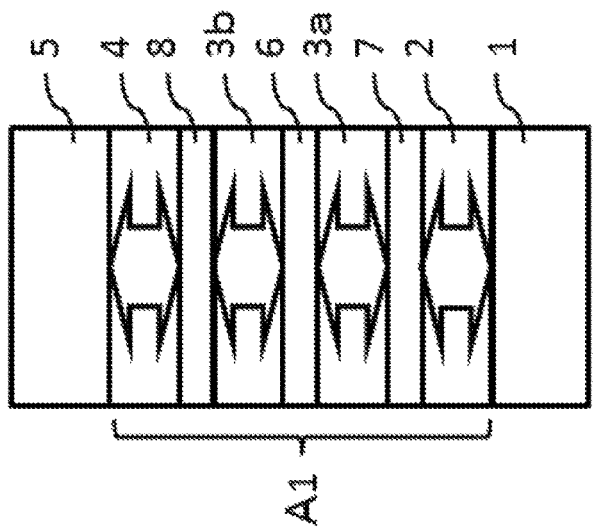
FIG. 6 is a longitudinal section view showing another example of a configuration of a magnetoresistance effect element according to the present invention.

As described above, since the first non-magnetic insertion layer (7) in FIG. 5, FIG. 6, and the like is required to suppress damage to the first magnetic layer (2) to be positioned on a lower side during sputtering and to obtain a high TMR ratio, a non-magnetic insertion element and a sputtering gas which enable $M_T/M_G$ to be 2.2 or smaller are selected. For example, when the first non-magnetic insertion layer (7) made of Mo, Ta, W, or Nb is formed by the sputtering method using Kr, Xe, or the like, recoil gas of the sputtering element such as Kr, Xe, or the like is less likely to reach the non-magnetic insertion layer (7), let alone the first magnetic layer (2) to be positioned on a lower side during sputtering, and is less likely to remain on the first magnetic layer (2) and the first non-magnetic insertion layer (7) (refer to FIG. 49(b)).

On the other hand, with the second non-magnetic insertion layer (8), the second magnetic layer (3) is to be positioned on a lower side during sputtering. The second magnetic layer (3) is arranged for the purpose of reducing the saturation magnetization $M_s$ in the consideration described earlier and, rather, the second magnetic layer (3) is prioritized to cause damage by recoil gas and further reduce the saturation magnetization $M_s$. Therefore, a non-magnetic insertion element and a sputtering gas which cause $M_T/M_G$ to exceed 2.2 are selected. For example, when the second non-magnetic insertion layer (8) made of Mo, Ta, W, or Nb is formed by the sputtering method using Ar or the like, recoil gas of the sputtering element such as Ar or the like is likely to penetrate into the second non-magnetic insertion layer (8) and the second magnetic layer (3) to be positioned on a lower side during sputtering, and is likely to remain on the second magnetic layer (3) and the second non-magnetic insertion layer (8) (refer to FIG. 49(a)).

EMBODIMENTS

While embodiments of the present invention will be described in detail hereinafter with reference to the drawings, it is to be understood that the present invention is not limited to the embodiments in any way whatsoever.

First Embodiment

FIG. 1 shows an example of the magnetoresistance effect element according to the present invention in which a recording layer includes two magnetic layers and one of the magnetic layers is provided adjacent to a non-magnetic layer.

The first embodiment includes: a first magnetic layer (2) of which a magnetization direction is a direction perpendicular to a film surface; a first non-magnetic layer (1) which is provided adjacent to the first magnetic layer (2); and a second magnetic layer (3) which is provided adjacent to the first magnetic layer (2) on an opposite side to the first non-magnetic layer (1) and of which a magnetization direction is a direction perpendicular to a film surface.

As shown in FIG. 1, the first magnetic layer (2) is provided between the first non-magnetic layer (1) and the second magnetic layer (3).

The magnetization direction of the first magnetic layer (2) is a perpendicular direction with respect to the film surface due to interfacial perpendicular magnetic anisotropy at an interface with the first non-magnetic layer (1). In addition, an interfacial magnetic anisotropy energy density ($K_i$) of the interface between the first non-magnetic layer (1) and the first magnetic layer (2) is configured so as to be higher than the interfacial magnetic anisotropy energy density ($K_i$) of an interface created in a case where the first non-magnetic layer (1) and the second magnetic layer (3) are to be joined together. The interfacial magnetic anisotropy energy density ($K_i$) is adjusted by compositions and the like of the first magnetic layer (2) and the second magnetic layer (3) to be described later.

The first magnetic layer (2) includes at least Fe, and an Fe composition in the first magnetic layer (2) is 50 at % or higher with respect to a sum total of atomic fractions of magnetic elements in the first magnetic layer (2), preferably 60 at % or higher, and more preferably ranges from 60 to 90 at %. This is because, when the Fe composition is 50 at % or higher, a high interfacial magnetic anisotropy energy density ($K_i$) can be obtained, but when the Fe composition is lower than 50 at %, a high interfacial magnetic anisotropy energy density ($K_i$) cannot be obtained (refer to FIG. 25 and the like).

A saturation magnetization ($M_s$) of the second magnetic layer (3) is configured so as to be lower than the saturation magnetization ($M_s$) of the first magnetic layer (2). The saturation magnetization ($M_s$) is adjusted by compositions and the like of the first magnetic layer (2) and the second magnetic layer (3).

The second magnetic layer (3) includes at least one 3d ferromagnetic transition metal element such as Co, Fe, Ni, or Mn, an Fe composition in the second magnetic layer (3) is 50 at % or lower with respect to a sum total of atomic fractions of magnetic elements in the second magnetic layer (3), and preferably 40 at % or lower. This is because, when the Fe composition is 50 at % or lower, the saturation magnetization ($M_s$) can be reduced, but when the Fe composition exceeds 50 at %, the saturation magnetization ($M_s$) increases (refer to FIG. 27 and the like).

The first magnetic layer (2) may further include, besides Fe, a 3d ferromagnetic transition metal element such as Co, Ni, or Mn as a magnetic element.

The second magnetic layer (3) may further include a non-magnetic element such as V, Ti, Cr, Zr, Nb, Mo, Hf, Ta, W, Si, Al, B, Pd, or Pt. Among these non-magnetic elements, B and V are preferable also from the perspective of handleability. These non-magnetic elements are capable of reducing the saturation magnetization ($M_s$) of a magnetic layer.

The first magnetic layer (2) may also further include a non-magnetic element such as V, Ti, Cr, Zr, Nb, Mo, Hf, Ta, W, Si, Al, B, Pd, or Pt. Among these non-magnetic elements, B and V are preferable.

It should be noted that a ratio of an amount of the non-magnetic element composition such as V, Ti, Cr, Zr, Nb, Mo, Hf, Ta, W, Si, Al, B, Pd, or Pt in the first magnetic layer (2) to an amount of the non-magnetic element composition such as V, Ti, Cr, Zr, Nb, Mo, Hf, Ta, W, Si, Al, B, Pd, or Pt in the second magnetic layer (3) can be set smaller than 1. This is because adjusting a ratio of the non-magnetic element such as V, Ti, Cr, Zr, Nb, Mo, Hf, Ta, W, Si, Al, B, Pd, or Pt of the magnetic layers which is known to contribute toward reducing the saturation magnetization ($M_s$) causes the saturation magnetization ($M_s$) of the second magnetic layer (3) to be lower than the saturation magnetization ($M_s$) of the first magnetic layer (2) and enables the saturation magnetization ($M_s$) of the magnetic layers as a whole to be reduced, and combined with adjusting the Fe composition in the magnetic elements of the magnetic layers, enables the saturation magnetization ($M_s$) to be further reduced.

A ratio of a film thickness of the second magnetic layer (3) to a film thickness of the first magnetic layer (2) is preferably 1 or larger or, in other words, the film thickness of the second magnetic layer (3) is preferably larger than the film thickness of the first magnetic layer (2). This is because, while the Fe composition in the second magnetic layer (3) is 50 at % or lower and preferably 40 at % or lower with respect to a sum total of atomic fractions of magnetic elements in order to obtain a low saturation magnetization ($M_s$), the Fe composition in the first magnetic layer (2) which contributes to interfacial magnetic anisotropy at an interface with the first non-magnetic layer (1) is 50 at % or higher with respect to a sum total of atomic fractions of magnetic elements, and it is desirable to make the second magnetic layer (3) relatively thick and obtain a low saturation magnetization ($M_s$) with respect to the recording layer as a whole.

Specifically, the film thickness of the first magnetic layer (2) is adjusted to a range of 0.2 to 1.0 nm, and the film thickness of the second magnetic layer (3) is adjusted to a range of 0.4 to 5.0 nm.

When the first non-magnetic layer (1) is to constitute a barrier layer (a tunnel junction layer made of an insulating layer) of the magnetoresistance effect element, an insulating material containing oxygen such as MgO, $Al_2O_3$, $SiO_2$, TiO, or $Hf_2O$ is used as the material of the first non-magnetic layer (1) so that a combination of materials of two joined end faces produces a large rate of change of magnetoresistance and, preferably, MgO is used.

Film thicknesses of the first non-magnetic layer (1) and the second non-magnetic layer (5) are adjusted to a range of 0.1 to 1.0 nm and preferably to a range of 0.2 to 0.5 nm.

Specific examples of the first embodiment include the first non-magnetic layer (1)/the first magnetic layer (2)/the second magnetic layer (3) being MgO/$(Co_aFe_bM_{100-a-b})_c N_{100-c}$/$(Co_dFe_eM_{100-d-e})_fN_{100-f}$ (where M denotes a magnetic element other than Co and Fe, N denotes a non-magnetic element, $0 \le a \le 50$, $50 \le b \le 100$, $30 \le c \le 100$, $0 \le d \le 100$, $0 \le e \le 50$, and $30 \le f \le 100$), and more specifically, examples include MgO/$Co_{25}Fe_{75}$/$Co_{50}Fe_{50}$, MgO/$Co_{25}Fe_{75}$/$(Co_{50}Fe_{50})_{75}B_{25}$, MgO/$(Co_{25}Fe_{75})_{80}B_{20}$/$(Co_{60}Fe_{40})_{75}B_{25}$, MgO/$Co_{20}Fe_{75}Ni_5$/$Co_{15}Fe_{40}Ni_{45}$, and MgO/$Co_{20}Fe_{75}Ni_5$/$(Co_{50}Fe_{45}Ni_5)_{75}B_{25}$.

In the first embodiment shown in FIG. 1, when the reference layer is adjacent to the first non-magnetic layer (1) on an opposite side to the first magnetic layer (2), the first non-magnetic layer (1) is to constitute the barrier layer and the first magnetic layer (2) and the second magnetic layer (3) are to constitute a part of the recording layer in a basic structure of the magnetoresistance effect element.

Second Embodiment

Figure 2:
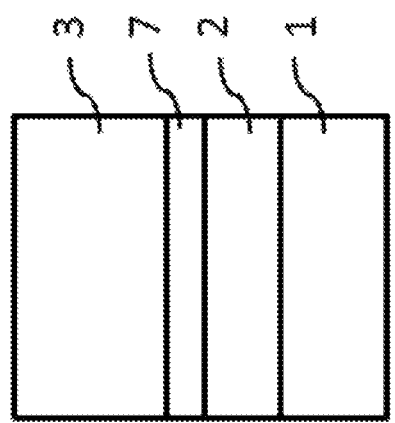
FIG. 2 is a longitudinal section view showing another example of a configuration of a magnetoresistance effect element according to the present invention.

FIG. 2 shows an example of the magnetoresistance effect element according to the present invention in which a non-magnetic insertion layer is inserted between two magnetic layers.

The second embodiment further includes the first non-magnetic insertion layer (7) in addition to the first embodiment.

As shown in FIG. 2, the first non-magnetic layer (1), the first magnetic layer (2), the first non-magnetic insertion layer (7), and the second magnetic layer (3) are stacked in this order.

Details of the second embodiment are similar to those of the first embodiment with the exception of the description given below.

The first non-magnetic insertion layer (7) is inserted for the purpose of preventing mutual diffusion of constituent elements of the first magnetic layer (2) and the second magnetic layer (3), and the second non-magnetic insertion layer (8) is inserted for the purpose of preventing mutual diffusion of constituent elements of the second magnetic layer (3) and the third magnetic layer (4). Although any material (a non-magnetic insertion element) which prevents mutual diffusion can be used without limitation, the material is preferably Mo, W, Ta, Nb, or the like, more preferably a non-magnetic metal including bcc, and even more preferably a material with an atomic radius of 139 pm or larger.

An insertion layer film thickness of the first and second non-magnetic insertion layers (7 and 8) ranges from 0.1 to 0.5 nm. This is because, when the insertion layer film thickness is larger than 0.5 nm, magnetic coupling between the first magnetic layer (2) and the second magnetic layer (3) and magnetic coupling between the second magnetic layer (3) and the third magnetic layer (4) weaken and thermal stability declines.

The first non-magnetic insertion layer (7) is preferably formed by a sputtering method using a first sputtering gas.

A ratio (a first $M_T/M_G$ ratio) of a mass number ($M_T$) of the metal of the first non-magnetic insertion layer (7) to a mass number ($M_G$) of the first sputtering gas is selected so as to be equal to or smaller than 2.2. For example, when the non-magnetic insertion element is Mo, W, Ta, or Nb, Xe, Kr, or the like is selected as the sputtering gas.

Specific examples of the second embodiment include the first non-magnetic layer (1)/the first magnetic layer (2)/the first non-magnetic insertion layer (7)/the second magnetic layer (3) being $MgO/(Co_aFe_bM_{100-a-b})_cN_{100-c}/NI/(Co_d\text{-}Fe_eM_{100-d-e})_fN_{100-f}$ (where M denotes a magnetic element other than Co and Fe, N denotes a non-magnetic element, NI denotes a non-magnetic insertion element, $0 \le a \le 50$, $50 \le b \le 100$, $30 \le c \le 100$, $0 \le d \le 100$, $0 \le e \le 50$, and $30 \le f \le 100$), and more specifically, examples include $MgO/Co_{25}Fe_{75}/W/Co_{50}Fe_{50}$, $MgO/Co_{25}Fe_{75}/Ta/(Co_{50}Fe_{50})_{75}B_{25}$, $MgO/(Co_{25}Fe_{75})_{80}B_{20}/Nb/(Co_{60}Fe_{40})_{75}B_{25}$, $MgO/Co_{20}Fe_{75}Ni_5/W/Co_{15}Fe_{40}Ni_{45}$, and $MgO/Co_{20}Fe_{75}Ni_5/Mo/(Co_{50}Fe_{45}Ni_5)_{75}B_{25}$.

In the second embodiment shown in FIG. 2, when the reference layer is adjacent to the first non-magnetic layer (1) on an opposite side to the first magnetic layer (2), the first non-magnetic layer (1) is to constitute the barrier layer and the first magnetic layer (2)/the first non-magnetic insertion layer (7)/the second magnetic layer (3) are to constitute a part of the recording layer in a basic structure of the magnetoresistance effect element.

Third Embodiment

Figure 3:
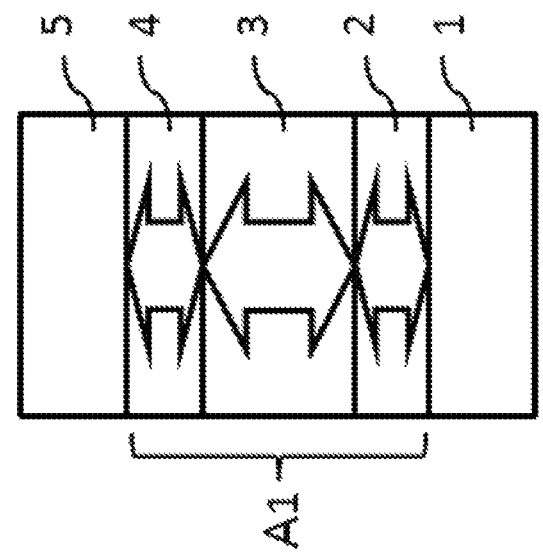
FIG. 3 is a longitudinal section view showing another example of a configuration of a magnetoresistance effect element according to the present invention.

FIG. 3 shows an example of the magnetoresistance effect element according to the present invention in which a recording layer is sandwiched by two non-magnetic layers.

The third embodiment includes, in addition to the first embodiment: a third magnetic layer (4) which is provided adjacent to the second magnetic layer (3) on an opposite side to the first magnetic layer (2) and of which a magnetization direction is a direction perpendicular to a film surface; and a second non-magnetic layer (5) which is provided adjacent to the third magnetic layer (4) on an opposite side to the second magnetic layer (3).

As shown in FIG. 3, the first magnetic layer (2), the second magnetic layer (3), and the third magnetic layer (4) are configured as the first recording layer (A1), and the first recording layer (A1) is configured so as to be sandwiched between the first non-magnetic layer (1) and the second non-magnetic layer (5).

Details of the third embodiment are similar to those of the first embodiment with the exception of the description given below.

The magnetization direction of the third magnetic layer (4) is a perpendicular direction with respect to the film surface due to interfacial perpendicular magnetic anisotropy at an interface with the second non-magnetic layer (5). In addition, an interfacial magnetic anisotropy energy density ($K_i$) of the interface between the second non-magnetic layer (5) and the third magnetic layer (4) is configured so as to be higher than the interfacial magnetic anisotropy energy density ($K_i$) of an interface created in a case where the second non-magnetic layer (5) and the second magnetic layer (3) are to be joined together. The interfacial magnetic anisotropy energy density ($K_i$) is adjusted by compositions and the like of the third magnetic layer (4) and the second magnetic layer (3) to be described later.

The third magnetic layer (4) includes at least Fe, and an Fe composition in the third magnetic layer (4) is 50 at % or higher with respect to a sum total of atomic fractions of magnetic elements in the third magnetic layer (4), preferably 60 at % or higher, and more preferably ranges from 60 to 90 at %. This is because, when the Fe composition is 50 at % or higher, a high interfacial magnetic anisotropy energy density ($K_i$) can be obtained, but when the Fe composition is lower than 50 at %, a high interfacial magnetic anisotropy energy density ($K_i$) cannot be obtained (refer to FIG. 25 and the like).

A saturation magnetization ($M_s$) of the second magnetic layer (3) is configured so as to be lower than the saturation magnetization ($M_s$) of the third magnetic layer (4). The saturation magnetization ($M_s$) is adjusted by compositions and the like of the third magnetic layer (4) and the second magnetic layer (3).

The third magnetic layer (4) may further include, besides Fe, a 3d ferromagnetic transition metal element such as Co, Ni, or Mn as a magnetic element.

The second magnetic layer (3) may further include a non-magnetic element such as V, Ti, Cr, Zr, Nb, Mo, Hf, Ta, W, Si, Al, B, Pd, or Pt. Among these non-magnetic elements, B and V are preferable also from the perspective of handleability. These non-magnetic elements are capable of reducing the saturation magnetization ($M_s$) of a magnetic layer.

The third magnetic layer (4) may also further include a non-magnetic element such as V, Ti, Cr, Zr, Nb, Mo, Hf, Ta, W, Si, Al, B, Pd, or Pt. Among these non-magnetic elements, B and V are preferable also from the perspective of handleability.

It should be noted that a ratio of an amount of the non-magnetic element composition such as V, Ti, Cr, Zr, Nb, Mo, Hf, Ta, W, Si, Al, B, Pd, or Pt in the third magnetic layer (4) to an amount of the non-magnetic element composition such as V, Ti, Cr, Zr, Nb, Mo, Hf, Ta, W, Si, Al, B, Pd, or Pt in the second magnetic layer (3) can be set smaller than 1. This is because adjusting a ratio of the non-magnetic element such as V, Ti, Cr, Zr, Nb, Mo, Hf, Ta, W, Si, Al, B, Pd, or Pt of the magnetic layers which is known to contribute toward reducing the saturation magnetization ($M_s$) causes the saturation magnetization ($M_s$) of the second magnetic layer (3) to be lower than the saturation magnetization ($M_s$) of the third magnetic layer (4) and enables the saturation magnetization ($M_s$) of the magnetic layers as a whole to be reduced, and combined with adjusting the Fe composition in the magnetic elements of the magnetic layers, enables the saturation magnetization ($M_s$) to be further reduced.

A ratio of a film thickness of the second magnetic layer (3) to a film thickness of the third magnetic layer (4) is preferably 1 or larger or, in other words, the film thickness of the second magnetic layer (3) is preferably larger than the film thickness of the third magnetic layer (4). This is because, while the Fe composition in the second magnetic layer (3) is 50 at % or lower with respect to a sum total of atomic fractions of magnetic elements in order to obtain a low saturation magnetization ($M_s$), the Fe composition in the third magnetic layer (4) which contributes to interfacial magnetic anisotropy at an interface with the second non-magnetic layer (5) is 50 at % or higher with respect to a sum total of atomic fractions of magnetic elements, and it is desirable to make the second magnetic layer (3) relatively thick and obtain a low saturation magnetization ($M_s$) with respect to the recording layer as a whole.

Specifically, the film thickness of the third magnetic layer (4) is adjusted to a range of 0.2 to 1.0 nm, and the film thickness of the second magnetic layer (3) is adjusted to a range of 0.4 to 5.0 nm.

Specific examples of the third embodiment include the first non-magnetic layer (1)/the first magnetic layer (2)/the second magnetic layer (3)/the third magnetic layer (4)/the second non-magnetic layer (5) being MgO/(Co$_a$Fe$_b$M$_{100-a-b}$)$_c$N$_{100-c}$/(Co$_d$Fe$_e$M$_{100-d-e}$)$_f$N$_{100-f}$/(Co$_g$Fe$_h$M$_{100-g-h}$)$_i$N$_{100-i}$/MgO (where M denotes a magnetic element other than Co and Fe, N denotes a non-magnetic element, 0≤a≤50, 50≤b≤100, 30≤c≤100, 0≤d≤100, 0≤e≤50, 30≤f≤100, 0≤g≤50, 50≤h≤100, and 30≤i≤100), and more specifically, examples include MgO/Co$_{25}$Fe$_{75}$/Co$_{50}$Fe$_{50}$/Co$_2$Fe$_{75}$/MgO, MgO/Co$_{25}$Fe$_{75}$/(Co$_{50}$Fe$_{50}$)$_{75}$B$_{25}$/Co$_{25}$Fe$_{75}$/MgO, MgO/(Co$_{25}$Fe$_{75}$)$_{80}$B$_{20}$/(Co$_{60}$Fe$_{40}$)$_{75}$B$_{25}$/(Co$_{25}$Fe$_{75}$)$_{80}$B$_{20}$/MgO, MgO/Co$_{20}$Fe$_{75}$Ni$_5$/Co$_{50}$Fe$_{40}$Ni$_{45}$/Co$_{20}$Fe$_{75}$Ni$_5$/MgO, MgO/Co$_{20}$Fe$_{75}$Ni$_5$/(Co$_{50}$Fe$_{45}$Ni$_5$)$_{75}$B$_{25}$/Co$_{20}$Fe$_{75}$Ni$_5$/MgO, and MgO/Co$_{25}$Fe$_{75}$/(Co$_{50}$Fe$_{45}$Ni$_5$)$_{75}$B$_{25}$/(Co$_{25}$Fe$_{75}$)$_{80}$B$_{20}$/MgO.

In the third embodiment shown in FIG. 3, when the reference layer is adjacent to the first non-magnetic layer (1) on an opposite side to the first magnetic layer (2), the first non-magnetic layer (1) is to constitute the barrier layer in a basic structure of the magnetoresistance effect element, and when another reference layer is adjacent to the second non-magnetic layer (5) on an opposite side to the third magnetic layer (4), the second non-magnetic layer (5) is to constitute the barrier layer. The first magnetic layer (2)/the second magnetic layer (3)/the third magnetic layer (4) constitute the recording layer.

Fourth Embodiment

Figure 4:
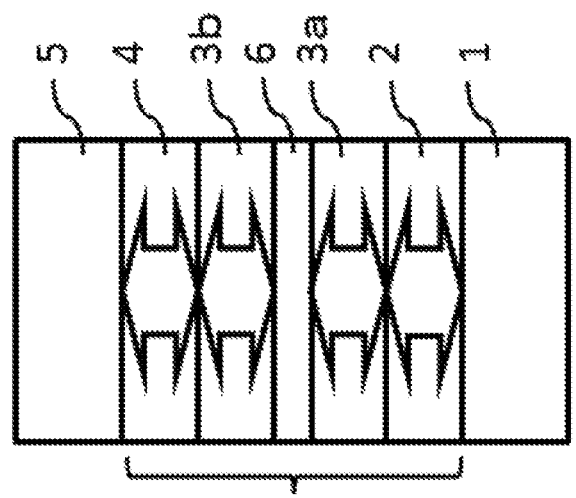
FIG. 4 is a longitudinal section view showing another example of a configuration of a magnetoresistance effect element according to the present invention.

FIG. 4 shows an example of the magnetoresistance effect element according to the present invention in which an extremely thin non-magnetic coupling layer is sandwiched by magnetic layers of the recording layer.

As shown in FIG. 4, the fourth embodiment is structured such that the second magnetic layer (3) according to the third embodiment is replaced by fourth and fifth magnetic layers (3a and 3b) and a non-magnetic coupling layer (6) is included between and adjacent to the fourth and fifth magnetic layers (3a and 3b).

Details of the fourth embodiment are similar to those of the third embodiment with the exception of the description given below.

In a similar manner to the second magnetic layer (3) according to the third embodiment, the fourth and fifth magnetic layers (3a and 3b) include at least one 3d ferromagnetic transition metal element such as Co, Fe, Ni, or Mn, an Fe composition in the fourth and fifth magnetic layers (3a and 3b) is 50 at % or lower with respect to a sum total of atomic fractions of magnetic elements in the fourth and fifth magnetic layers (3a and 3b), and preferably 40 at % or lower. This is because, when the Fe composition is 50 at % or lower, the saturation magnetization ($M_s$) can be reduced, but when the Fe composition exceeds 50 at %, the saturation magnetization ($M_s$) increases (refer to FIG. 27 and the like).

In a similar manner to the second magnetic layer (3) according to the third embodiment, a saturation magnetization ($M_s$) of the fourth magnetic layer (3a) is configured so as to be lower than the saturation magnetization ($M_s$) of the first magnetic layer (2). In addition, a saturation magnetization ($M_s$) of the fifth magnetic layer (3b) is configured so as to be lower than the saturation magnetization ($M_s$) of the third magnetic layer (4). The saturation magnetization ($M_s$) is adjusted by compositions and the like of the first magnetic layer (2), the fourth and fifth magnetic layers (3a and 3b), and the third magnetic layer (4).

In a similar manner to the second magnetic layer (3) according to the third embodiment, the fourth and fifth magnetic layers (3a and 3b) may further include a non-magnetic element such as V, Ti, Cr, Zr, Nb, Mo, Hf, Ta, W, Si, Al, B, Pd, or Pt. Among these non-magnetic elements, B and V are preferable also from the perspective of handleability. These non-magnetic elements are capable of reducing the saturation magnetization ($M_s$) of a magnetic layer.

The first magnetic layer (2) or the third magnetic layer (4) may also further include a non-magnetic element such as V, Ti, Cr, Zr, Nb, Mo, Hf, Ta, W, Si, Al, B, Pd, or Pt. Among these non-magnetic elements, B and V are preferable also from the perspective of handleability.

It should be noted that a ratio of an amount of the non-magnetic element composition such as V, Ti, Cr, Zr, Nb, Mo, Hf, Ta, W, Si, Al, B, Pd, or Pt in the first magnetic layer (2) to an amount of the non-magnetic element composition such as V, Ti, Cr, Zr, Nb, Mo, Hf, Ta, W, Si, Al, B, Pd, or Pt in the fourth magnetic layer (3a) can be set smaller than 1. In addition, a ratio of an amount of the non-magnetic element composition such as V, Ti, Cr, Zr, Nb, Mo, Hf, Ta, W, Si, Al, B, Pd, or Pt in the third magnetic layer (4) to an amount of the non-magnetic element composition such as V, Ti, Cr, Zr, Nb, Mo, Hf, Ta, W, Si, Al, B, Pd, or Pt in the fifth magnetic layer (3b) can be set smaller than 1. This is because adjusting a ratio of the non-magnetic element such as V, Ti, Cr, Zr, Nb, Mo, Hf, Ta, W, Si, Al, B, Pd, or Pt of the magnetic layers which is known to contribute toward reducing the saturation magnetization ($M_s$) causes the saturation magnetization ($M_s$) of the fourth and fifth magnetic layers (3a and 3b) to be lower than the saturation magnetization ($M_s$) of the first magnetic layer (2) and the third magnetic layer (4) and, combined with adjusting the Fe composition in the magnetic elements of the magnetic layers, enables the saturation magnetization ($M_s$) to be further reduced.

The non-magnetic coupling layer (6) may further include a non-magnetic element such as V, Ti, Cr, Zr, Nb, Mo, Hf, Ta, W, Si, Al, B, Pd, or Pt, and W or Ta is more preferable.

A film thickness of the non-magnetic coupling layer (6) which is sandwiched between the fourth and fifth magnetic layers (3a and 3b) desirably ranges from 0.1 to 1 nm and more preferably ranges from 0.3 to 1 nm. Since the non-magnetic coupling layer (6) acts as a receiving region of diffusion of a non-magnetic element such as B, the non-magnetic coupling layer (6) functions to control a concentration of the non-magnetic element such as B contained in the fourth and fifth magnetic layers (3a and 3b). The control described above becomes less effective when the film thickness of the non-magnetic coupling layer (6) exceeds 1 nm.

A ratio of a sum total of film thicknesses of the fourth and fifth magnetic layers (3a and 3b) to a film thickness of the first magnetic layer (2) is preferably 1 or larger and, at the same time, a ratio of the sum total of the film thicknesses of the fourth and fifth magnetic layers (3a and 3b) to a film thickness of the third magnetic layer (4) is preferably 1 or larger or, in other words, the sum total of the film thicknesses of the fourth and fifth magnetic layers (3a and 3b) is preferably larger than the film thickness of the first magnetic layer (2) and the film thickness of the third magnetic layer (4). This is because, while the Fe composition in the fourth and fifth magnetic layers (3a and 3b) is 50 at % or lower with respect to a sum total of atomic fractions of magnetic elements in order to obtain a low saturation magnetization ($M_s$), the Fe composition in the first magnetic layer (2) which contributes to interfacial magnetic anisotropy at an interface with the first non-magnetic layer (1) and the Fe composition in the third magnetic layer (4) which contributes to interfacial magnetic anisotropy at an interface with the second non-magnetic layer (5) are 50 at % or higher with respect to a sum total of atomic fractions of magnetic elements, and it is desirable to make the fourth and fifth magnetic layers (3a and 3b) relatively thick and obtain a low saturation magnetization ($M_s$) with respect to the recording layer as a whole. It should be noted that the saturation magnetization ($M_s$) of the magnetic layers of the recording layer is correlated to a sum total of film thicknesses even when the magnetic layers are divided by a non-magnetic layer.

Specifically, the film thickness of the first magnetic layer (2) and the film thickness of the third magnetic layer (4) are adjusted to a range of 0.2 to 1.0 nm, and the sum total of the film thicknesses of the fourth and fifth magnetic layers (3a and 3b) is adjusted to a range of 0.4 to 5.0 nm.

Specific examples of the fourth embodiment include the first non-magnetic layer (1)/the first magnetic layer (2)/the fourth magnetic layer (3a)/the non-magnetic coupling layer (6)/the fifth magnetic layer (3b)/the third magnetic layer (4)/the second non-magnetic layer (5) being $MgO/(Co_aFe_bM_{100-a-b})_cN_{100-c}/(Co_dFe_eM_{100-d-e})_fN_{100-f}/(Co_dFe_eM_{100-d-e})_fN_{100-f}/(Co_gFe_hM_{100-g-h})_iN_{100-i}/MgO$ (where M denotes a magnetic element other than Co and Fe, N denotes a non-magnetic element, $0 \le a \le 50$, $50 \le b \le 100$, $30 \le c \le 100$, $0 \le d \le 100$, $0 \le e \le 50$, $30 \le f \le 100$, $0 \le g \le 50$, $50 \le h \le 100$, and $30 \le i \le 100$), and more specifically, examples include $MgO/Co_{25}Fe_{75}/Co_{50}Fe_{50}/W/Co_{50}Fe_{50}/W/Co_{25}Fe_{75}/MgO$, $MgO/Co_{25}Fe_{75}/(Co_{50}Fe_{50})_{75}B_{25}/Ta/(Co_{50}Fe_{50})_{75}B_{25}/Co_{25}Fe_{75}/MgO$, $MgO/(Co_{25}Fe_{75})_{80}B_{20}/(Co_{60}Fe_{40})_{75}B_{25}/W/(Co_{60}Fe_{40})_{75}B_{25}/(Co_{25}Fe_{75})_{80}B_{20}/MgO$, $MgO/Co_{20}Fe_{75}Ni_5/Co_{50}Fe_{40}Ni_{45}/Ta/Co_{15}Fe_{40}Ni_{45}/Co_{20}Fe_{75}Ni_5/MgO$, $MgO/Co_{20}Fe_{75}Ni_5/(Co_{50}Fe_{45}Ni_5)_{75}B_{25}/W/(Co_{50}Fe_{45}Ni_5)_{75}B_{25}/Co_{20}Fe_{75}Ni_5/MgO$, and $MgO/Co_{25}Fe_{75}/(Co_{50}Fe_{45}Ni_5)_{75}B_{25}/Ta/(Co_{50}Fe_{45}Ni_5)_{75}B_{25}/(Co_{25}Fe_{75})_{80}B_{20}/MgO$.

In the fourth embodiment shown in FIG. 4, when the reference layer is adjacent to the first non-magnetic layer (1) on an opposite side to the first magnetic layer (2), the first non-magnetic layer (1) is to constitute the barrier layer in a basic structure of the magnetoresistance effect element, and when another reference layer is adjacent to the second non-magnetic layer (5) on an opposite side to the third magnetic layer (4), the second non-magnetic layer (5) is to constitute the barrier layer. The first magnetic layer (2)/the fourth magnetic layer (3a)/the non-magnetic coupling layer (6)/the fifth magnetic layer (3b)/the third magnetic layer (4) constitute the recording layer.

Fifth Embodiment

FIG. 5 shows an example of the magnetoresistance effect element according to the present invention in which non-magnetic insertion layers are inserted at two locations among three magnetic layers.

The fifth embodiment further includes the first non-magnetic insertion layer (7) and the second non-magnetic insertion layer (8) in addition to the third embodiment.

As shown in FIG. 5, the first non-magnetic layer (1), the first magnetic layer (2), the first non-magnetic insertion layer (7), the second magnetic layer (3), the second non-magnetic insertion layer (8), the third magnetic layer (4), and the second non-magnetic layer (5) are stacked in this order.

Details of the fifth embodiment are similar to those of the third embodiment with the exception of the description given below.

The first non-magnetic insertion layer (7) is inserted for the purpose of preventing mutual diffusion of constituent elements of the first magnetic layer (2) and the second magnetic layer (3), and the second non-magnetic insertion layer (8) is inserted for the purpose of preventing mutual diffusion of constituent elements of the second magnetic layer (3) and the third magnetic layer (4). Although any material (a non-magnetic insertion element) which prevents mutual diffusion can be used without limitation, the material is preferably Mo, W, Ta, Nb, or the like, more preferably a non-magnetic metal including bcc, and even more preferably a material with an atomic radius of 139 pm or larger.

An insertion layer film thickness of the first and second non-magnetic insertion layers (7 and 8) ranges from 0.1 to 0.5 nm. This is because, when the insertion layer film thickness is larger than 0.5 nm, magnetic coupling between the first magnetic layer (2) and the second magnetic layer (3) and magnetic coupling between the second magnetic layer (3) and the third magnetic layer (4) weaken and thermal stability declines.

The first and second non-magnetic insertion layers (7 and 8) are preferably formed by a sputtering method using first and second sputtering gases.

A ratio (a first $M_T/M_G$ ratio) of a mass number ($M_T$) of the metal of the first non-magnetic insertion layer (7) to a mass number ($M_G$) of the first sputtering gas is selected so as to be equal to or smaller than 2.2. For example, when the non-magnetic insertion element is Mo, W, Ta, or Nb, Xe, Kr, or the like is selected as the sputtering gas.

A ratio (a second $M_T/M_G$ ratio) of a mass number ($M_T$) of the metal of the second non-magnetic insertion layer (8) to a mass number ($M_G$) of the second sputtering gas is selected so as to be larger than 2.2. For example, when the non-magnetic insertion element is Mo, W, Ta, or Nb, Ar, or the like is selected as the sputtering gas.

Specific examples of the fifth embodiment include the first non-magnetic layer (1)/the first magnetic layer (2)/the first non-magnetic insertion layer (7)/the second magnetic layer (3)/the second non-magnetic insertion layer (8)/the third magnetic layer (4)/the second non-magnetic layer (5) being $MgO/(Co_aFe_bM_{100-a-b})_cN_{100-c}/NI(Co_dFe_eM_{100-d-e})_fN_{100-f}/NI(Co_gFe_hM_{100-g-h})_iN_{100-i}/MgO$ (where M denotes a magnetic element other than Co and Fe, N denotes a non-magnetic element, NI denotes a non-magnetic insertion element, $0 \le a \le 50$, $50 \le b \le 100$, $30 \le c \le 100$, $0 \le d \le 100$, $0 \le e \le 50$, $30 \le f \le 100$, $0 \le g \le 50$, $50 \le h \le 100$, and $30 \le i \le 100$), and more specifically, examples include $MgO/Co_{25}Fe_{75}/W/Co_{50}Fe_{50}/W/Co_{25}Fe_{75}/MgO$, $MgO/Co_{25}Fe_{75}/Mo/(Co_{50}Fe_{50})_{75}B_{25}/Ta/Co_{25}Fe_{75}/MgO$, $MgO/(Co_{25}Fe_{75})_{80}B_{20}/W/(Co_{60}Fe_{40})_{75}B_{25}/Mo/(Co_{25}Fe_{75})_{80}B_{20}/MgO$, $MgO/Co_{20}Fe_{75}Ni_5/Mo/Co_{15}Fe_{40}Ni_{45}/W/Co_{20}Fe_{75}Ni/MgO$, $MgO/Co_{20}Fe_{75}Ni_5/Mo/(Co_{50}Fe_{45}Ni_5)_{75}B_{25}/Mo/Co_{20}Fe_{75}Ni_5/MgO$, and $MgO/Co_{25}Fe_{75}/Ta/(Co_{50}Fe_{45}Ni_5)_{75}B_{25}/Nb/(Co_{25}Fe_{75})_{80}B_{20}/MgO$.

In the fifth embodiment shown in FIG. 5, when the reference layer is adjacent to the first non-magnetic layer (1) on an opposite side to the first magnetic layer (2), the first non-magnetic layer (1) is to constitute the barrier layer in a basic structure of the magnetoresistance effect element, and when another reference layer is adjacent to the second non-magnetic layer (5) on an opposite side to the third magnetic layer (4), the second non-magnetic layer (5) is to constitute the barrier layer. The first magnetic layer (2)/the first non-magnetic insertion layer (7)/the second magnetic layer (3)/the second non-magnetic insertion layer (8)/the third magnetic layer (4) constitute the recording layer.

Sixth Embodiment

FIG. 6 shows an example of the magnetoresistance effect element according to the present invention in which non-magnetic insertion layers are inserted at two locations.

The sixth embodiment further includes the first non-magnetic insertion layer (7) and the second non-magnetic insertion layer (8) in addition to the fourth embodiment.

As shown in FIG. 6, the first non-magnetic layer (1), the first magnetic layer (2), the first non-magnetic insertion layer (7), the fourth magnetic layer (3a), the non-magnetic coupling layer (6), the fifth magnetic layer (3b), the second non-magnetic insertion layer (8), the third magnetic layer (4), and the second non-magnetic layer (5) are stacked in this order.

Details of the sixth embodiment are similar to those of the fourth embodiment with the exception of the description given below.

The first non-magnetic insertion layer (7) is inserted for the purpose of preventing mutual diffusion of constituent elements of the first magnetic layer (2) and the fourth magnetic layer (3a), and the second non-magnetic insertion layer (8) is inserted for the purpose of preventing mutual diffusion of constituent elements of the fifth magnetic layer (3b) and the third magnetic layer (4). Although any material (a non-magnetic insertion element) which prevents mutual diffusion can be used without limitation, the material is preferably Mo, W, Ta, Nb, or the like, more preferably a non-magnetic metal including bcc, and even more preferably a material with an atomic radius of 139 pm or larger.

An insertion layer film thickness of the first non-magnetic insertion layer (7) ranges from 0.1 to 0.5 nm. This is because, when the insertion layer film thickness is larger than 0.5 nm, magnetic coupling between the first magnetic layer (2) and the fourth magnetic layer (3a) weakens and thermal stability declines.

An insertion layer film thickness of the second non-magnetic insertion layer (8) ranges from 0.1 to 0.5 nm. This is because, when the insertion layer film thickness is larger than 0.5 nm, magnetic coupling between the third magnetic layer (4) and the fifth magnetic layer (3b) weakens and thermal stability declines.

The first and second non-magnetic insertion layers (7 and 8) are preferably formed by a sputtering method using first and second sputtering gases.

A ratio (a first $M_T/M_G$ ratio) of a mass number ($M_T$) of the metal of the first non-magnetic insertion layer (7) to a mass number ($M_G$) of the first sputtering gas is selected so as to be equal to or smaller than 2.2. For example, when the non-magnetic insertion element is Mo, W, Ta, or Nb, Xe, Kr, or the like is selected as the sputtering gas.

A ratio (a second $M_T/M_G$ ratio) of a mass number ($M_T$) of the metal of the second non-magnetic insertion layer (8) to a mass number ($M_G$) of the second sputtering gas is selected so as to be larger than 2.2. For example, when the non-magnetic insertion element is Mo, W, Ta, or Nb, Ar, or the like is selected as the sputtering gas.

Specific examples of the sixth embodiment include the first non-magnetic layer (1)/the first magnetic layer (2)/the first non-magnetic insertion layer (7)/the fourth magnetic layer (3a)/the non-magnetic coupling layer (6)/the fifth magnetic layer (3b)/the second non-magnetic insertion layer (8)/the third magnetic layer (4)/the second non-magnetic layer (5) being MgO/(Co$_d$Fe$_b$M$_{100-a-b}$)$_c$N$_{100-c}$/NI/(Co$_d$Fe$_e$M$_{100-d-e}$)$_f$N$_{100-f}$/N/(Co$_d$Fe$_e$M$_{100-d-e}$)$_f$N$_{100-f}$/NI/(Co$_g$Fe$_h$M$_{100-g-h}$)$_i$N$_{100-i}$/MgO (where M denotes a magnetic element other than Co and Fe, N denotes a non-magnetic element, NI denotes a non-magnetic insertion element, 0≤a≤50, 50≤b≤100, 30≤c≤100, 0≤d≤100, 0≤e≤50, 30≤f≤100, 0≤g≤50, 50≤h≤100, and 30≤i≤100), and more specifically, examples include MgO/Co$_{25}$Fe$_{75}$/W/Co$_{50}$Fe$_{50}$/W/Co$_{50}$Fe$_{50}$/W/Co$_{25}$Fe$_{75}$/MgO, MgO/Co$_{25}$Fe$_{75}$/Ta/(Co$_{50}$Fe$_{50}$)$_{75}$B$_{25}$/Ta/(Co$_{50}$Fe$_{50}$)$_{75}$B$_{25}$/Mo/Co$_{25}$Fe$_{75}$/MgO, MgO/(Co$_{25}$Fe$_{75}$)$_{80}$B$_{20}$/Mo/(Co$_{60}$Fe$_{40}$)$_{75}$B$_{25}$/W/(Co$_{60}$Fe$_{40}$)$_{75}$B$_{25}$/Mo/(Co$_{25}$Fe$_{75}$)$_{80}$B$_{20}$/MgO, MgO/Co$_{20}$Fe$_{75}$Ni/Ta/Co$_{15}$Fe$_{40}$Ni$_{45}$/Ta/Co$_{15}$Fe$_{40}$Ni$_{45}$/Ta/Co$_{20}$Fe$_{75}$Ni$_5$/MgO, MgO/Co$_{20}$Fe$_{75}$Ni$_5$/Ta/(Co$_{50}$Fe$_{45}$Ni$_5$)$_{75}$B$_{25}$/W/(Co$_{50}$Fe$_{45}$Ni$_5$)$_{75}$B$_{25}$/Nb/Co$_{20}$Fe$_{75}$Ni$_5$/MgO, and MgO/Co$_{25}$Fe$_{75}$/W/(Co$_{50}$Fe$_{45}$Ni$_5$)$_{75}$B$_{25}$/Ta/(Co$_{50}$Fe$_{45}$Ni$_5$)$_{75}$B$_{25}$/W/(Co$_{25}$Fe$_{75}$)$_{80}$B$_{20}$/MgO.

In the sixth embodiment shown in FIG. 6, when the reference layer is adjacent to the first non-magnetic layer (1) on an opposite side to the first magnetic layer (2), the first non-magnetic layer (1) is to constitute the barrier layer in a basic structure of the magnetoresistance effect element, and when another reference layer is adjacent to the second non-magnetic layer (5) on an opposite side to the third magnetic layer (4), the second non-magnetic layer (5) is to constitute the barrier layer. The first magnetic layer (2)/the first non-magnetic insertion layer (7)/the fourth magnetic layer (3a)/the non-magnetic coupling layer (6)/the fifth magnetic layer (3b)/the second non-magnetic insertion layer (8)/the third magnetic layer (4) constitute the recording layer.

Seventh Embodiment

Figure 7:
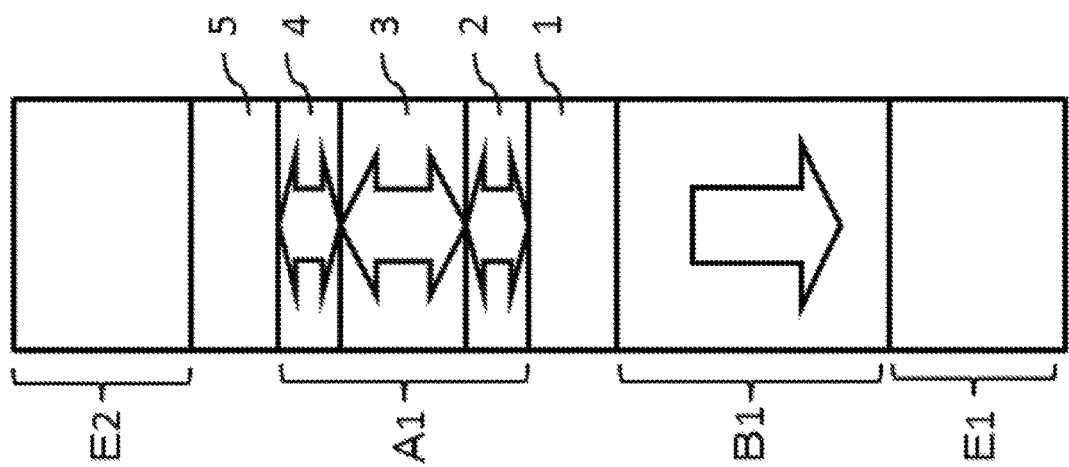
FIG. 7 is a longitudinal section view showing another example of a configuration of a magnetoresistance effect element according to the present invention.

FIG. 7 shows an example of the magnetoresistance effect element according to the present invention which includes lower non-magnetic electrode/reference layer/barrier layer/recording layer/upper non-magnetic electrode.

As shown in FIG. 7, the magnetoresistance effect element according to the seventh embodiment has a stack structure constituted by the lower non-magnetic electrode (E1), a first reference layer (B1), the first non-magnetic layer (1) that is a barrier layer, the first recording layer (A1), the second non-magnetic layer (5), and an upper non-magnetic electrode (E2), and the first recording layer (A1) includes the first magnetic layer (2), the second magnetic layer (3), and the third magnetic layer (4) according to the third embodiment.

Details of the seventh embodiment are similar to those of the third embodiment with the exception of the description given below.

The first reference layer (B1) is a magnetic layer of which a magnetization direction is fixed for the reference layer as a whole. A magnetic layer of the reference layer may have a stack structure constituted by a magnetic layer and a non-magnetic layer.

The lower non-magnetic electrode (E1) is connected to an end face of the first reference layer (B1) on an opposite side to the first non-magnetic layer (1).

Examples of a stack structure of the lower non-magnetic electrode (E1) include Ta (5 nm)/Ru (5 nm)/Ta (10 nm)/Pt (5 nm) and Ta (5 nm)/TaN (20 nm).

The first non-magnetic layer (1) is a barrier layer (a tunnel junction layer made of an insulating layer) of the magnetoresistance effect element and is joined to an end face of the first magnetic layer (2) on an opposite side to the second magnetic layer (3) and to an end face of the first reference layer (B1) on an opposite side to the lower non-magnetic electrode (E1). In addition, the second non-magnetic layer (5) is joined to an end face of the third magnetic layer (4) on an opposite side to the second magnetic layer (3) and to the upper non-magnetic electrode (E2).

As materials of the first non-magnetic layer (1) and the second non-magnetic layer (5), an insulating material containing oxygen such as MgO, $Al_2O_3$, $SiO_2$, TiO, or $Hf_2O$ is used so that, combined with a material of the end face of the first reference layer (B1) on an opposite side to the lower non-magnetic electrode (E1) and a material of the first magnetic layer (2), a large rate of change of magnetoresistance is produced, and MgO is preferably used.

Film thicknesses of the first non-magnetic layer (1) and the second non-magnetic layer (5) are adjusted to a range of 0.1 to 5.0 nm and preferably to a range of 0.5 to 2.0 nm. Alternatively, a difference may be created between the film thicknesses such as setting the film thickness of the first non-magnetic layer (1) to 1.2 nm and the film thickness of the second non-magnetic layer (5) to 1.0 nm.

The upper non-magnetic electrode (E2) is connected to an end face of the second non-magnetic layer (5) on an opposite side to the third magnetic layer (4).

Examples of a stack structure of the upper non-magnetic electrode (E2) include Ta (50 nm), Ta (5 nm)/Ru (50 nm), Ru (1 to 50 nm), Pt (1 to 50 nm), and CoFeB (0.2 to 1.5 nm)/Ru (5 nm)/Ta (50 nm).

Eighth Embodiment

Figure 8:
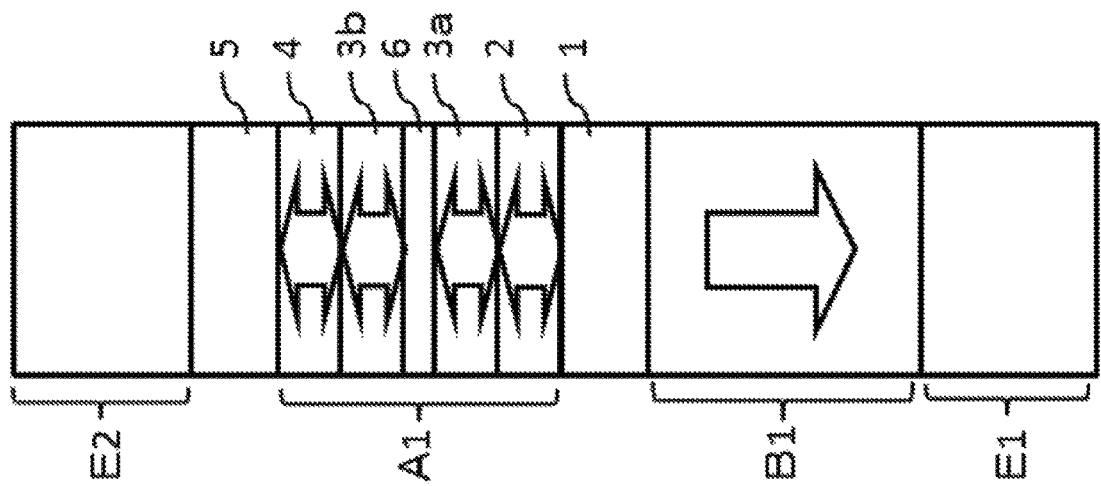
FIG. 8 is a longitudinal section view showing another example of a configuration of a magnetoresistance effect element according to the present invention.

FIG. 8 shows an example of the magnetoresistance effect element according to the present invention which includes lower non-magnetic electrode/reference layer/barrier layer/recording layer/upper non-magnetic electrode and of which the recording layer is the stack structure according to the fourth embodiment.

As shown in FIG. 8, the magnetoresistance effect element according to the eighth embodiment has a stack structure constituted by the lower non-magnetic electrode (E1), the first reference layer (B1), the first non-magnetic layer (1) that is a barrier layer, the first recording layer (A1), the second non-magnetic layer (5), and the upper non-magnetic electrode (E2), and the first recording layer (A1) includes the first magnetic layer (2), the fourth magnetic layer (3a), the non-magnetic coupling layer (6), the fifth magnetic layer (3b), and the third magnetic layer (4) according to the fourth embodiment.

Details of the eighth embodiment are similar to those of the fourth and seventh embodiments.

Ninth Embodiment

Figure 9:
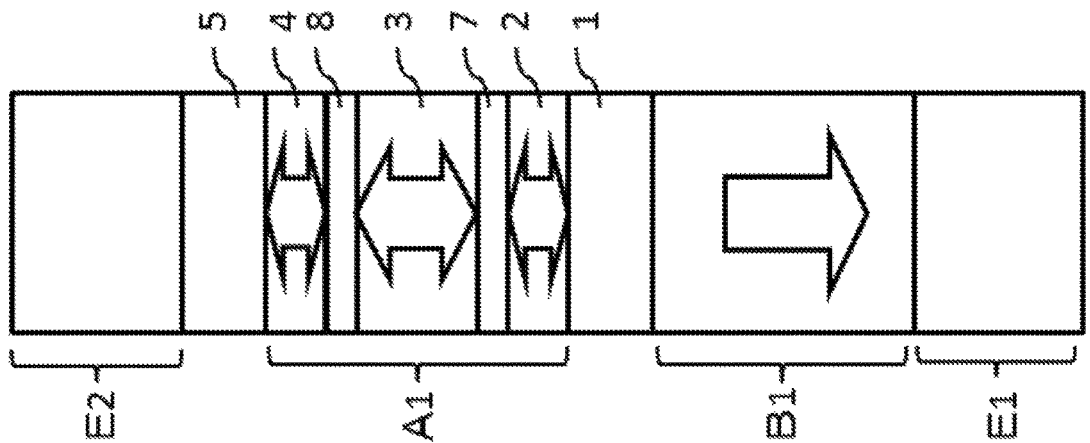
FIG. 9 is a longitudinal section view showing another example of a configuration of a magnetoresistance effect element according to the present invention.

FIG. 9 shows an example of the magnetoresistance effect element according to the present invention which includes lower electrode/reference layer/barrier layer/recording layer/upper electrode and of which the recording layer is the stack structure according to the fifth embodiment.

As shown in FIG. 9, the magnetoresistance effect element according to the ninth embodiment has a stack structure constituted by the lower non-magnetic electrode (E1), the first reference layer (B1), the first non-magnetic layer (1) that is a barrier layer, the first recording layer (A1), the second non-magnetic layer (5), and the upper non-magnetic electrode (E2), and the first recording layer (A1) includes the first magnetic layer (2), the first non-magnetic insertion layer (7), the second magnetic layer (3), the second non-magnetic insertion layer (8), and the third magnetic layer (4) according to the fifth embodiment.

Details of the ninth embodiment are similar to those of the fifth and seventh embodiments.

Tenth Embodiment

Figure 10:
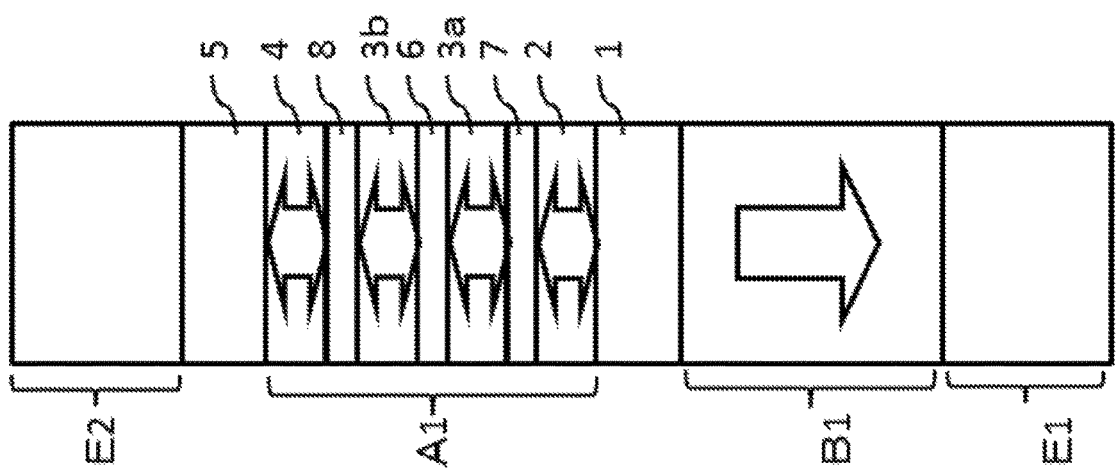
FIG. 10 is a longitudinal section view showing another example of a configuration of a magnetoresistance effect element according to the present invention.

FIG. 10 shows an example of the magnetoresistance effect element according to the present invention which includes lower non-magnetic electrode/reference layer/barrier layer/recording layer/upper non-magnetic electrode and of which the recording layer is the stack structure according to the sixth embodiment.

As shown in FIG. 10, the magnetoresistance effect element according to the tenth embodiment has a stack structure constituted by the lower non-magnetic electrode (E1), the first reference layer (B1), the first non-magnetic layer (1) that is a barrier layer, the first recording layer (A1), the second non-magnetic layer (5), and the upper non-magnetic electrode (E2), and the first recording layer (A1) includes the first magnetic layer (2), the first non-magnetic insertion layer (7), the fourth magnetic layer (3a), the non-magnetic coupling layer (6), the fifth magnetic layer (3b), the second non-magnetic insertion layer (8), and the third magnetic layer (4) according to the sixth embodiment.

Details of the tenth embodiment are similar to those of the sixth and seventh embodiments.

Eleventh Embodiment

Figure 11:
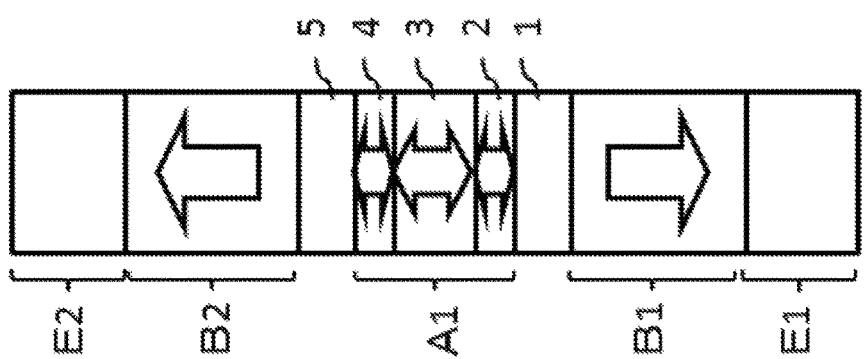
FIG. 11 is a longitudinal section view showing another example of a configuration of a magnetoresistance effect element according to the present invention.

FIG. 11 shows an example of the magnetoresistance effect element according to the present invention which includes one recording layer, two reference layers, and two barrier layers and of which the recording layer is the stack structure of the recording layer according to the third embodiment.

As shown in FIG. 11, the magnetoresistance effect element according to the eleventh embodiment has a stack structure constituted by the lower non-magnetic electrode (E1), the first reference layer (B1), the first non-magnetic layer (1), the first recording layer (A1), the second non-magnetic layer (5), a second reference layer (B2), and the upper non-magnetic electrode (E2), and the first recording layer (A1) includes the first magnetic layer (2), the second magnetic layer (3), and the third magnetic layer (4) according to the second embodiment.

In the present embodiment, the first non-magnetic layer (1) and the second non-magnetic layer (5) constitute barrier layers.

Details of the eleventh embodiment are similar to those of the third and seventh embodiments with the exception of the description given below.

The second reference layer (B2) is a magnetic layer of which a magnetization direction is fixed for the reference layer as a whole. A magnetic layer of the reference layer may have a stack structure constituted by a magnetic layer and a non-magnetic layer. In addition, a state of arrangement of magnetization of each magnetic layer in the second reference layer (B2) is opposite to that in the first reference layer (B1) and the second reference layer (B2) has properties as an antiparallelly coupled reference layer.

Twelfth Embodiment

Figure 12:
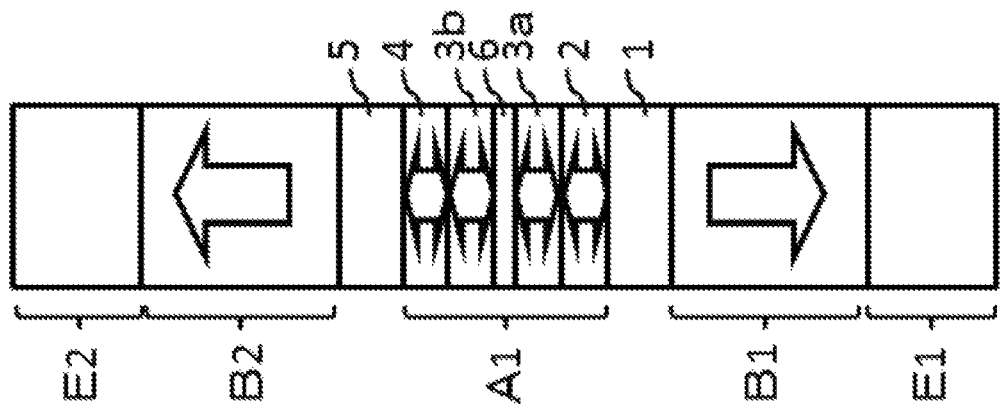
FIG. 12 is a longitudinal section view showing another example of a configuration of a magnetoresistance effect element according to the present invention.

FIG. 12 shows an example of the magnetoresistance effect element according to the present invention which includes one recording layer, two reference layers, and two barrier layers.

As shown in FIG. 12, the magnetoresistance effect element according to the twelfth embodiment has a stack structure constituted by the lower non-magnetic electrode (E1), the first reference layer (B1), the first non-magnetic layer (1), the first recording layer (A1), the second non-magnetic layer (5), the second reference layer (B2), and the upper non-magnetic electrode (E2), and the first recording layer (A1) includes the first magnetic layer (2), the fourth magnetic layer (3a), the non-magnetic coupling layer (6), the fifth magnetic layer (3b), and the third magnetic layer (4) according to the fourth embodiment.

In the present embodiment, the first non-magnetic layer (1) and the second non-magnetic layer (5) constitute barrier layers.

Details of the twelfth embodiment are similar to those of the fourth, eighth, and eleventh embodiments.

Thirteenth Embodiment

Figure 13:
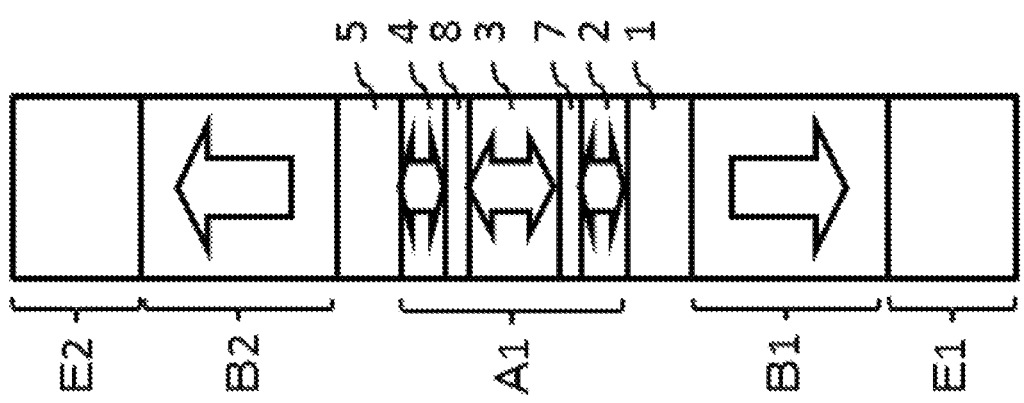
FIG. 13 is a longitudinal section view showing another example of a configuration of a magnetoresistance effect element according to the present invention.

FIG. 13 shows an example of the magnetoresistance effect element according to the present invention which includes one recording layer, two reference layers, and two barrier layers.

As shown in FIG. 13, the magnetoresistance effect element according to the thirteenth embodiment has a stack structure constituted by the lower non-magnetic electrode (E1), the first reference layer (B1), the first non-magnetic layer (1), the first recording layer (A1), the second non-magnetic layer (5), the second reference layer (B2), and the upper non-magnetic electrode (E2), and the first recording layer (A1) includes the first magnetic layer (2), the first non-magnetic insertion layer (7), the second magnetic layer (3), the second non-magnetic insertion layer (8), and the third magnetic layer (4) according to the fifth embodiment.

In the present embodiment, the first non-magnetic layer (1) and the second non-magnetic layer (5) constitute barrier layers.

Details of the thirteenth embodiment are similar to those of the fifth, ninth, and eleventh embodiments.

Fourteenth Embodiment

Figure 14:
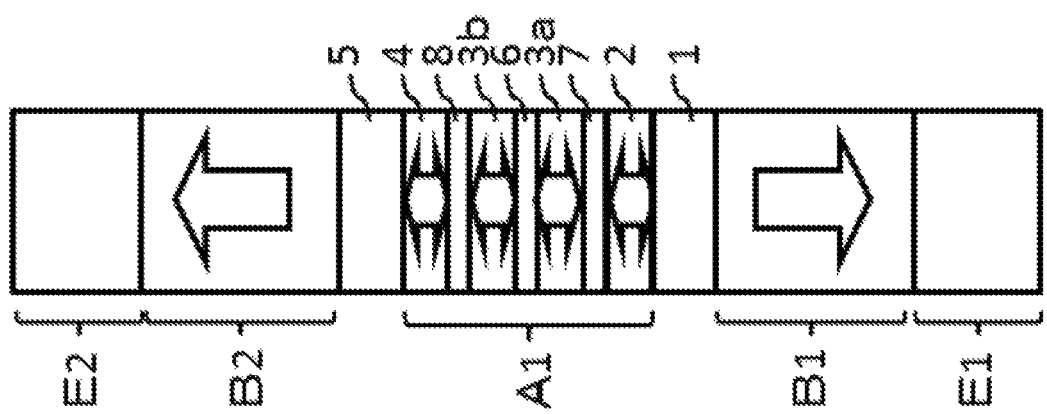
FIG. 14 is a longitudinal section view showing another example of a configuration of a magnetoresistance effect element according to the present invention.

FIG. 14 shows an example of the magnetoresistance effect element according to the present invention which includes one recording layer, two reference layers, and two barrier layers.

As shown in FIG. 14, the magnetoresistance effect element according to the fourteenth embodiment has a stack structure constituted by the lower non-magnetic electrode (E1), the first reference layer (B1), the first non-magnetic layer (1), the first recording layer (A1), the second non-magnetic layer (5), the second reference layer (B2), and the upper non-magnetic electrode (E2), and the first recording layer (A1) includes the first magnetic layer (2), the first non-magnetic insertion layer (7), the fourth magnetic layer (3a), the non-magnetic coupling layer (6), the fifth magnetic layer (3b), the second non-magnetic insertion layer (8), and the third magnetic layer (4) according to the sixth embodiment.

In the present embodiment, the first non-magnetic layer (1) and the second non-magnetic layer (5) constitute barrier layers.

Details of the fourteenth embodiment are similar to those of the sixth, tenth, and eleventh embodiments.

Fifteenth Embodiment

Figure 15:
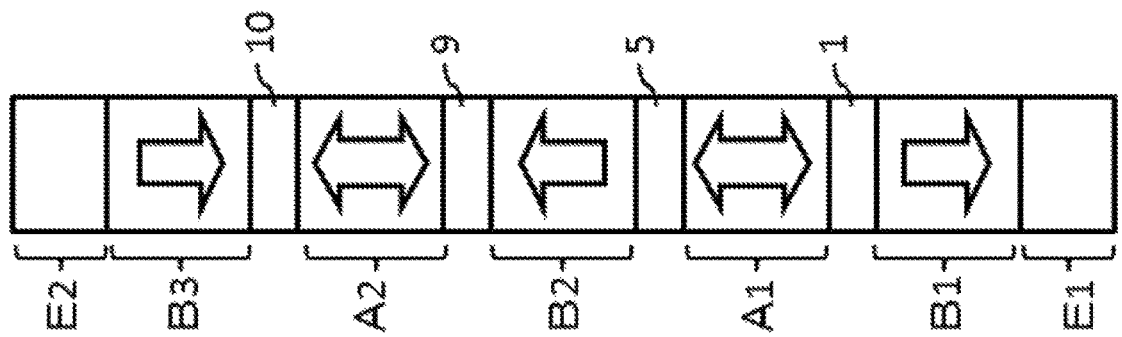
FIG. 15 is a longitudinal section view showing another example of a configuration of a magnetoresistance effect element according to the present invention.

FIG. 15 shows an example of the magnetoresistance effect element according to the present invention which includes two recording layers, three reference layers, and four barrier layers.

As shown in FIG. 15, the magnetoresistance effect element according to the fifteenth embodiment has a stack structure constituted by the lower non-magnetic electrode (E1), the first reference layer (B1), the first non-magnetic layer (1), the first recording layer (A1), the second non-magnetic layer (5), the second reference layer (B2), a third non-magnetic layer (9), a second recording layer (A2), a fourth non-magnetic layer (10), and the upper non-magnetic electrode (E2).

In the present embodiment, the first non-magnetic layer (1), the second non-magnetic layer (5), the third non-magnetic layer (9), and the fourth non-magnetic layer (10) constitute barrier layers.

The first recording layer (Al) and the second recording layer (A2) may share the same configuration as any of the recording layers described in the third to sixth embodiments.

Details of the fifteenth embodiment are similar to those of the first to fourteenth embodiments with the exception of the description given below.

The third non-magnetic layer (9) is a barrier layer of the magnetoresistance effect element and is joined to an end face of the second reference layer (B2) on an opposite side to the second non-magnetic layer (5) and to an end face of the second recording layer (A2) on an opposite side to the fourth non-magnetic layer (10). In addition, the fourth non-magnetic layer (10) is a barrier layer of the magnetoresistance effect element and is joined to an end face of the second recording layer (A2) on an opposite side to the third non-magnetic layer (9) and to an end face of a third reference layer (B3) on an opposite side to the upper non-magnetic electrode (E2).

As materials of the third non-magnetic layer (9) and the fourth non-magnetic layer (10), a compound containing oxygen such as MgO, $Al_2O_3$, $SiO_2$, TiO, or $Hf_2O$ is used so that, combined with materials of the two end faces to which the third non-magnetic layer (9) and the fourth non-magnetic layer (10) are joined, a large rate of change of magnetoresistance is produced, and MgO is preferably used.

Film thicknesses of the third non-magnetic layer (9) and the fourth non-magnetic layer (10) are adjusted to a range of 0.1 to 5.0 nm and preferably to a range of 0.2 to 2.0 nm. Alternatively, a difference may be created among the film thicknesses of the first non-magnetic layer (1), the second non-magnetic layer (5), the third non-magnetic layer (9), and the fourth non-magnetic layer (10).

The third reference layer (B3) is a magnetic layer of which a magnetization direction is fixed for the reference layer as a whole. A magnetic layer of the reference layer may have a stack structure constituted by a magnetic layer and a non-magnetic layer. In addition, a state of arrangement of magnetization of magnetic layers in the third reference layer (B3) is opposite to that in the second reference layer (B2)

and the third reference layer (B3) has properties as an antiparallelly coupled reference layer.

While an example of a magnetoresistance effect element constituted by two recording layers, three reference layers, and four barrier layers has been described in the fifteenth embodiment, the magnetoresistance effect element according to the present invention can include even larger numbers of recording layers, reference layers, and barrier layers. The use of a plurality of reference layers enables a multi-valuing function to be provided.

Sixteenth Embodiment

Figure 16:
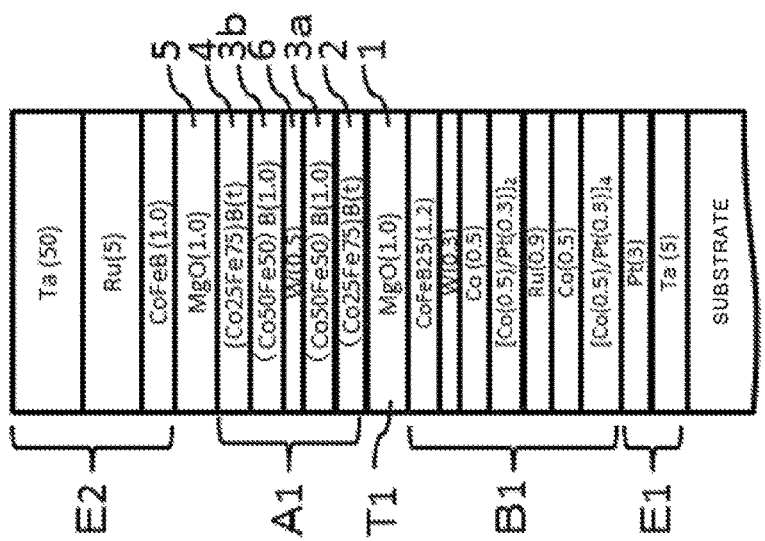
FIG. 16 is a longitudinal section view showing another example of a configuration of a magnetoresistance effect element according to the present invention.

FIG. 16 shows an example of the magnetoresistance effect element according to the present invention which includes the lower non-magnetic electrode (E1), the first reference layer (B1), the first non-magnetic layer (1) (which corresponds to a first barrier layer (T1)), the first recording layer (A1), the second non-magnetic layer (5), and the upper non-magnetic electrode (E2).

In the sixteenth embodiment, the lower non-magnetic electrode (E1) includes Ta (5 nm)/Pt (3 nm) stacked on a substrate, the first reference layer (B1) is [Co (0.5 nm)/Pt(0.3 nm)]×4/Co(0.5 nm)/Ru (0.9 nm)/[Co(0.5 nm)/Pt(0.3 nm)]×2/Co(0.5 nm)/W(0.3 nm)/CoFeB(1.2 nm), and the first non-magnetic layer (1) is MgO (1.0 nm). In the first recording layer (A1), first magnetic layer (2)/fourth magnetic layer (3a)/non-magnetic coupling layer (6)/fifth magnetic layer (3b)/third magnetic layer (4) assumes a stack structure of $(Co_{25}Fe_{75})B(t)/(Co_{50}Fe_{50})B(1.0$ nm$)/W(0.5$ nm$)/(Co_{50}Fe_{50})B(1.0$ nm$)/(Co_{25}Fe_{75})B(t)$, the second non-magnetic layer (5) is MgO (1.0 nm), and the upper non-magnetic electrode (E2) has a stack structure of CoFeB (1.0 nm)/Ru(5 nm)/Ta(50) in this order from a side of the second non-magnetic layer (5).

Seventeenth Embodiment

Figure 17:
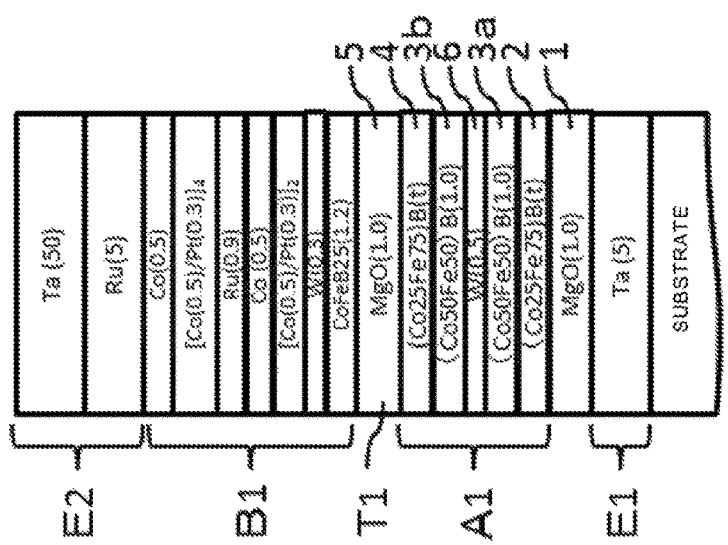
FIG. 17 is a longitudinal section view showing another example of a configuration of a magnetoresistance effect element according to the present invention.

FIG. 17 shows an example of the magnetoresistance effect element according to the present invention which includes the lower non-magnetic electrode (E1), the first non-magnetic layer (1), the first recording layer (A1), the second non-magnetic layer (5) (which corresponds to the first barrier layer (T1)), the first reference layer (B1), and the upper non-magnetic electrode (E2).

As shown in FIG. 17, the seventeenth embodiment is configured such that the second non-magnetic layer (5) which is adjacent to the first recording layer (A1) constitutes the first barrier layer (T1), and the first reference layer (B1) is included between and adjacent to the second non-magnetic layer (5) and the upper non-magnetic electrode (E2).

Eighteenth Embodiment

Figure 18:
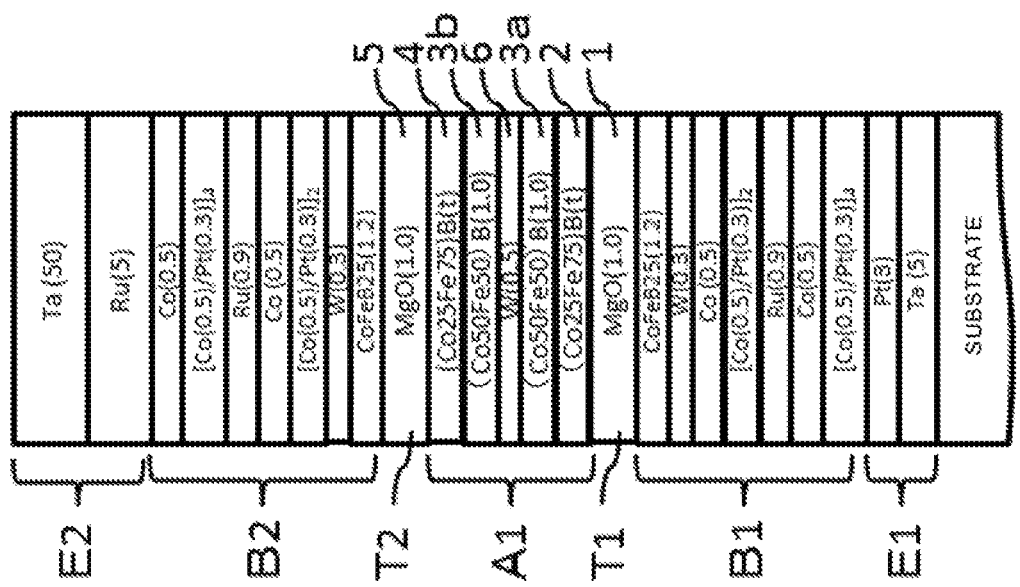
FIG. 18 is a longitudinal section view showing another example of a configuration of a magnetoresistance effect element according to the present invention.

FIG. 18 shows an example of the magnetoresistance effect element according to the present invention which includes the lower non-magnetic electrode (El), the first reference layer (B1), the first non-magnetic layer (1) (which corresponds to the first barrier layer (T1)), the first recording layer (Al), the second non-magnetic layer (5) (which corresponds to a second barrier layer (T2)), the second reference layer (B2), and the upper non-magnetic electrode (E2).

As shown in FIG. 18, the eighteenth embodiment is configured such that the first non-magnetic layer (1) which is adjacent to the first recording layer (Al) constitutes the first barrier layer (T1), and the first reference layer (B1) is included between and adjacent to the first non-magnetic layer (1) and the lower non-magnetic electrode (El). In addition, the second non-magnetic layer (5) which is adjacent to the first recording layer (Al) constitutes the second barrier layer (T2), and the second reference layer (B2) is included between and adjacent to the second non-magnetic layer (5) and the upper non-magnetic electrode (E2).

Nineteenth Embodiment

Figure 19B:
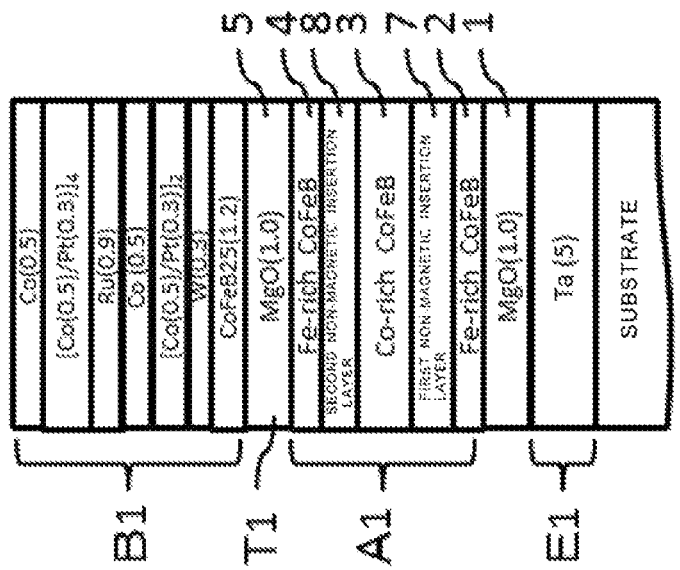
FIG. 19 is a longitudinal section view showing another example of a configuration of a magnetoresistance effect element according to the present invention.
Figure 19A:
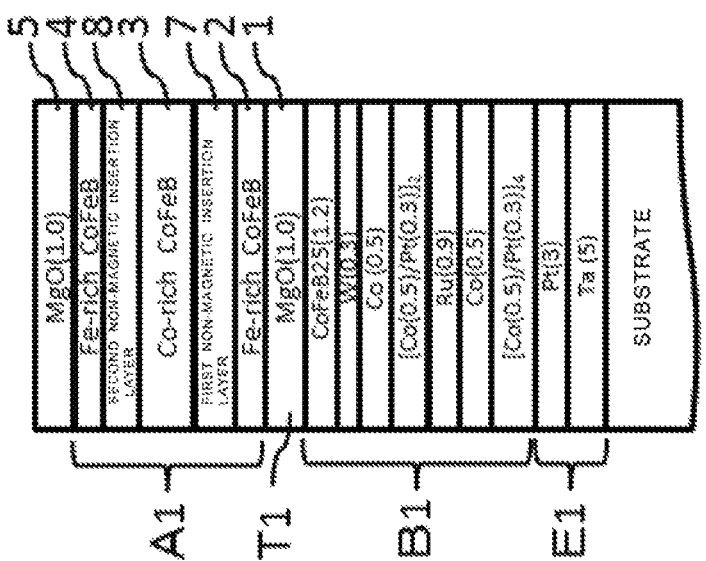

FIG. 19(a) shows an example of the magnetoresistance effect element according to the present invention which includes the lower non-magnetic electrode (E1), the first reference layer (B1), the first non-magnetic layer (1) (which corresponds to the first barrier layer (T1)), the first recording layer (A1), and the second non-magnetic layer (5).

FIG. 19(b) shows an example of the magnetoresistance effect element according to the present invention which includes the lower non-magnetic electrode (E1), the first non-magnetic layer (1), the first recording layer (A1), the second non-magnetic layer (5) (which corresponds to the first barrier layer (T1)), and the first reference layer (B1).

Both of the first recording layers (A1) include CoFeB layer with a high Fe composition (concentration) as the first magnetic layer (2), the first non-magnetic insertion layer (7), a CoFeB layer with a high Co composition (concentration) as the second magnetic layer (3), the second non-magnetic insertion layer (8), and a CoFeB layer with a high Fe composition (concentration) as the third magnetic layer (4).

The first and second non-magnetic insertion layers (7 and 8) are preferably formed by a sputtering method using first and second sputtering gases.

In both embodiments, a ratio (a first $M_T/M_G$ ratio) of a mass number ($M_T$) of the metal of the first non-magnetic insertion layer (7) to a mass number ($M_G$) of the first sputtering gas is selected so as to be equal to or smaller than 2.2. For example, when the non-magnetic insertion element is Mo, W, Ta, or Nb, Xe, Kr, or the like is selected as the sputtering gas. Accordingly, recoil gas of the sputtering element such as Kr, Xe, or the like is less likely to reach the non-magnetic insertion layer (7), let alone the first magnetic layer (2) to be positioned on a lower side during sputtering, and is less likely to remain on the first magnetic layer (2) and the first non-magnetic insertion layer (7) (refer to FIG. 49(b)).

In both embodiments, a ratio (a second $M_T/M_G$ ratio) of a mass number ($M_T$) of the metal of the second non-magnetic insertion layer (8) to a mass number ($M_G$) of the second sputtering gas is selected so as to be larger than 2.2. For example, when the non-magnetic insertion element is Mo, W, Ta, or Nb, Ar, or the like is selected as the sputtering gas. Accordingly, recoil gas of the sputtering element such as Ar or the like is likely to penetrate into the second non-magnetic insertion layer (8) and the second magnetic layer (3) to be positioned on a lower side during sputtering, and is likely to remain in the second magnetic layer (3) and the second non-magnetic insertion layer (8) (refer to FIG. 49(a)). Due to the lower-side second magnetic layer sustaining damage from recoil gas of the sputtering element and the sputtering element having penetrated as the recoil gas remaining in the lower-side second magnetic layer, the saturation magnetization $M_s$ can be further reduced.

Twentieth Embodiment

Figure 20:
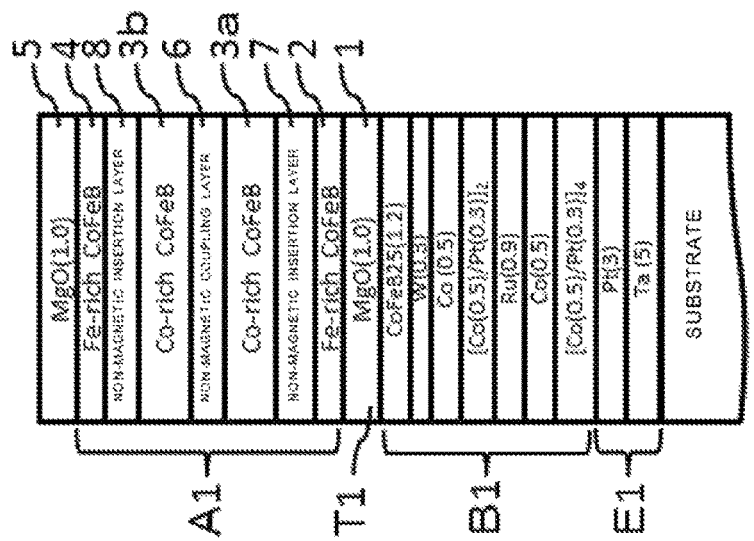
FIG. 20 is a longitudinal section view showing another example of a configuration of a magnetoresistance effect element according to the present invention.

FIG. 20 shows an example of the magnetoresistance effect element according to the present invention which includes the lower non-magnetic electrode (E1), the first reference layer (B1), the first non-magnetic layer (1) (which corresponds to the first barrier layer (T1)), the first recording layer (A1), and the second non-magnetic layer (5).

The first recording layer (A1) includes a CoFeB layer with a high Fe composition (concentration) as the first magnetic layer (2), the first non-magnetic insertion layer (7), a CoFeB layer with a high Co composition (concentration) as the fourth magnetic layer (3a), the non-magnetic coupling layer (6), a CoFeB layer with a high Co composition (concentration) as the fifth magnetic layer (3b), the second non-magnetic insertion layer (8), and a CoFeB layer with a high Fe composition (concentration) as the third magnetic layer (4).

While the magnetoresistance effect element according to the present invention can be manufactured using molecular beam epitaxy (MBE) and the like in addition to a method involving sputtering materials of a target composition and performing an annealing treatment after stacking, fabrication methods are not limited thereto.

In addition, junction sizes of the magnetoresistance effect element according to the present invention need not be constant over the entire element.

The magnetoresistance effect element according to the present invention is to be built into a magnetic memory of MRAMs which are being developed as magnetic memories. One of the lower non-magnetic electrode (E1) and the upper non-magnetic electrode (E2) of the magnetoresistance effect element is electrically connected to a drain electrode of a selective transistor, and the other electrode is electrically connected to a bit line.

REFERENCE SIGNS LIST

1 First non-magnetic layer
2 First magnetic layer
3 Second magnetic layer
3a Fourth magnetic layer
3b Fifth magnetic layer
4 Third magnetic layer
5 Second non-magnetic layer
6 Non-magnetic coupling layer
7 First non-magnetic insertion layer
8 Second non-magnetic insertion layer
9 Third non-magnetic layer
10 Fourth non-magnetic layer
A1 First recording layer
A2 Second recording layer
B1 First reference layer
B2 Second reference layer
B3 Third reference layer
E1 Lower non-magnetic electrode
E2 Upper non-magnetic electrode
T1 First barrier layer
T2 Second barrier layer

The invention claimed is:

1. A magnetoresistance effect element, comprising:
a first magnetic layer of which a magnetization direction is a direction perpendicular to a film surface;
a first non-magnetic layer which is provided adjacent to the first magnetic layer; and
a second magnetic layer which is provided adjacent to the first magnetic layer on an opposite side to the first non-magnetic layer and of which a magnetization direction is a direction perpendicular to the film surface, wherein
the first magnetic layer includes at least Fe, an Fe composition in the first magnetic layer being 50 at % or higher with respect to a sum total of atomic fractions of magnetic elements in the first magnetic layer, a magnetization direction of the first magnetic layer being oriented in a perpendicular direction with respect to the film surface due to interfacial perpendicular magnetic anisotropy on an interface with the first non-magnetic layer,
the second magnetic layer includes at least one 3d ferromagnetic transition metal element consisting of one or more among the group of Co, Fe, Ni, and Mn, an Fe composition in the second magnetic layer being 50 at % or lower with respect to a sum total of atomic fractions of magnetic elements in the second magnetic layer,
an interfacial magnetic anisotropy energy density $K_i$ on an interface between the first non-magnetic layer and the first magnetic layer is higher than an interfacial magnetic anisotropy energy density $K_i$ on an interface between the first non-magnetic layer and the second magnetic layer if the first non-magnetic layer and the second magnetic layer were directly joined to each other, and
a saturation magnetization $M_s$ of the second magnetic layer is lower than a saturation magnetization $M_s$ of the first magnetic layer.

2. The magnetoresistance effect element according to claim 1, wherein the first magnetic layer is configured such that a ratio of an amount of a non-magnetic element composition consisting of one or more among the group of V, Ti, Cr, Zr, Nb, Mo, Hf, Ta, W, Si, Al, B, Pd, and Pt in the first magnetic layer to an amount of a non-magnetic element composition consisting of one or more among the group of V, Ti, Cr, Zr, Nb, Mo, Hf, Ta, W, Si, Al, B, Pd, and Pt in the second magnetic layer is smaller than 1.

3. The magnetoresistance effect element according to claim 1, further comprising a first non-magnetic insertion layer made of a first metal and being adjacent between the first magnetic layer and the second magnetic layer.

4. The magnetoresistance effect element according to claim 3, wherein an insertion layer film thickness of the first non-magnetic insertion layer ranges from 0.1 to 0.5 nm.

5. The magnetoresistance effect element according to claim 3, wherein the first non-magnetic insertion layer is formed by a sputtering method using a first sputtering gas, and a first $M_T/M_G$ ratio being a ratio of a mass number $M_T$ of the first metal of the first non-magnetic insertion layer to a mass number $M_G$ of the first sputtering gas is 2.2 or smaller.

6. A magnetic memory comprising, as a magnetic memory cell, the magnetoresistance effect element according to claim 1.

7. A magnetoresistance effect element, comprising: a first magnetic layer of which a magnetization direction is a direction perpendicular to a film surface;
a first non-magnetic layer which is provided adjacent to the first magnetic layer;
a second magnetic layer which is provided adjacent to the first magnetic layer on an opposite side to the first non-magnetic layer and of which a magnetization direction is a direction perpendicular to the film surface;
a third magnetic layer which is provided adjacent to the second magnetic layer on an opposite side to the first magnetic layer and of which a magnetization direction is a direction perpendicular to the film surface; and
a second non-magnetic layer which is provided adjacent to the third magnetic layer on an opposite side to the second magnetic layer, wherein the first magnetic layer includes at least Fe, an Fe composition in the first magnetic layer being 50 at % or higher with respect to a sum total of atomic fractions of magnetic elements in the first magnetic layer, a magnetization direction of the first magnetic layer being oriented in a perpendicular direction with respect to the film surface due to interfacial perpendicular magnetic anisotropy on an interface with the first non-magnetic layer, the third magnetic layer includes at least Fe, an Fe composition in the third magnetic layer being 50 at % or higher with respect to a sum total of atomic fractions of magnetic elements in the third magnetic layer, a magnetization direction of the third magnetic layer being oriented in a perpendicular direction with respect to the film surface due to interfacial perpendicular magnetic anisotropy on an interface with the second non-magnetic layer, an interfacial magnetic anisotropy energy density $K_i$ on an interface between the first non-magnetic layer and the first magnetic layer is higher than an interfacial magnetic anisotropy energy density $K_i$ on an interface between the first non-magnetic layer and the second magnetic layer if the first non-magnetic layer and the second magnetic layer were directly joined to each other, an interfacial magnetic anisotropy energy density $K_i$ on an interface between the second non-magnetic layer and the third magnetic layer is higher than an interfacial magnetic anisotropy energy density $K_i$ on an interface between the second non-magnetic layer and the second magnetic layer if the second non-magnetic layer and the second magnetic layer were directly joined to each other, and a saturation magnetization $M_s$ of the second magnetic layer is lower than a saturation magnetization $M_s$ of the first magnetic layer and a saturation magnetization $M_s$ of the third magnetic layer.

8. The magnetoresistance effect element according to claim 7, wherein the first magnetic layer is configured such that a ratio of an amount of a non-magnetic element composition consisting of one or more among the group of V, Ti, Cr, Zr, Nb, Mo, Hf, Ta, W, Si, Al, B, Pd, and Pt in the first magnetic layer to an amount of a non-magnetic element composition consisting of one or more among the group of V, Ti, Cr, Zr, Nb, Mo, Hf, Ta, W, Si, Al, B, Pd, and Pt in the second magnetic layer is smaller than 1, and the third magnetic layer is configured such that a ratio of an amount of a non-magnetic element composition consisting of one or more among the group of V, Ti, Cr, Zr, Nb, Mo, Hf, Ta, W, Si, Al, B, Pd, and Pt in the third magnetic layer to an amount of a non-magnetic element composition consisting of one or more among the group of V, Ti, Cr, Zr, Nb, Mo, Hf, Ta, W, Si, Al, B, Pd, and Pt in the second magnetic layer is smaller than 1.

9. The magnetoresistance effect element according to claim 7, further comprising: a first non-magnetic insertion layer made of a first metal and being adjacent between the first magnetic layer and the second magnetic layer; and a second non-magnetic insertion layer made of a second metal and being adjacent between the third magnetic layer and the second magnetic layer.

10. The magnetoresistance effect element according to claim 9, wherein an insertion layer film thickness of each of the first non-magnetic insertion layer and the second non-magnetic insertion layer ranges from 0.1 to 0.5 nm.

11. The magnetoresistance effect element according to claim 9, wherein the first non-magnetic insertion layer is formed by a sputtering method using a first sputtering gas, and a first $M_T/M_G$ ratio being a ratio of a mass number $M_T$ of the first metal of the first non-magnetic insertion layer to a mass number $M_G$ of the first sputtering gas is 2.2 or smaller, and the second non-magnetic insertion layer is formed by a sputtering method using a second sputtering gas, and a second MT/MG ratio being a ratio of a mass number MT of the second metal of the second non-magnetic insertion layer to a mass number MG of the second sputtering gas is larger than 2.2.

12. The magnetoresistance effect element according to claim 7, wherein the second magnetic layer is structured so as to include:

a fourth magnetic layer which is provided adjacent to the first magnetic layer on an opposite side to the first non-magnetic layer and of which a magnetization direction is a direction perpendicular to the film surface;

a non-magnetic coupling layer which is provided adjacent to the fourth magnetic layer on an opposite side to the first magnetic layer; and a fifth magnetic layer which is provided adjacent to the non-magnetic coupling layer on an opposite side to the fourth magnetic layer and, at the same time, provided adjacent to the third magnetic layer on an opposite side to the second non-magnetic layer and of which a magnetization direction is a direction perpendicular to the film surface, the fourth and fifth magnetic layers each include at least one 3d ferromagnetic transition metal element consisting of one or more among the group of Co, Fe, Ni, and Mn, an Fe composition in the fourth magnetic layer being 50 at % or lower with respect to a sum total of atomic fractions of magnetic elements in the fourth magnetic layer, an Fe composition in the fifth magnetic layer being 50 at % or lower with respect to a sum total of atomic fractions of magnetic elements in the fifth magnetic layer, and the non-magnetic coupling layer includes at least one non-magnetic element consisting of one or more among the group of V, Ti, Cr, Zr, Nb, Mo, Hf, Ta, W, Si, Al, B, Pd, and Pt.

13. The magnetoresistance effect element according to claim 12, wherein the first magnetic layer is configured such that a ratio of an amount of a non-magnetic element composition consisting of one or more among the group of V, Ti, Cr, Zr, Nb, Mo, Hf, Ta, W, Si, Al, B, Pd, and Pt in the first magnetic layer to an amount of a non-magnetic element composition consisting of one or more among the group of V, Ti, Cr, Zr, Nb, Mo, Hf, Ta, W, Si, Al, B, Pd, and Pt in the fourth magnetic layer is smaller than 1, and the third magnetic layer is configured such that a ratio of an amount of a non-magnetic element consisting of one or more among the group of V, Ti, Cr, Zr, Nb, Mo, Hf, Ta, W, Si, Al, B, Pd, and Pt in the third magnetic layer to an amount of a non-magnetic element composition consisting of one or more among the group of V, Ti, Cr, Zr, Nb, Mo, Hf, Ta, W, Si, Al, B, Pd, and Pt in the fifth magnetic layer is smaller than 1.

14. The magnetoresistance effect element according to claim 12, further comprising: a first non-magnetic insertion layer made of a first metal and being adjacent between the first magnetic layer and the fourth magnetic layer; and a second non-magnetic insertion layer made of a second metal and being adjacent between the third magnetic layer and the fifth magnetic layer.

15. The magnetoresistance effect element according to claim 14, wherein an insertion layer film thickness of each of the first non-magnetic insertion layer and the second non-magnetic insertion layer ranges from 0.1 to 0.5 nm.

16. The magnetoresistance effect element according to claim 14, wherein the first non-magnetic insertion layer is formed by a sputtering method using a first sputtering gas, and a first $M_T/M_G$ ratio being a ratio of a mass number $M_T$ of the first metal of the first non-magnetic insertion layer to a mass number $M_G$ of the first sputtering gas is 2.2 or smaller, and
the second non-magnetic insertion layer is formed by a sputtering method using a second sputtering gas, and a second $M_T/M_G$ ratio being a ratio of a mass number $M_T$ of the second metal of the second non-magnetic insertion layer to a mass number $M_G$ of the second sputtering gas is larger than 2.2.

17. The magnetoresistance effect element according to claim 14, wherein the first non-magnetic insertion layer is made of Mo, Ta, W, or Nb formed by a sputtering method using Xe or Kr, and
the second non-magnetic insertion layer is made of Mo, Ta, W, or Nb formed by a sputtering method using Ar.

18. A magnetic memory comprising, as a magnetic memory cell, the magnetoresistance effect element according to claim 7.

19. A method for manufacturing a magnetoresistance effect element by stacking, in the following order: a first non-magnetic layer;
a first magnetic layer which is provided adjacent to the first non-magnetic layer and of which a magnetization direction is a direction perpendicular to a film surface, the first magnetic layer including at least Fe, an Fe composition in the first magnetic layer being 50 at % or higher with respect to a sum total of atomic fractions of magnetic elements in the first magnetic layer;
a first non-magnetic insertion layer which is provided adjacent to the first magnetic layer on an opposite side to the first non-magnetic layer, the first non-magnetic insertion layer being made of a first metal;
a second magnetic layer which is provided adjacent to the first non-magnetic insertion layer on an opposite side to the first magnetic layer and of which a magnetization direction is a direction perpendicular to the film surface, the second magnetic layer including at least one 3d ferromagnetic transition metal element consisting of one or more among the group of Co, Fe, Ni, and Mn, an Fe composition in the second magnetic layer being 50 at % or lower with respect to a sum total of atomic fractions of magnetic elements in the second magnetic layer;
a second non-magnetic insertion layer which is provided adjacent to the second magnetic layer on an opposite side to the first non-magnetic insertion layer, the second non-magnetic insertion layer being made of a second metal;
a third magnetic layer which is provided adjacent to the second non-magnetic insertion layer on an opposite side to the second magnetic layer and of which a magnetization direction is a direction perpendicular to the film surface, the third magnetic layer including at least Fe, an Fe composition in the third magnetic layer being 50 at % or higher with respect to a sum total of atomic fractions of magnetic elements in the third magnetic layer; and
a second non-magnetic layer which is provided adjacent to the third magnetic layer on an opposite side to the second non-magnetic insertion layer, wherein
the first non-magnetic insertion layer is formed using a first sputtering gas,
the second non-magnetic insertion layer is formed using a second sputtering gas, and
a first $M_T/M_G$ ratio being a ratio of a mass number $M_T$ of the first metal of the first non-magnetic insertion layer to a mass number $M_G$ of the first sputtering gas is smaller than a second $M_T/M_G$ ratio being a ratio of a mass number $M_T$ of the second metal of the second non-magnetic insertion layer to a mass number $M_G$ of the second sputtering gas.

20. The method for manufacturing a magnetoresistance effect element according to claim 19, wherein the first $M_T/M_G$ ratio is 2.2 or smaller, and the second $M_T/M_G$ ratio is larger than 2.2.

21. The method for manufacturing a magnetoresistance effect element according to claim 19, wherein the first non-magnetic insertion layer made of Mo, Ta, W, or Nb is formed by a sputtering method using Xe or Kr, and
the second non-magnetic insertion layer made of Mo, Ta, W, or Nb is formed by a sputtering method using Ar.

22. The method for manufacturing a magnetoresistance effect element according to claim 19, wherein the second magnetic layer comprising: a fourth magnetic layer which is provided adjacent to the first non-magnetic insertion layer on an opposite side to the first magnetic layer and of which a magnetization direction is a direction perpendicular to the film surface,
a non-magnetic coupling layer which is provided adjacent to the fourth magnetic layer on an opposite side to the first non-magnetic insertion layer; and
a fifth magnetic layer which is provided adjacent to the non-magnetic coupling layer on an opposite side to the fourth magnetic layer and, at the same time, provided adjacent to the second non-magnetic insertion layer on an opposite side to the third magnetic layer and of which a magnetization direction is a direction perpendicular to the film surface,
is manufactured by stacking these layers in this order,
the fourth and fifth magnetic layers each include at least one 3d ferromagnetic transition metal element consisting of one or more among the group of Co, Fe, Ni, and Mn, an Fe composition in the fourth magnetic layer being 50 at % or lower with respect to a sum total of atomic fractions of magnetic elements in the fourth magnetic layer, an Fe composition in the fifth magnetic layer being 50 at % or lower with respect to a sum total of atomic fractions of magnetic elements in the fifth magnetic layer, and
the non-magnetic coupling layer includes at least one non-magnetic element consisting of one or more among the group of V, Ti, Cr, Zr, Nb, Mo, Hf, Ta, W, Si, Al, B, Pd, and Pt.

23. The method for manufacturing a magnetoresistance effect element according to claim 22, wherein the first non-magnetic insertion layer made of Mo, Ta, W, or Nb is formed by a sputtering method using Xe or Kr, and
the second non-magnetic insertion layer made of Mo, Ta, W, or Nb is formed by a sputtering method using Ar.

* * * * *